United States Patent
Yoshinaga et al.

(10) Patent No.: US 9,954,169 B2
(45) Date of Patent: Apr. 24, 2018

(54) ORGANIC EL DISPLAY AND METHOD OF MANUFACTURING THE SAME

(71) Applicant: JOLED INC., Tokyo (JP)

(72) Inventors: Tadahiko Yoshinaga, Kanagawa (JP); Tomoyuki Higo, Tokyo (JP)

(73) Assignee: JOLED INC., Tokyo (JP)

( * ) Notice: Subject to any disclaimer, the term of this patent is extended or adjusted under 35 U.S.C. 154(b) by 996 days.

(21) Appl. No.: 13/777,736

(22) Filed: Feb. 26, 2013

(65) Prior Publication Data

US 2013/0183781 A1 Jul. 18, 2013

Related U.S. Application Data

(62) Division of application No. 13/111,226, filed on May 19, 2011, now Pat. No. 9,105,847.

(30) Foreign Application Priority Data

Jun. 24, 2010 (JP) .................. 2010-143525

(51) Int. Cl.
- H01L 51/00 (2006.01)
- C09K 11/06 (2006.01)

(Continued)

(52) U.S. Cl.
CPC ......... *H01L 51/0004* (2013.01); *C09K 11/06* (2013.01); *H01L 27/3211* (2013.01);
(Continued)

(58) Field of Classification Search
None
See application file for complete search history.

(56) References Cited

U.S. PATENT DOCUMENTS

| 8,203,158 B2 * | 6/2012 | Yoshida | H01L 27/3211 257/89 |
| 2002/0030443 A1 * | 3/2002 | Konuma | H01L 27/3244 313/504 |

(Continued)

FOREIGN PATENT DOCUMENTS

| JP | 2006-140434 | | 6/2006 |
| JP | 2006344869 A | * | 12/2006 |
| JP | 2009130142 A | * | 6/2009 |

OTHER PUBLICATIONS

Machine Translation of JP-2006344869, Published on Dec. 21, 2006; Retrieved Online on Mar. 24, 2017, p. 1-57.*
Translation of JP-2009130142-A (Year: 2009).*

*Primary Examiner* — Francisco W Tschen
(74) *Attorney, Agent, or Firm* — Dentons US LLP

(57) ABSTRACT

An organic EL display including lower electrodes arranged on a substrate to correspond to first organic EL elements of blue and second organic EL elements of any other color, respectively; hole injection/transport layers arranged on the lower electrodes; second organic light-emitting layers of the other color arranged on the hole injection/transport layers for the second organic EL elements; a first organic light-emitting layer of blue arranged on whole surfaces of the second organic light-emitting layers and the hole injection/transport layers for the first organic EL elements; an electron injection/transport layer arranged on a whole surface of the first light-emitting layer, the electron injection/transport layer made of a nitrogen-containing heterocyclic compound with an electron mobility of $1.0 \times 10^{-6}$ cm$^2$/Vs to $1.0 \times 10^{-1}$ cm$^2$/Vs both inclusive and having one or both of electron injection properties and electron transport properties; and an upper electrode arranged on the electron injection/transport layer.

13 Claims, 13 Drawing Sheets

(51) Int. Cl.
*H01L 27/32* (2006.01)
*H01L 51/50* (2006.01)
*H05B 33/10* (2006.01)

(52) U.S. Cl.
CPC ........ *H01L 51/0059* (2013.01); *H01L 51/504* (2013.01); *H01L 51/5028* (2013.01); *H05B 33/10* (2013.01); *C09K 2211/1007* (2013.01); *C09K 2211/1011* (2013.01); *C09K 2211/1014* (2013.01); *C09K 2211/1029* (2013.01); *C09K 2211/1033* (2013.01); *C09K 2211/1037* (2013.01); *C09K 2211/1044* (2013.01); *C09K 2211/1092* (2013.01); *H01L 2251/552* (2013.01)

(56) References Cited

U.S. PATENT DOCUMENTS

| | | | |
|---|---|---|---|
| 2003/0044639 A1* | 3/2003 | Fukuda | H01L 27/3211 428/690 |
| 2004/0021414 A1* | 2/2004 | Hanawa | H01L 51/5206 313/506 |
| 2004/0113960 A1* | 6/2004 | Usui | B41J 2/0456 347/10 |
| 2006/0105201 A1 | 5/2006 | Lee et al. | |
| 2006/0147747 A1* | 7/2006 | Yamamoto | C07D 235/18 428/690 |
| 2008/0048560 A1* | 2/2008 | Sung | H01L 27/3213 313/504 |

* cited by examiner

ORGANIC EL DISPLAY AND METHOD OF MANUFACTURING THE SAME

RELATED APPLICATION DATA

This application is a division of U.S. patent application Ser. No. 13/111,226, filed May 19, 2011, the entirety of which is incorporated herein by reference to the extent permitted by law. The present application claims the benefit of priority to Japanese Patent Application No. JP 2010-143525 filed in the Japan Patent Office on Jun. 24, 2010, the entirety of which is incorporated by reference herein to the extent permitted by law.

BACKGROUND

The present disclosure relates to an organic EL display emitting light with use of electroluminescence (EL) effect, and a method of manufacturing the same.

As the development of information and communication industry is accelerated, display elements with higher performance are demanded. An organic EL element attracting attention as a next-generation display element has advantages of not only a wide viewing angle and excellent contract but also fast response time.

Materials of a light-emitting layer and the like forming the organic EL element are broadly divided into low-molecular materials and high molecular materials. It is generally known that the low-molecular materials exhibit higher light emission efficiency and a longer lifetime, and in particular, the low-molecular materials have high performance of emitting blue light.

Moreover, as a method of forming an organic film of the organic EL element, a film made of a low-molecular material is formed by a dry method (an evaporation method) such as a vacuum deposition method, and a film made of a high-molecular material is formed by a wet method (a coating method) such as a spin coating method, an ink jetprinting method or a nozzle coating method.

The vacuum deposition method has an advantage that it is not necessary to dissolve a forming material of an organic thin film in a solvent, and it is not necessary to remove the solvent after film formation accordingly. However, in the vacuum deposition method, separate coating with use of a metal mask is difficult, and in particular, facility and manufacturing cost for forming large panels is high; therefore, the vapor deposition method has disadvantages that it is difficult to apply the vacuum deposition method to a large-screen substrate and mass production is difficult. Therefore, the ink-jet printing method or the nozzle coating method which relatively easily achieves an increase in area of a display screen attracts attention.

However, specifically blue light-emitting materials in high-molecular materials used in the ink-jet printing method or the nozzle coating method are not practical because the blue light-emitting materials have low light-emission luminance and low lifetime characteristics, and it is considered difficult to perform patterning of a blue light-emitting layer by the wet method.

Therefore, Japanese Unexamined Patent Application Publication No. 2006-140434 discloses a display formed by forming, as common layers, a blue light-emitting layer and subsequent layers, which have insufficient characteristics when being formed by the wet method, above a red light-emitting layer and a green light-emitting layer formed by the wet method including ink-jet printing. When the display has such a configuration, very fine pattering on the blue light-emitting layer is not necessary; therefore, there is a high possibility of achieving an increase in size of the display.

SUMMARY

However, an organic EL display described in Japanese Unexamined Patent Application Publication No. 2006-140434 has an issue that color purities of a red organic EL element and a green organic EL element decline under low-current load. An emission spectrum in an organic EL element has current density dependence, and carrier balance in a light-emitting layer is changed depending on current density. In the case where the current density is low, that is, loading electric field intensity is small, by a change in carrier balance, a light-emission region is shifted to a blue light-emitting layer formed on a red light-emitting layer and a green light-emitting layer. Therefore, light emitted from the blue light-emitting layer is added to light emitted from the red and green light-emitting layers to cause a change in chromaticity in the red organic EL element and the green organic EL element. Therefore, it is desired to solve an issue of a change in chromaticity of the red organic EL element and the green organic EL element due to current density.

It is desirable to provide an organic EL display capable of reducing a change in chromaticity of a red organic EL element and a green organic EL element due to current density, and a method of manufacturing the same.

According to an embodiment of the disclosure, there is provided an organic EL display including the following components (A) to (F):

(A) lower electrodes arranged on a substrate to correspond to first organic EL elements of blue and second organic EL elements of any other color, respectively;

(B) hole injection/transport layers arranged on the lower electrodes to correspond to the first organic EL elements and the second organic EL elements, respectively, the hole injection/transport layers having one or both of hole injection properties and hole transport properties;

(C) second organic light-emitting layers of the other color arranged on the hole injection/transport layers for the second organic EL elements;

(D) a first organic light-emitting layer of blue arranged on whole surfaces of the second organic light-emitting layers and the hole injection/transport layers for the first organic EL elements;

(E) an electron injection/transport layer arranged on a whole surface of the first light-emitting layer, the electron injection/transport layer made of a nitrogen-containing heterocyclic compound with an electron mobility of $1.0 \times 10^{-6}$ cm$^2$/Vs to $1.0 \times 10^{-1}$ cm$^2$/Vs both inclusive and having one or both of electron injection properties and electron transport properties; and (F) an upper electrode arranged on the electron injection/transport layer.

According to an embodiment of the disclosure, there is provided a method of manufacturing an organic EL display including the following (A) to (F):

(A) forming lower electrodes on a substrate to correspond to first organic EL elements of blue and second organic EL elements of any other color, respectively;

(B) forming hole injection/transport layers having one or both of hole injection properties and hole transport properties on the lower electrodes by a coating method to correspond to the first organic EL elements and the second organic EL elements, respectively;

(C) forming second light-emitting layers of the other color on the hole injection/transport layers for the second organic EL elements by a coating method;

(D) forming a first organic light-emitting layer of blue made of a low-molecular material on whole surfaces of the second organic light-emitting layers and the hole injection/transport layers for the first organic EL elements by an evaporation method;

(E) forming an electron injection/transport layer made of a nitrogen-containing heterocyclic compound with an electron mobility of $1.0 \times 10^{-6}$ cm$^2$/Vs to $1.0 \times 10^{-1}$ cm$^2$/Vs both inclusive on a whole surface of the first organic light-emitting layer, the electron injection/transport layer having one or both of electron injection properties and electron transport properties; and (F) forming an upper electrode on a whole surface of the electron injection/transport layer.

In the organic EL display and the method of manufacturing an organic EL display according to the embodiment of the disclosure, the nitrogen-containing heterocyclic compound with an electron mobility of $1.0 \times 10^{-6}$ cm$^2$/Vs to $1.0 \times 10^{-1}$ cm$^2$/vs both inclusive is used for the electron injection/transport layer; therefore, electron injection efficiency into the second organic light-emitting layers of any other color is improved.

In the organic EL display and the method of manufacturing an organic EL display according to the embodiment of the disclosure, the nitrogen-containing heterocyclic compound with an electron mobility of $1.0 \times 10^{-6}$ cm$^2$/Vs to $1.0 \times 10^{-1}$ cm$^2$/vs both inclusive is used for the electron injection/transport layer; therefore, electron injection efficiency into the second organic light-emitting layers of any other color is improved. Accordingly, a light emission region is allowed to be prevented from being shifted to the first organic light-emitting layer of blue due to a change in carrier balance under low-current load, and light emission from the first light-emitting layer of blue in the second organic EL elements is preventable. In other words, a change in chromaticity of the second organic EL elements of any other color due to current density is reduced to improve color purity.

Other and further objects, features and advantages of the invention will appear more fully from the following description.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 15A and 15B are a front view and a side view in a state in which Application Example 5 is opened, respectively, and FIGS. 15C, 15D, 15E, 15F and 15G are a front view, a left side view, a right side view, a top view and a bottom view in a state in which Application Example 5 is closed, respectively.

DETAILED DESCRIPTION OF THE PREFERRED EMBODIMENTS

Preferred embodiments of the disclosure will be described in detail below referring to the accompanying drawings in the following order.
1. First Embodiment (Organic EL display in which a blue light-emitting layer is formed on red and green light-emitting layers and a hole transport layer for blue)
2. Second Embodiment (Organic EL display in which a common hole transport layer is formed between red and green light-emitting layers and a hole transport layer for blue and a blue light-emitting layer)

First Embodiment

Figure 1:
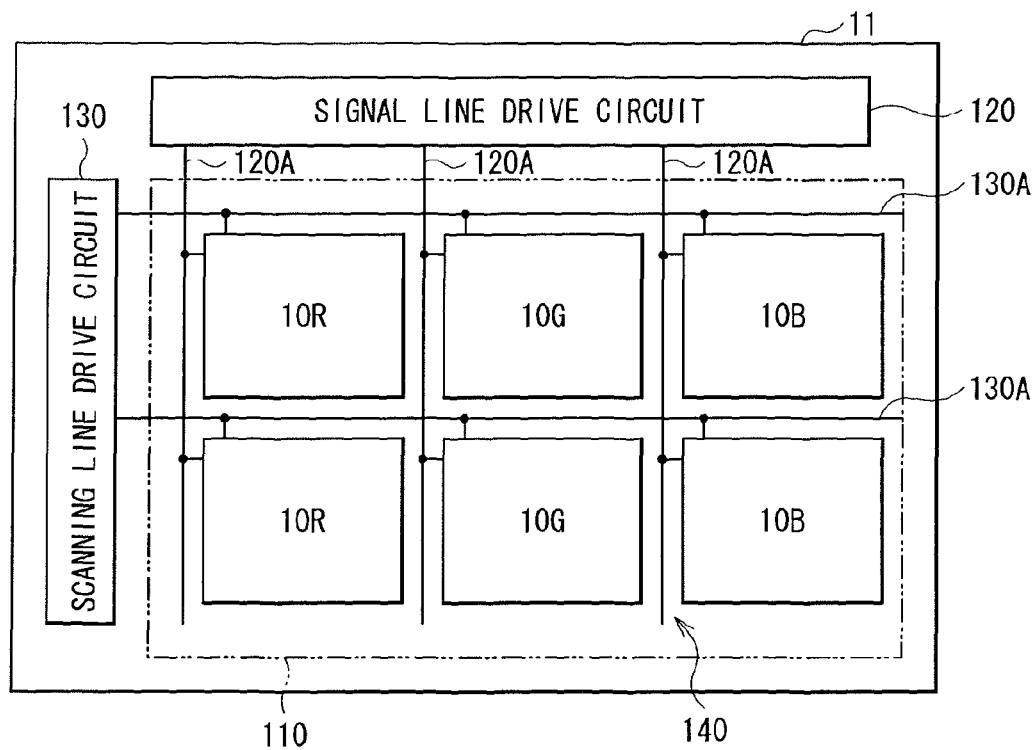
FIG. 1 is a diagram illustrating a configuration of an organic EL display according to an embodiment of the disclosure.

FIG. 1 illustrates a configuration of an organic EL display 1 according to an embodiment of the disclosure. The organic EL display 1 is used as an organic EL television or the like, and in the organic EL display, for example, a plurality of red organic EL elements 10R, a plurality of green organic EL elements 10G and a plurality of blue organic EL elements 10B which will be described later are arranged in a matrix form as a display region 110 on a substrate 11. A signal line drive circuit 120 and a scanning line drive circuit 130 as drivers for picture display are arranged around the display region 110.

Figure 2:
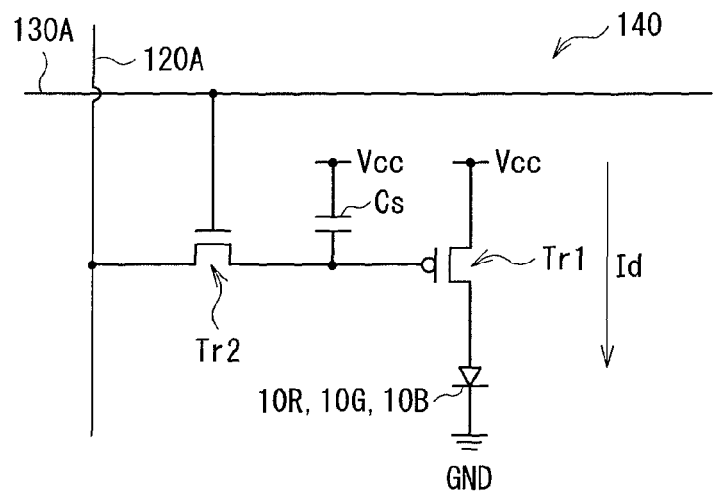
FIG. 2 is a diagram illustrating an example of a pixel drive circuit illustrated in FIG. 1.

A pixel drive circuit 140 is arranged in the display region 110. FIG. 2 illustrates an example of the pixel drive circuit 140. The pixel drive circuit 140 is an active drive circuit formed below a lower electrode 14 which will be described later. In other words, the pixel drive circuit 140 includes a driving transistor Tr1 and a writing transistor Tr2, a capacitor (retention capacitor) Cs between the driving transistor Tr1 and the writing transistor Tr2, and the organic light-emitting element 10R (or 10G or 10B) connected to the driving transistor Tr1 in series between a first power source line (Vcc) and a second power source line (GND). The driving transistor Tr1 and the writing transistor Tr2 each are configured of a typical thin film transistor (TFT), and the TFT may have, for example, an inverted stagger configuration (a so-called bottom gate type) or a stagger configuration (a top gate type), and the configuration of the TFT is not specifically limited.

In the pixel drive circuit 140, a plurality of signal lines 120A are arranged in a column direction, and a plurality of scanning lines 130A are arranged in a row direction. An intersection between each signal line 120A and each scanning line 130A corresponds to one (a subpixel) of the organic light-emitting elements 10R, 10G and 10B. Each signal line 120A is connected to the signal line drive circuit 120, and an image signal is supplied from the signal line drive circuit 120 to a source electrode of the writing transistor Tr2 through the signal line 120A. Each scanning line 130A is connected to the scanning line drive circuit 130, and a scanning signal is sequentially supplied from the scanning line drive circuit 130 to a gate electrode of the writing transistor Tr2 through the scanning line 130A.

Moreover, in the display region 110, the red organic EL elements 10R (second organic EL elements) emitting red light, the green organic EL elements 10G (second organic EL elements) emitting green light and the blue organic EL elements 10B (first organic EL elements) emitting blue light are arranged in order in a matrix form as a whole. It is to be noted that a combination of the red organic EL element 10R, the green organic EL element 10G and the blue organic EL element 10B which are adjacent to one another configures one pixel.

Figure 3:
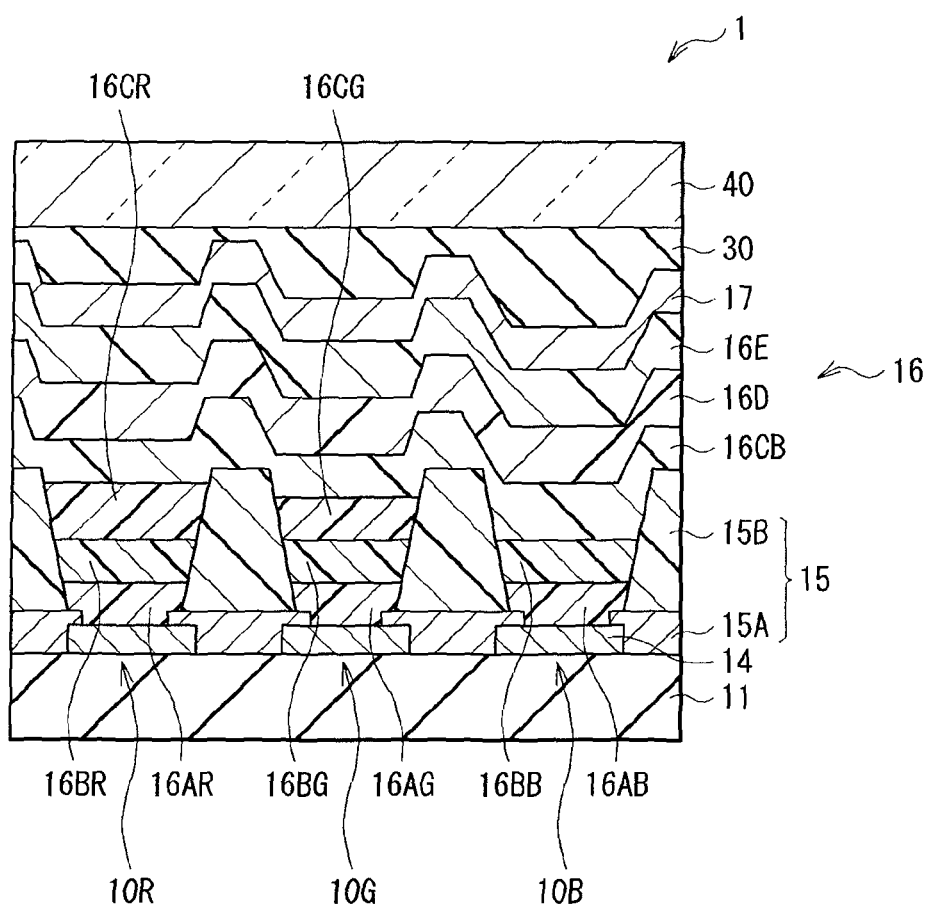
FIG. 3 is a sectional view illustrating a configuration of a display region illustrated in FIG. 1.

FIG. 3 illustrates a sectional configuration of the display region 110 illustrated in FIG. 1. The red organic EL elements 10R, the green organic EL elements 10G and the blue organic EL elements 10B each have a configuration in which the lower electrode 14 as an anode, a barrier rib 15, an organic layer 16 including a light-emitting layer 16C which will be described later, and an upper electrode 17 as a cathode are laminated in this order from the substrate 11 with the driving transistor Tr1 of the above-described pixel drive circuit 140 and a planarization insulating film (not illustrated) in between.

The red organic EL elements 10R, the green organic EL elements 10G and the blue organic EL elements 10B are covered with a protective layer 30, and a sealing substrate 40 made of glass or the like is bonded to a whole surface of the protective layer 30 with an adhesive layer (not illustrated) made of a thermosetting resin, an ultraviolet curable resin or the like in between to seal the red organic EL elements 10R, the green organic EL elements 10G and the blue organic EL elements 10B.

The substrate 11 is a supporting body where the red organic EL elements 10R, the green organic EL elements 10G and the blue organic EL elements 10B are formed in an array on a main surface thereof, and may be configured of a known substrate, and, for example, quartz, glass, metal foil, or a film or a sheet made of a resin is used. In particular, quartz or glass is preferable, and in the case where the substrate 11 is made of a resin, as the resin, a metacrylate resin typified by polymethyl methacrylate (PMMA), polyesters such as polyethylene terephthalate (PET), polyethylene naphthalate (PEN) and polybutylene naphthalate (PBN), a polycarbonate resin and the like are used, but to reduce water permeability and gas permeability, it is necessary for the substrate 11 to have a laminate configuration or to be subjected to surface treatment.

The lower electrodes 14 are arranged on the substrate 11 to correspond to the red organic EL elements 10R, the green organic EL elements 10G and the blue organic EL elements 10B, respectively. The lower electrodes 14 each have a thickness in a laminate direction (hereinafter simply referred to as thickness) of 10 nm to 1000 nm both inclusive, and is made of a simple substance or an alloy of a metal element such as chromium (Cr), gold (Au), platinum (Pt), nickel (Ni), copper (Cu), tungsten (W) or silver (Ag). Moreover, the lower electrodes 14 may have a laminate configuration including a metal film made of a simple substance or an alloy of any of these metal elements, and a transparent conductive film made of an oxide of indium and tin (ITO), InZnO (indium-zinc oxide) or an alloy of zinc oxide (ZnO) and aluminum (Al). It is to be noted that in the case where the lower electrodes 14 are used as anodes, the lower electrodes 14 are preferably made of a material with high hole injection properties. However, even a material such as an aluminum (Al) alloy in which a hole injection barrier due to the presence of an oxidized coating film on a surface thereof or a small work function causes an issue is allowed to be used as the lower electrodes 14 by arranging an appropriate hole injection layer 16A.

The barrier rib 15 is provided to secure insulation between the lower electrodes 14 and the upper electrode 17 and to form a light emission region in a desired shape. Moreover, the barrier rib 15 has a function as a barrier rib in the case where coating by an ink-jet printing method or a nozzle coating method is performed in a manufacturing step which will be described later. The barrier rib 15 includes, for example, an upper barrier rib 15B made of a photosensitive resin such as positive type photosensitive polybenzoxazole or a positive type photosensitive polyimide on a lower barrier rib 15A made of an inorganic insulating material such as $SiO_2$. In the barrier rib 15, an opening is arranged to correspond to each light emission region. It is to be noted that the organic layer 16 and the upper electrode 17 may be arranged not only in the opening but also on the barrier rib 15, but light is emitted only from the opening of the barrier rib 15.

The organic layer 16 of each red organic EL element 10R has, for example, a configuration in which a hole injection layer 16AR, a hole transport layer 16BR, a red light-emitting layer 16CR, a blue light-emitting layer 16CB, an electron transport layer 16D and an electron injection layer 16E are laminated in order from the lower electrode 14. The organic layer 16 of each green organic EL element 10G has, for example, a configuration in which a hole injection layer 16AG, a hole transport layer 16BG, a green light-emitting layer 16CG, the blue light-emitting layer 16CB, the electron transport layer 16D and the electron injection layer 16E are laminated in order from the lower electrode 14. The organic layer 16 of each blue organic EL element 10B has, for example, a configuration in which a hole injection layer 16AB, a hole transport layer 16BB, the blue light-emitting layer 16CB, the electron transport layer 16D and the electron injection layer 16E are laminated in order from the lower electrode 14. The blue light-emitting layer 16CB, the electron transport layer 16D and the electron injection layer 16E are arranged as common layers for the red organic EL elements 10R, the green organic EL elements 10G and the blue organic EL elements 10B.

The hole injection layers 16AR, 16AG and 16AB are buffer layers for enhancing hole injection efficiency into each light-emitting layer 16C (the red light-emitting layer 16CR, the green light-emitting layer 16CG and the blue light-emitting layer 16CB) and preventing leakage, and are arranged on the lower electrodes 14 of the red organic EL elements 10R, the green organic EL elements 10G and the blue organic EL elements 10B, respectively.

The thickness of each of the hole injection layers 16AR, 16AG and 16AB is preferably within a range of 5 nm to 100 nm both inclusive, and more preferably within a range of 8 nm to 50 nm both inclusive. The materials of the hole injection layers 16AR, 16AG and 16AB may be selected as appropriate depending on the material of an electrode or an adjacent layer, and polyaniline, polythiophene, polypyrrole, polyphenylene vinylene, polythienylene vinylene, polyquinoline, polyquinoxaline or a derivative thereof, a conductive high polymer such as a polymer including an aromatic amine structure in a main chain or a side chain, metal phthalocyanine (such as copper phthalocyanine), carbon or the like is used.

In the case where the material used for the hole injection layers 16AR, 16AG and 16AB is a high-molecular material, the weight-average molecular weight (Mw) of the high-molecular material may be within a range of 10000 to 300000 both inclusive, and in particular, the weight-average molecular weight of the high-molecular material is preferably within a range of approximately 5000 to 200000. Moreover, an oligomer with an Mw of approximately 2000 to 10000 may be used. However, in the case where the Mw is smaller than 5000, when the hole transport layer and subsequent layers are formed, the hole injection layer may be melted. Moreover, in the case where the Mw is larger than 300000, the material may be gelated to cause a difficulty in film formation.

Examples of a typical conductive high polymer used as the material of the hole injection layers 16AR, 16AG and 16AB include polyaniline, oligoaniline and polydioxythiophene such as poly(3,4-ethylenedioxythiophene) (PEDOT). In addition, a commercially available polymer called Nafion (trademark) manufactured from H.C. Starck GmbH, a commertially available polymer in a dissolved form called Liquion (trademark) as a trade name, ELsource (trademark) manufactured from Nissan Chemical Industries. Ltd., a conductive polymer called Verazol (trademark) manufactured from Soken Chemical & Engineering Co., Ltd. or the like is used.

The hole transport layers 16BR and 16BG of the red organic EL elements 10R and the green organic EL elements 10G are provided to enhance hole transport efficiency to the red light-emitting layers 16CR and the green light-emitting layers 16CG, respectively. The hole transport layers 16BR and 16BG are arranged on the hole injection layers 16AR and 16AG of the red organic EL elements 10R and the green organic EL elements 10G, respectively.

For example, the thicknesses of the hole transport layers 16BR and 16BG, depending on a whole element configuration, are preferably within a range of 10 nm to 200 nm both inclusive, and more preferably within a range of 15 nm to 150 nm both inclusive. As the high-molecular material forming the hole transport layers 16BR and 16BG, a light-emitting material which is soluble in an organic solvent, for example, polybinylcarbazole, polyfluorene, polyaniline, polysilane or a derivative thereof, a polysiloxane derivative having an aromatic amine in a side chain or a main chain, polythiophene and a derivative thereof, and polypyrrole are allowed to be used.

In the case where the material used for the hole transport layers 16BR and 16BG is a high-molecular material, the weight-average molecular weight (Mw) of the high-molecular material is preferably within a range of 50000 to 300000 both inclusive, and more preferably within a range of 100000 to 200000 both inclusive. In the case where the Mw is smaller than 50000, when the light-emitting layers 16CR and 16CG are formed, a low-molecular component in the high-molecular material drops out to cause dot defects in the hole injection layers 16AR and 16AG and the hole transport layers 16BR and 16BG, and accordingly, a decline in initial performance of organic EL elements or deterioration in the elements may occur. On the other hand, in the case where the Mw is larger than 300000, the material may be gelated to cause a difficulty in film formation. It is to be noted that the weight-average molecular weight (Mw) is a value obtained by determining a polystyrene-equivalent weight-average molecular weight by gel permeation chromatography (GPC) using tetrahydrofuran as a solvent.

The red light-emitting layers 16CR and the green light-emitting layers 16CG emit light by the recombination of electrons and holes in response to the application of an electric field. For example, the thicknesses of each red light-emitting layer 16CR and each green light-emitting layer 16CG, depending on a whole element configuration, are preferably within a range of 10 nm to 200 nm both inclusive, and more preferably within a range of 15 nm to 150 nm both inclusive. The red light-emitting layers 16CR and the green light-emitting layers 16CG are made of a mixture material prepared by adding a low-molecular material to a high-molecular (light-emitting) material. The low-molecular material in this case is preferably a monomer or an oligomer in which 2 to 10 monomers are bonded, and the weight-average molecular weight of the low-molecular material is preferably 50000 or less. It is to be noted that a low-molecular material with a weight-average molecular weight exceeding the above-described range is not necessarily excluded.

As will be described in detail later, the red light-emitting layers 16CR and the green light-emitting layers 16CG are formed by a coating method such as ink jet printing. At this time, one or more kinds of high-molecular materials and one or more kinds of low-molecular materials are dissolved in an organic solvent such as toluene, xylene, anisole, cyclohexanone, mesitylene(1,3,5-trimethylbenzene), pseudocumene(1,2,4-trimethylbenzene), dihydrobenzofuran, 1,2,3,4-tetramethylbenzene, tetralin, cyclohexylbenzene, 1-methylnaphthalene, p-anisyl alcohol, dimethylnaphthalene, 3-methylbiphenyl, 4-methylbiphenyl, 3-isopropylbiphenyl, monoisopropylnaphthalene to form a mixture solution, and the red light-emitting layers 16CR and the green light-emitting layers 16CG are formed with use of the mixture solution.

Examples of the high-molecular material forming the red light-emitting layers 16CR and the green light-emitting layers 16CG include a polyfluorene-based high polymer derivative, a (poly)paraphenylene vinylene derivative, a polyphenylene derivative, a polyvinylcarbazole derivative, a polythiophene derivative, a perylene-based pigment, a coumarin-based pigment, a rhodamine-based pigment, or the above-described high-molecular material doped with an organic EL material. As a doping material, for example, rubrene, perylene, 9,10-diphenylanthracene, tetraphenyl butadiene, nile red or Coumarin6 is allowed to be used.

Moreover, a low-molecular material is preferably added to the high-molecular material forming the red light-emitting layers 16CR and the green light-emitting layers 16CG. Therefore, hole and electron injection efficiency from the blue light-emitting layer 16CB as a common layer to the red light-emitting layers 16CR and the green light-emitting layers 16CG is improved. A principle thereof will be described below.

In an organic EL element in related art, the blue light-emitting layer 16CB as a common layer made of a low-molecular material is arranged over the red light-emitting layers 16CR and the green light-emitting layers 16CG made of only a high-molecular material, and a difference between the energy levels of the red light-emitting layers 16CR and the green light-emitting layers 16CG and the energy level of the blue light-emitting layer 16CB is large. Therefore, hole or electron injection efficiency between the blue light-emitting layer 16CB and each of the red light-emitting layers 16CR and the green light-emitting layers 16CG is very low, and as described above, there is an issue that intrinsic properties of light-emitting layers made of a high-molecular material are not sufficiently obtained. In the embodiment, to improve hole or electron injection properties, a low-molecular material (a monomer or an oligomer) for reducing a difference between the energy levels of the red light-emitting layers 16CR and the green light-emitting layers 16CG and the energy level of the blue light-emitting layer 16CB is added to the red light-emitting layers 16CR and the green light-emitting layers 16CG. Now, a relationship between the highest occupied molecular orbital (HOMO) levels and the lowest unoccupied molecular orbital (LUMO) levels of the red light-emitting layers 16CR and green light-emitting layers 16CG, the HOMO level and the LUMO level of the blue light-emitting layer 16CB, and the HOMO level and the LUMO level of the low-molecular material added to the red light-emitting layers 16CR and the green light-emitting layers 16CG will be considered below. As a specific added low-molecular material, a compound having a value which is lower than the LUMO levels of the red light-emitting layers 16CR and the green light-emitting layers 16CG and higher than the LUMO level of the blue light-emitting layer, and a value which is higher than the HOMO levels of the red light-emitting layers 16CR and the green light-emitting layers 16CG and lower than the HOMO level of the blue light-emitting layer is selected.

Moreover, the low-molecular material added to the red light-emitting layers 16CR and the green light-emitting layers 16CG indicates a low-molecular material with a substantially single molecular weight except for a compound configured of molecules of a polymer or a condensation product having a high molecular weight which is produced by repeating the same or similar reaction in chain by a low-molecular compound. Moreover, in the low-molecular material, a new chemical bond between molecules does not occur by heating, and the low-molecular material is present in a single molecular form. The weight-average molecular weight (Mw) of the low-molecular material is preferably 50000 or less, because compared to a material with a large molecular weight of, for example, larger than 50000, a material with a small molecular weight to some extent has various properties, and hole or electron mobility, a band gap, solubility to a solvent, or the like in the material is easily adjusted. Moreover, as the additive amount of the low-molecular material, a mixture ratio between the high-molecular material and the low-molecular material used in the red light-emitting layers 16CR or the green light-emitting layers 16CG is preferably within a range of 10:1 to 1:2 both inclusive in weight ratio. In the case where the mixture ratio between the high-molecular material and the low-molecular material is smaller than 10:1, an effect by addition of the low-molecular material is reduced. Moreover, in the case where the mixture ratio is larger than 1:2, it is difficult to obtain properties of the high-molecular material as the light-emitting material.

As described above, when the low-molecular material is added to the red light-emitting layers 16CR and the green light-emitting layers 16CG, carrier balance of holes and electrons is adjusted more easily. Therefore, declines in electron injection properties and hole transport properties to the red light-emitting layer 16CR and the green light-emitting layer 16CG which are caused by forming the common hole transport layer 16D, the blue light-emitting layer 16CB and the electron transport layer 16E which will be described later are reduced. In other words, reductions in light emission efficiency and lifetimes of the red organic EL elements 10R and the green organic EL elements 10G, an increase in drive voltage and a change in light emission chromaticity are reduced.

As such a low-molecular material, for example, benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene or a derivative thereof, or a heterocyclic conjugated monomer or oligomer such as a polysilane-based compound, a vinylcarbazole-based compound, a thiophene-based compound or an aniline-based compound is allowed to be used.

More specifically, α-naphthyl phenyl phenylenediamine, porphyrin, metal tetraphenyl porphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenylphenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylene vinylene), poly (thiophene vinylene), and poly(2,2'-thienylpyrrole) or the like is used, but the low-molecular material is not limited thereto.

More preferably, low-molecular materials represented by the following formulas (1) to (3) are used.

(1)

where A1 to A3 each are an aromatic hydrocarbon group, a heterocyclic group or a derivative thereof.

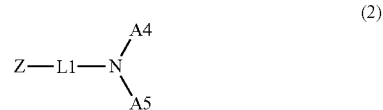
(2)

where Z is a nitrogen-containing hydrocarbon group or a derivative thereof, L1 is a group in which 1 to 4 divalent aromatic ring groups are bonded, more specifically a divalent group in which 1 to 4 aromatic rings are connected, or a derivative thereof, A4 and A5 each are an aromatic hydrocarbon group, an aromatic heterocyclic group or a derivative thereof, and A4 and A5 may be bonded to each other to form a cyclic structure.

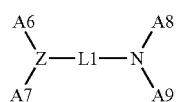
(3)

where L2 is a group in which 2 to 6 divalent aromatic ring groups are bonded, more specifically a divalent group in which 2 to 6 aromatic rings are connected, or a derivative thereof, A6 to A9 each are a group in which 1 to 10 aromatic hydrocarbon groups, 1 to 10 heterocyclic groups or 1 to 10 derivatives thereof are bonded.

Specific examples of a compound represented by the formula (1) include compounds represented by the following formulas (1-1) to (1-48).

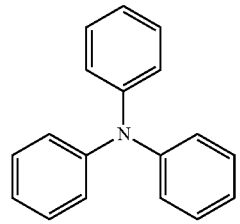
(1-1)

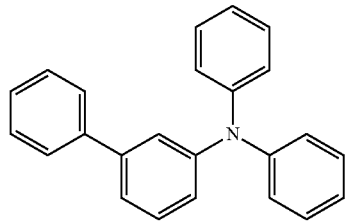
(1-2)

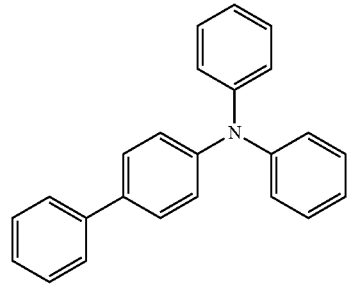
(1-3)

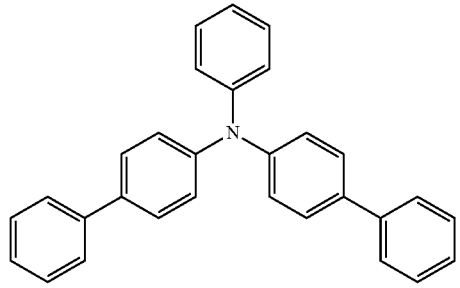
(1-4)

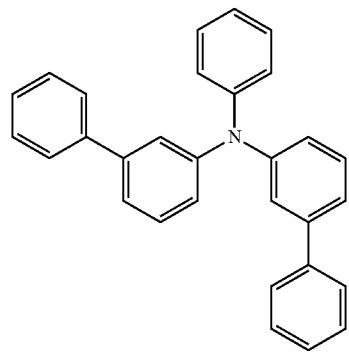
(1-5)

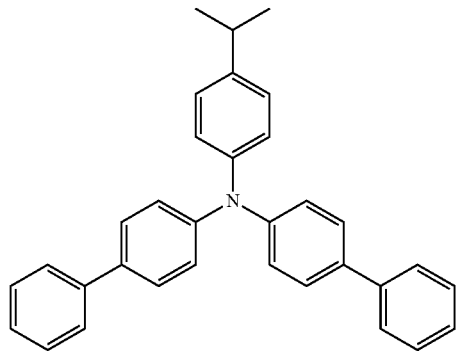
(1-6)

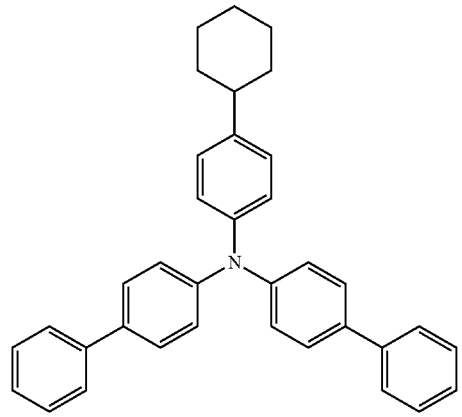
(1-7)

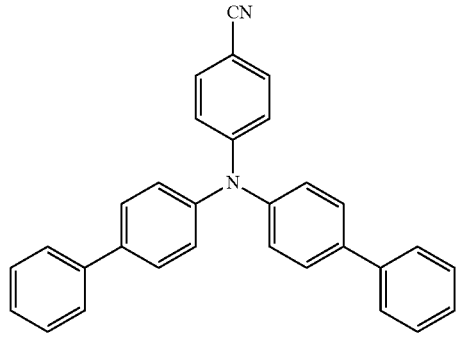
(1-8)

-continued
(1-9)
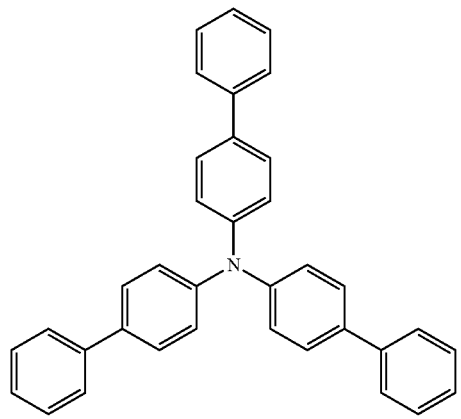
(1-10)
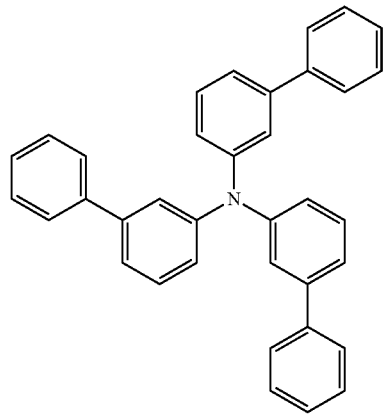
(1-11)
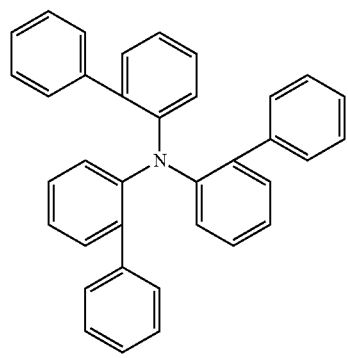
(1-12)
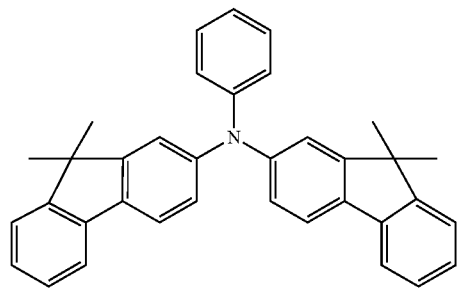
(1-13)
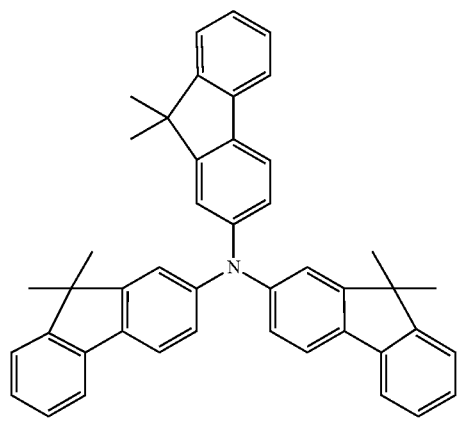
(1-14)
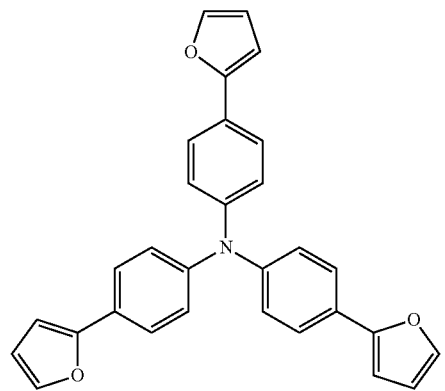

(1-15)
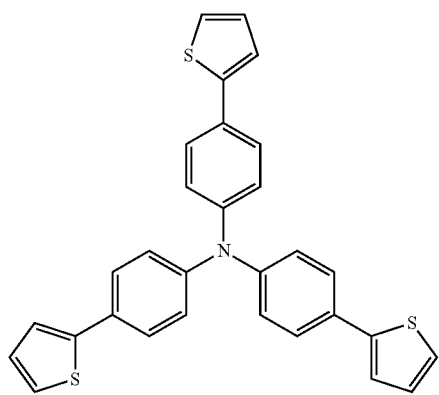
(1-16)
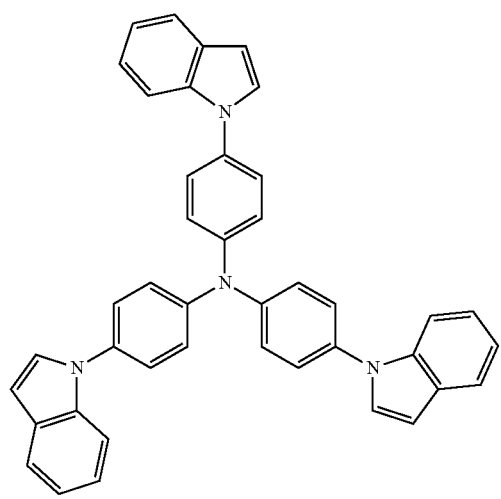
(1-17)
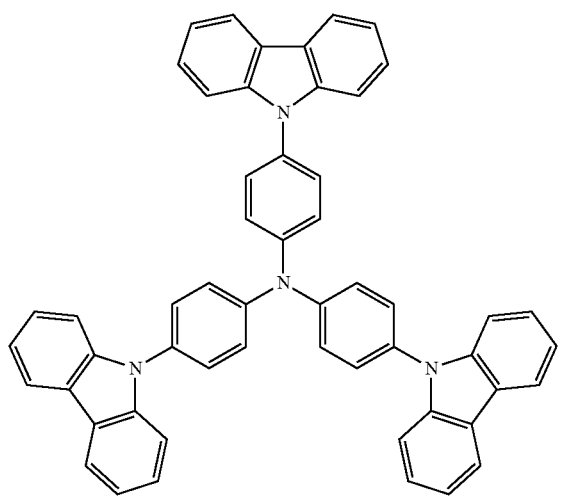
(1-18)
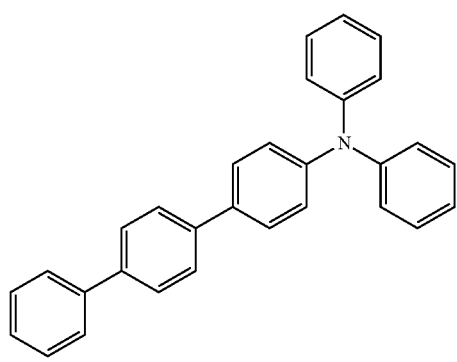
(1-19)
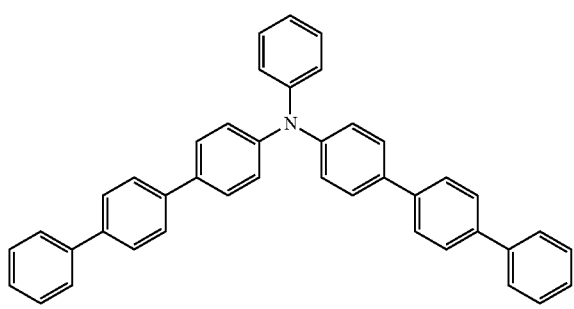
(1-20)
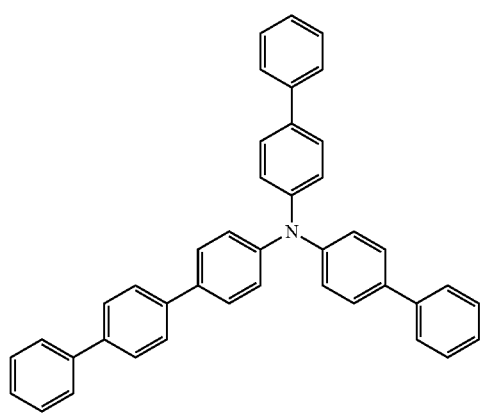

-continued
(1-21)
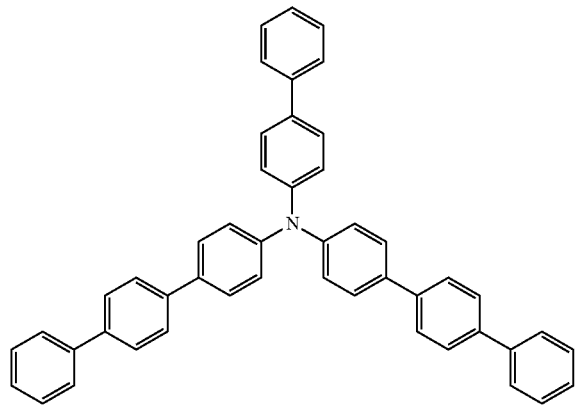
(1-22)
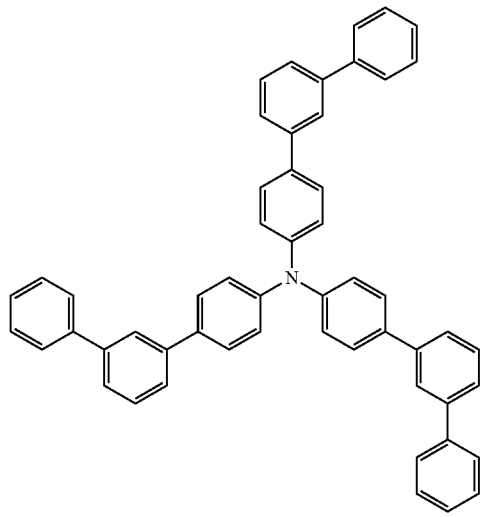
(1-23)
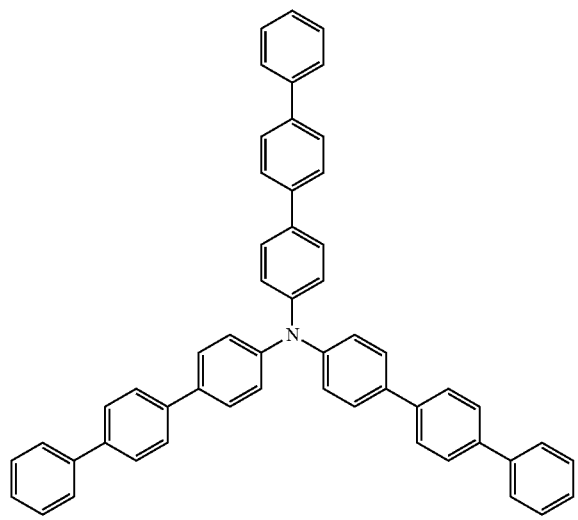
(1-24)
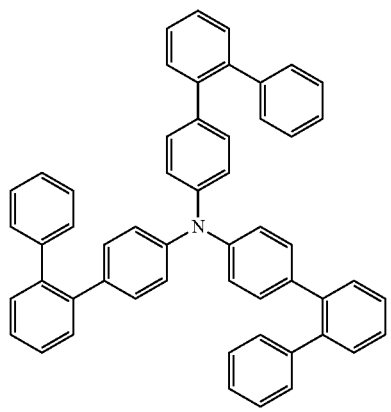
(1-25)
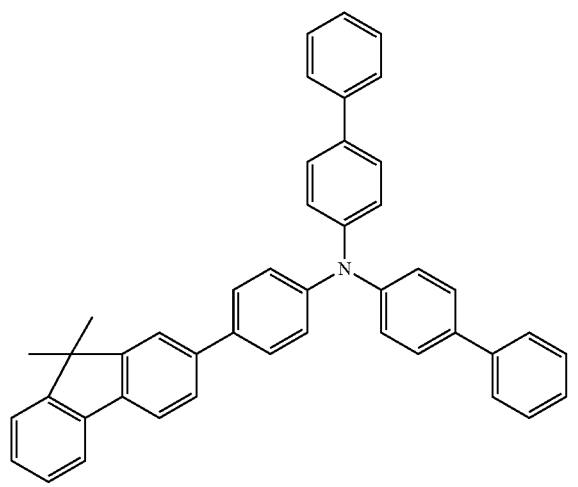
(1-26)
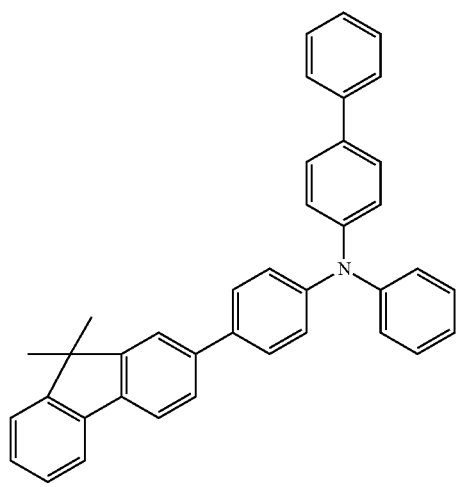

-continued
(1-27)
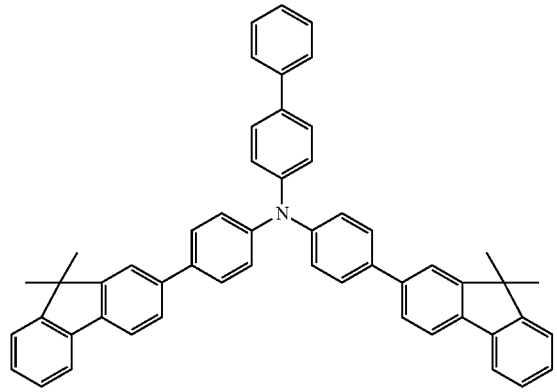
(1-28)
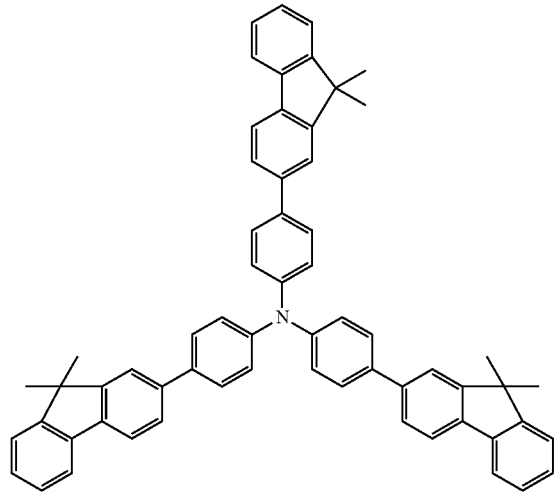
(1-29)
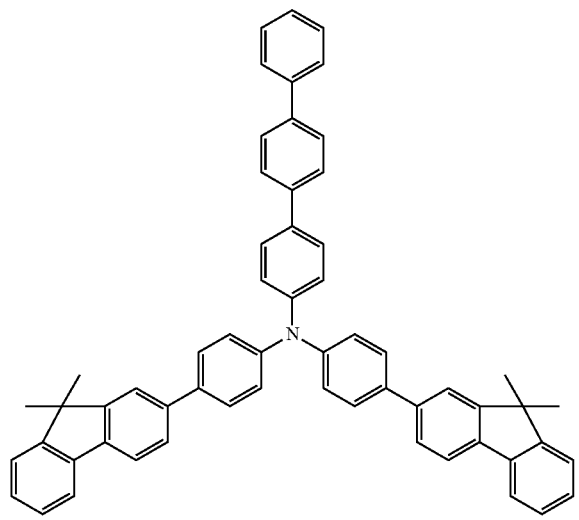
(1-30)
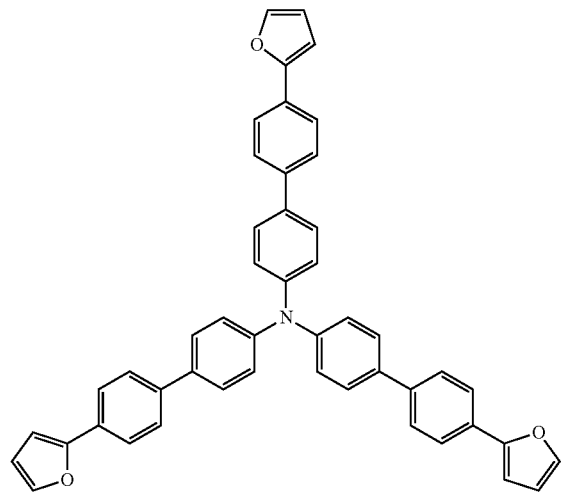
(1-31)
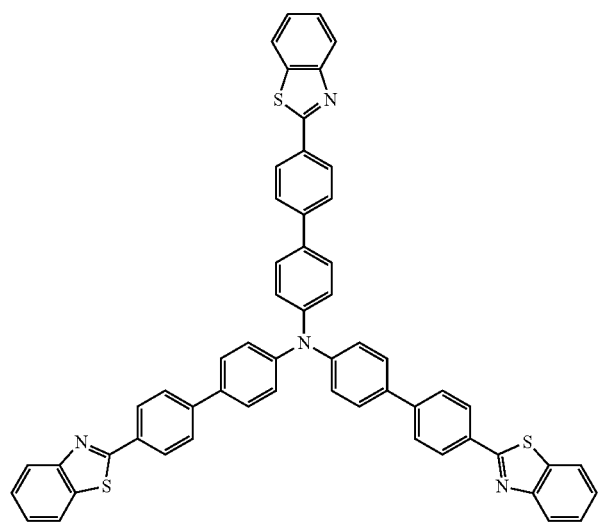
(1-32)
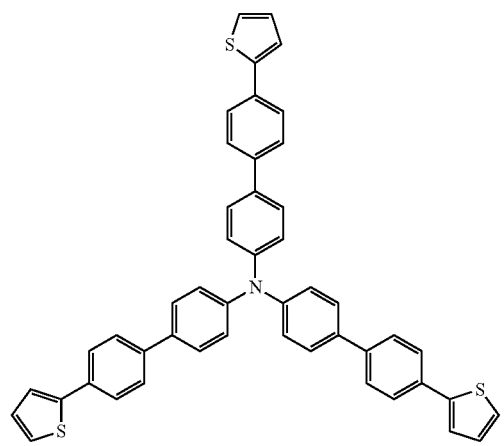

(1-33)
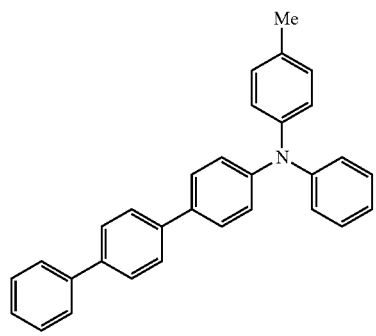
(1-34)
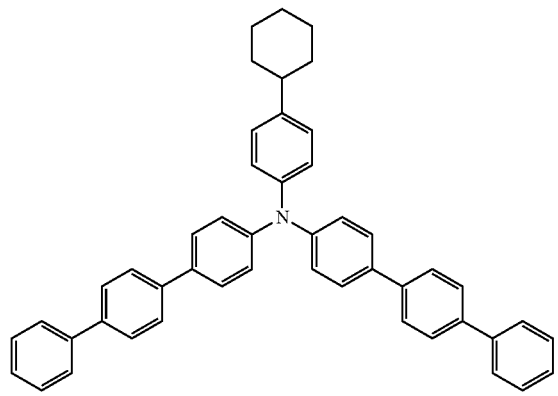
(1-35)
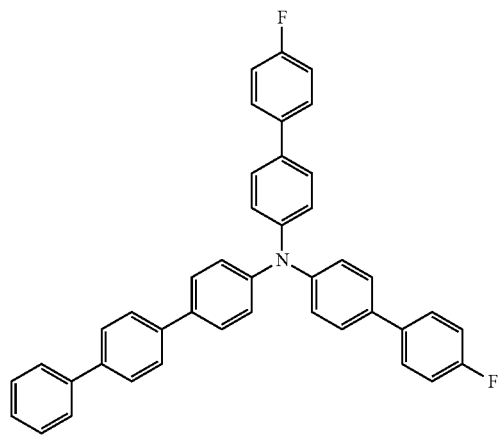
(1-36)
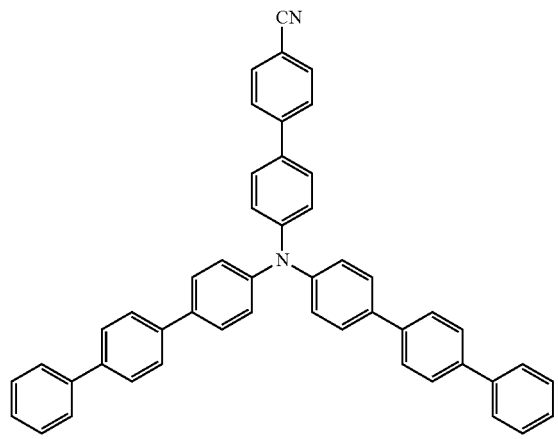
(1-37)
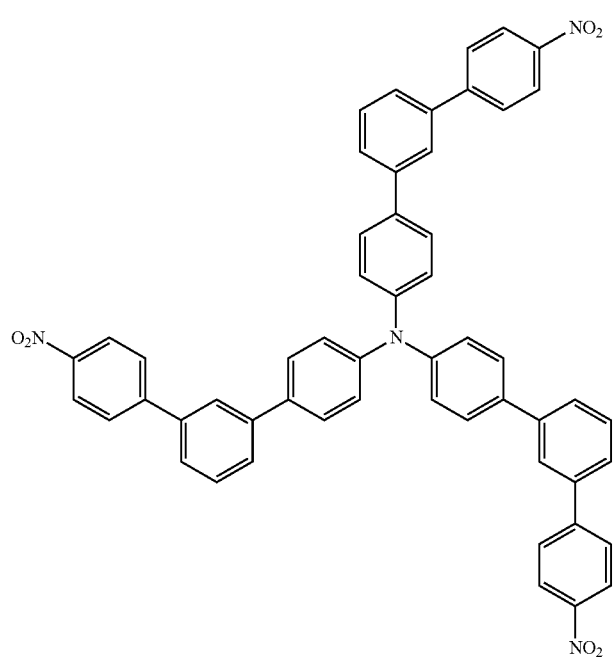

-continued
(1-38)
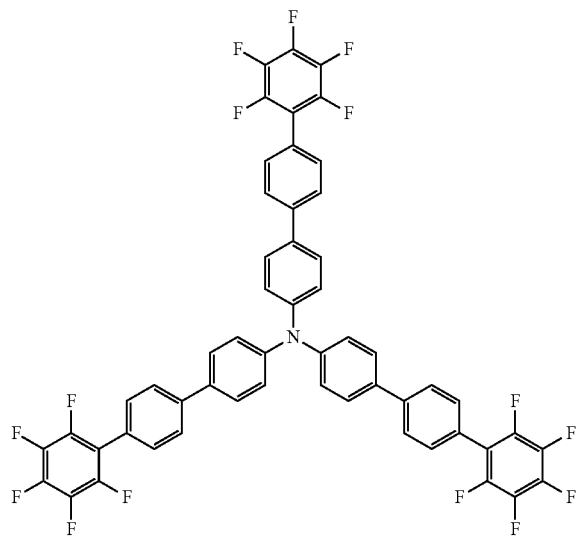
(1-39)
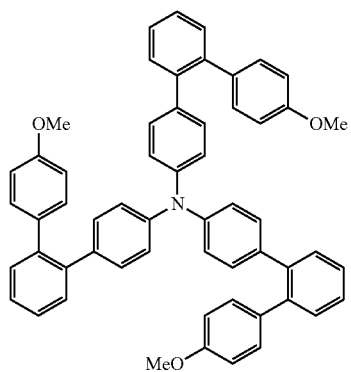
(1-40)
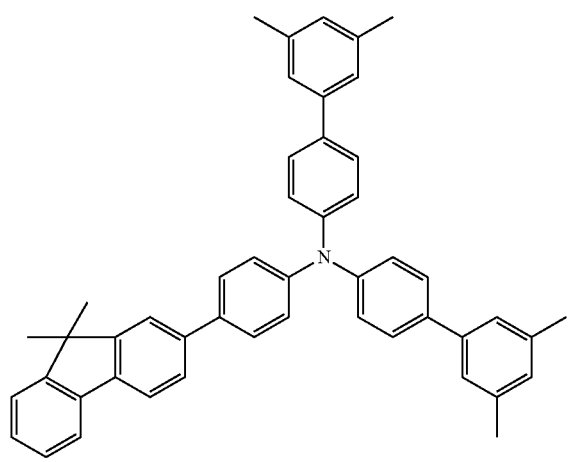
(1-41)
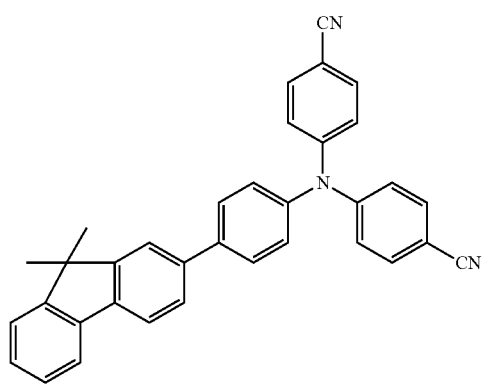
(1-42)
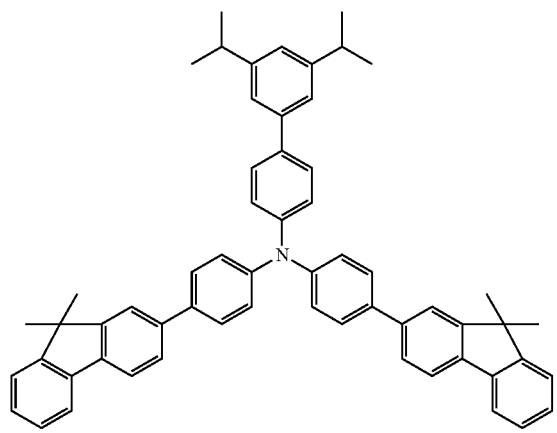
(1-43)
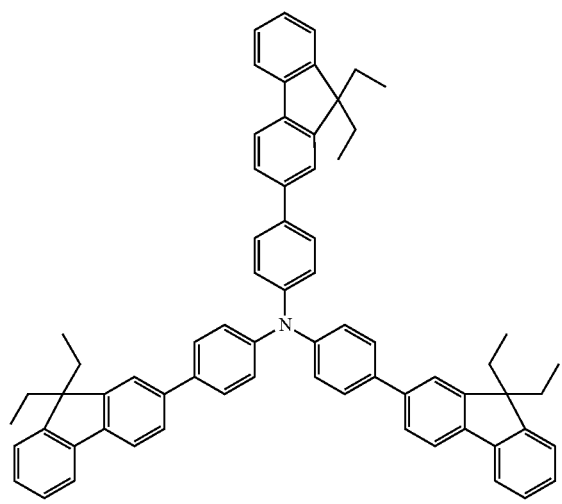

(1-44)
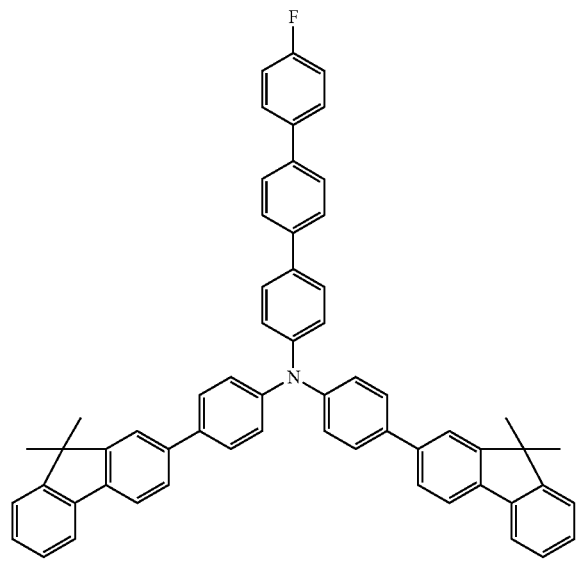
(1-45)
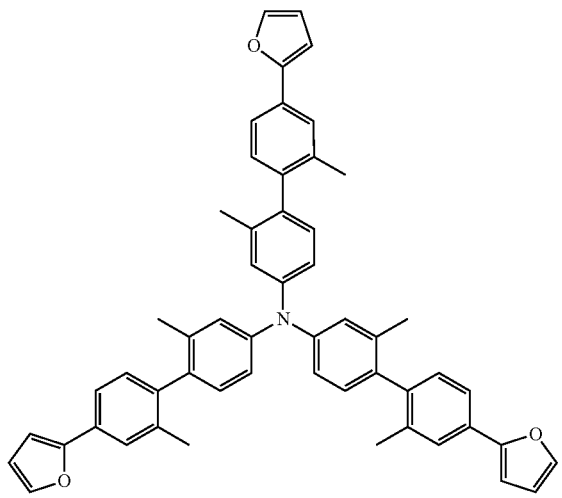
(1-46)
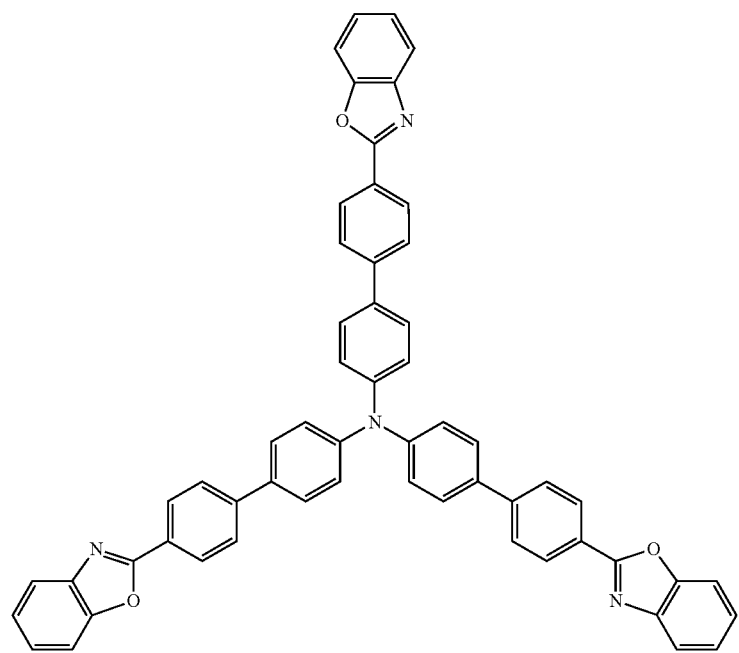

(1-47)

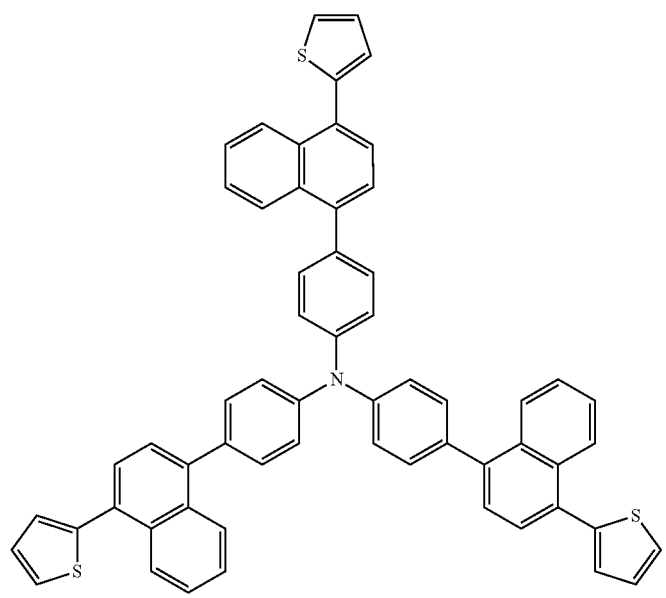

(1-48)

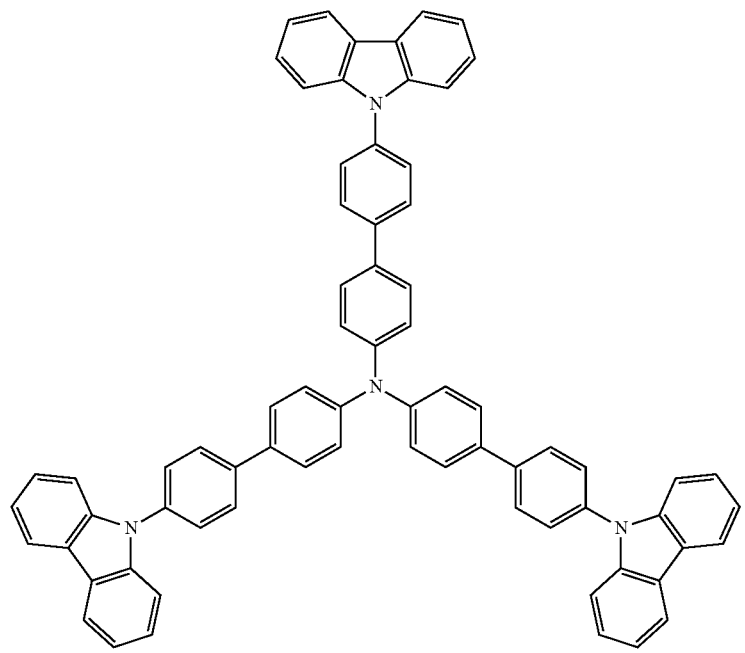

Specific examples of a compound represented by the formula (2) include compounds represented by the following formulas (2-1) to (2-69). It is to be noted that as a nitrogen-containing hydrocarbon group bonded to L1, for example, a compound including a carbazole group or an indole group is described herein, but the nitrogen-containing hydrocarbon group is not limited thereto. For example, an imidazole group may be used.

(2-1) 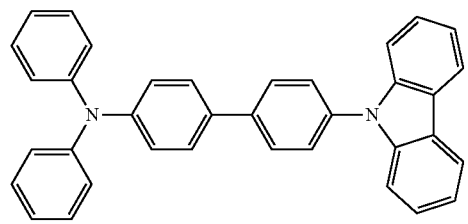
(2-2) 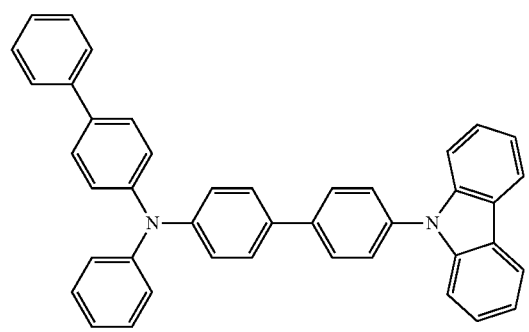
(2-3) 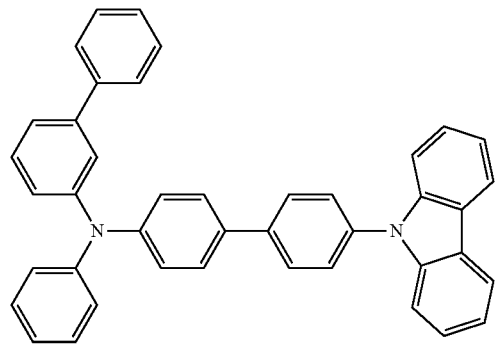
(2-4) 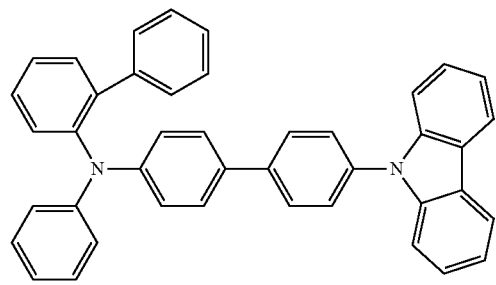
(2-5) 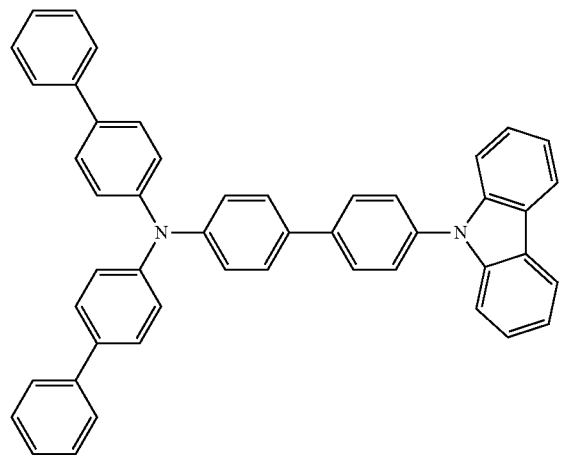
(2-6) 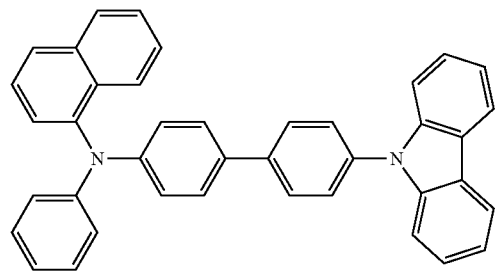
(2-7) 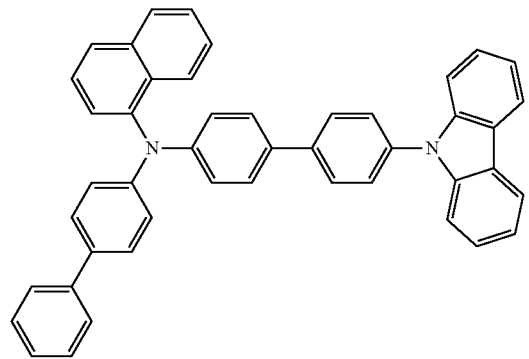
(2-8) 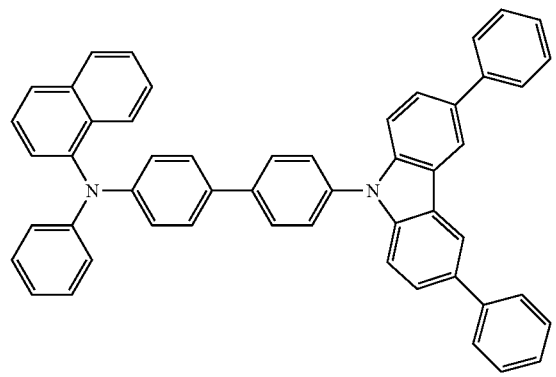

-continued
(2-9)
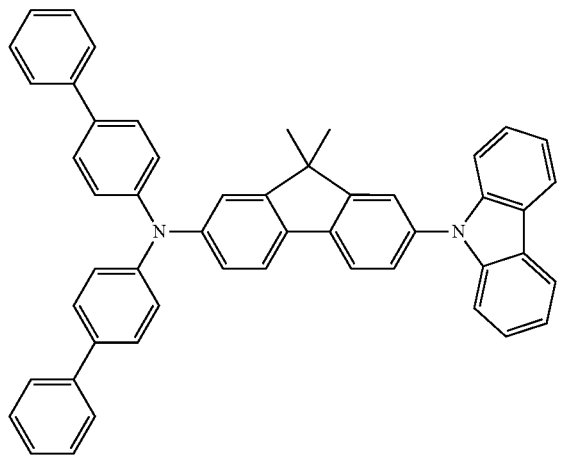
(2-10)
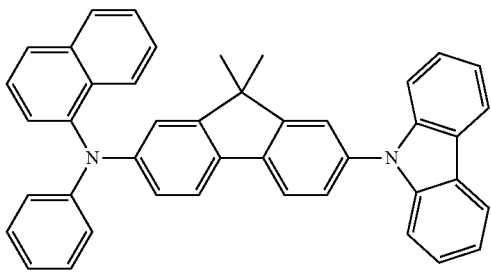
(2-11)
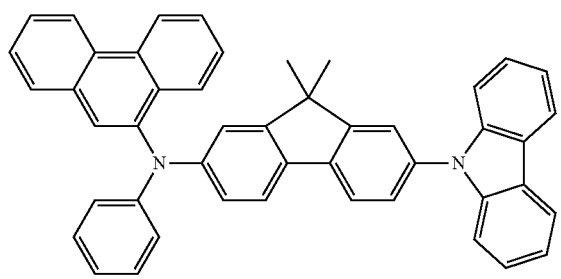
(2-12)
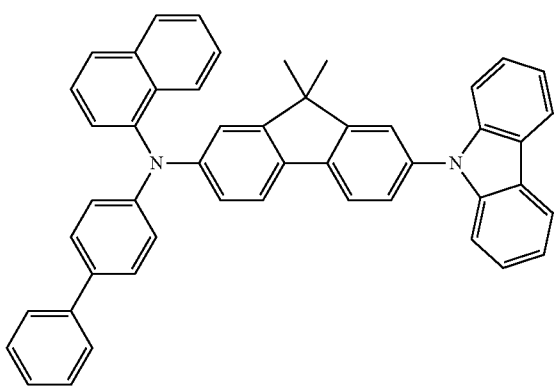
(2-13)
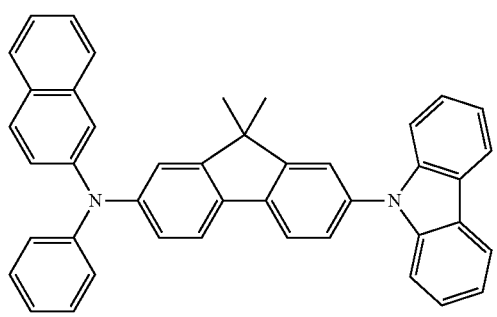
(2-14)
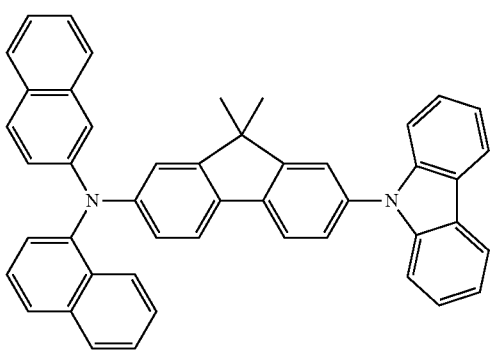
(2-15)
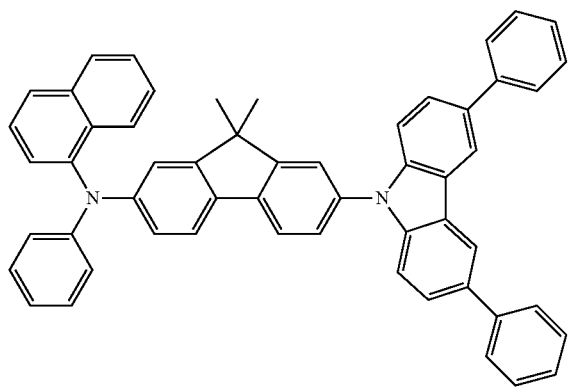
(2-16)
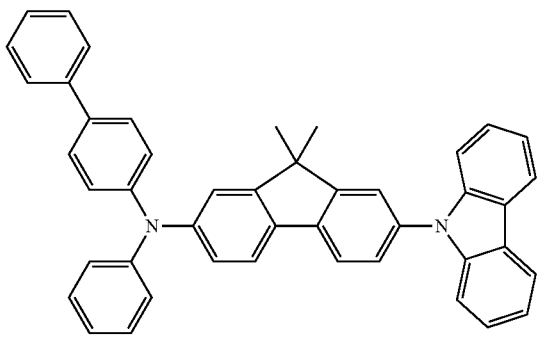

(2-17)
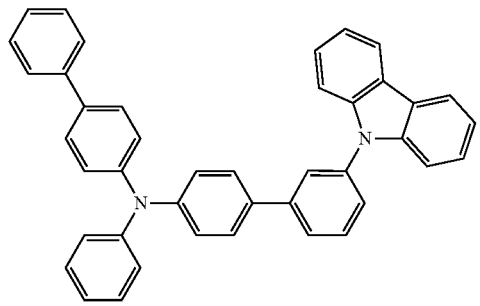
(2-18)
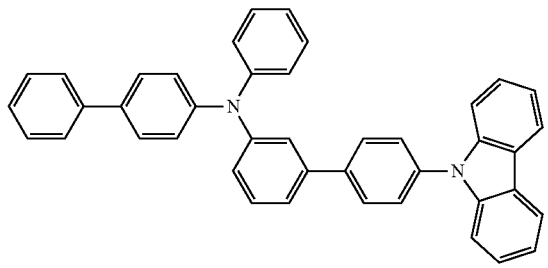
(2-19)
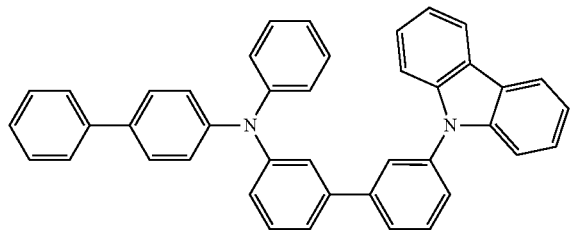
(2-20)
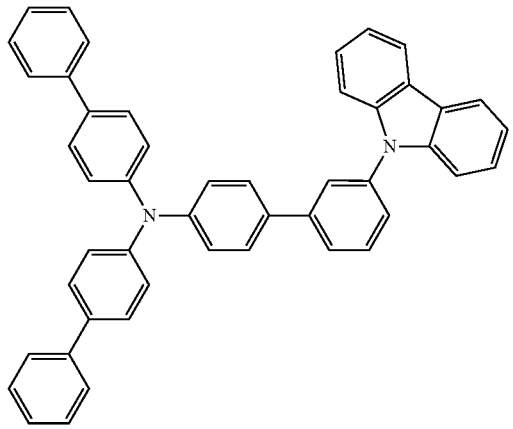
(2-21)
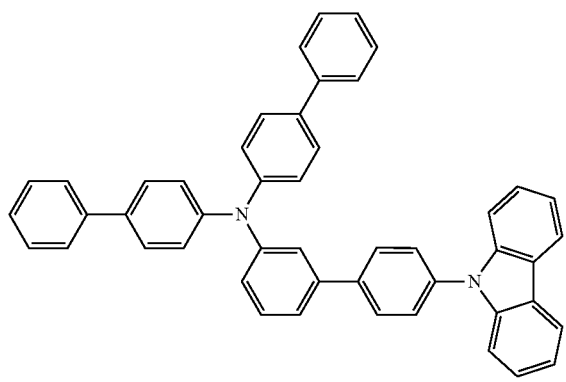
(2-22)
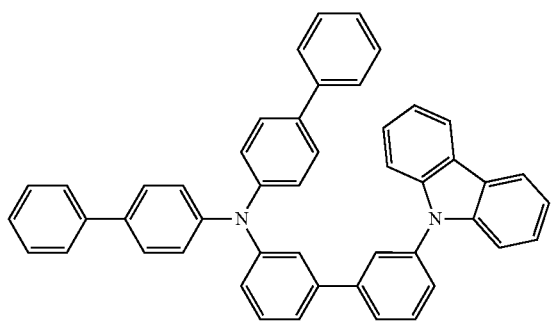
(2-23)
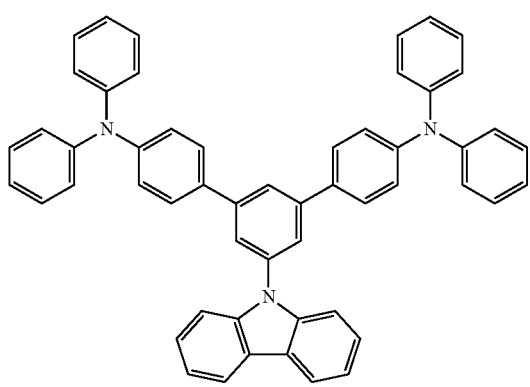
(2-24)
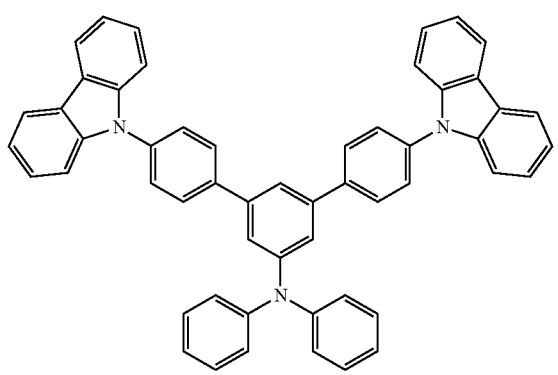

-continued
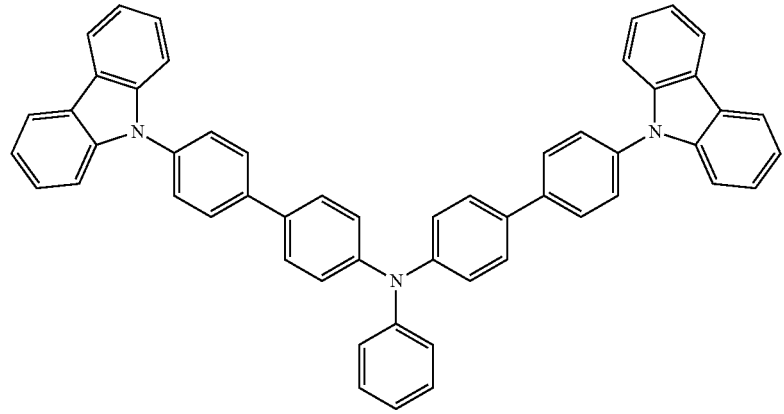
(2-25)
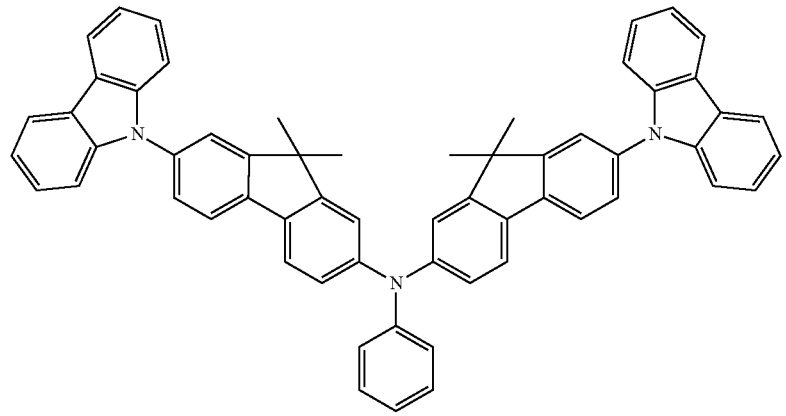
(2-26)
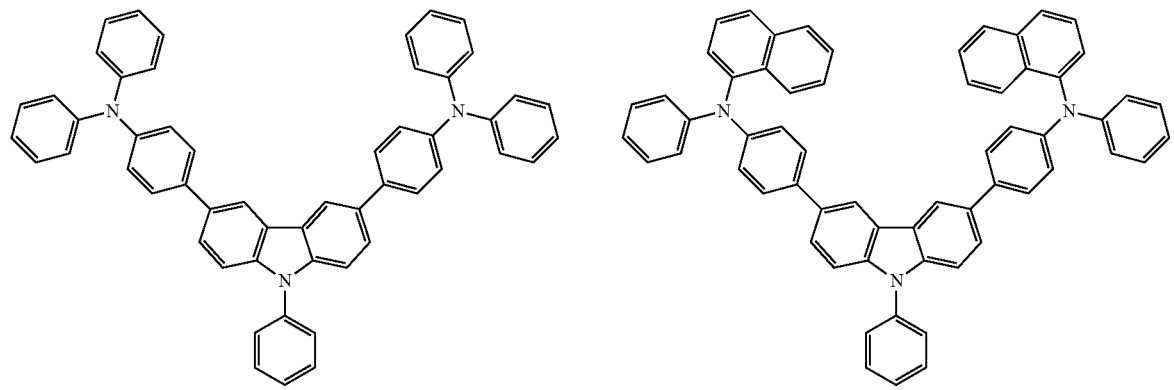
(2-27) (2-28)
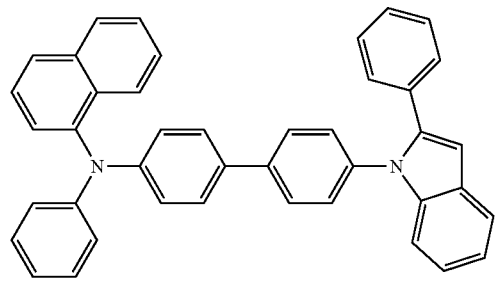
(2-29)
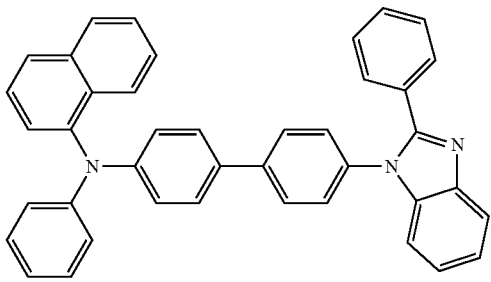
(2-30)

-continued
(2-31)
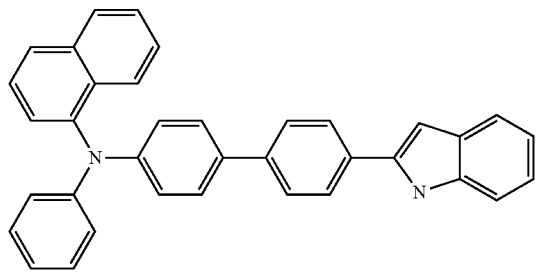
(2-32)
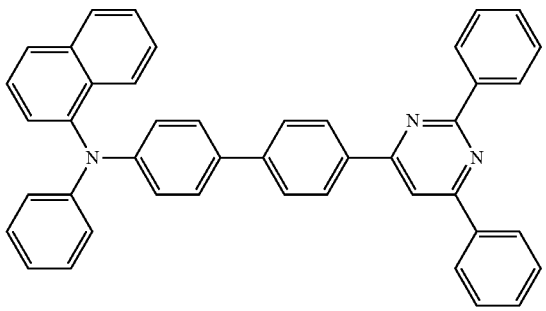
(2-33)
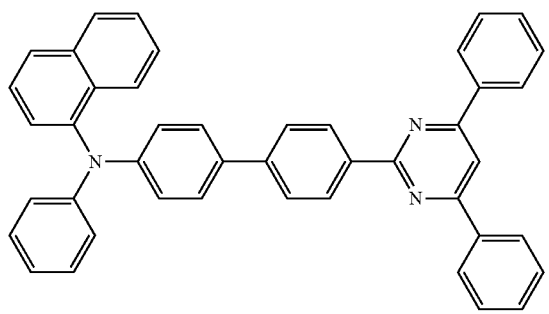
(2-34)
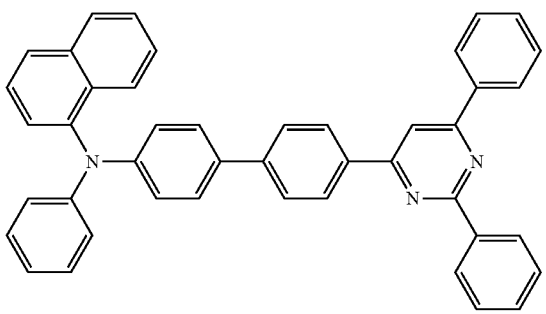
(2-35)
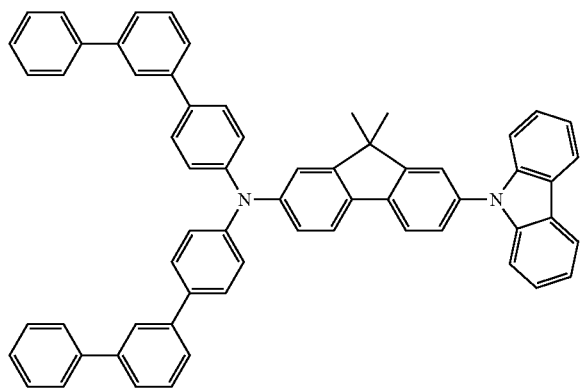
(2-36)
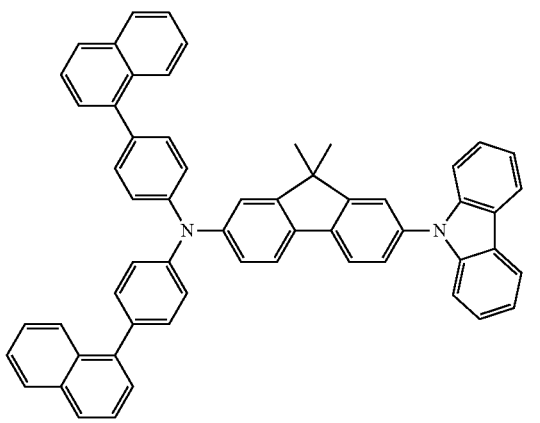
(2-37)
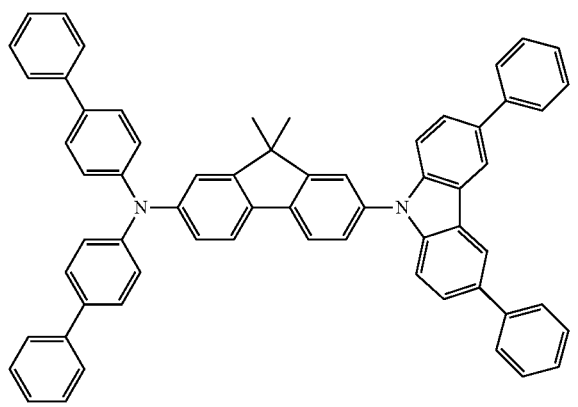
(2-38)
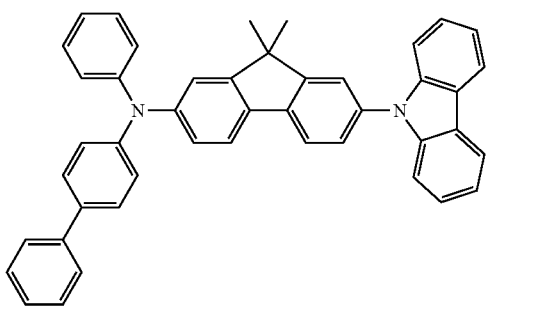

-continued
(2-39)
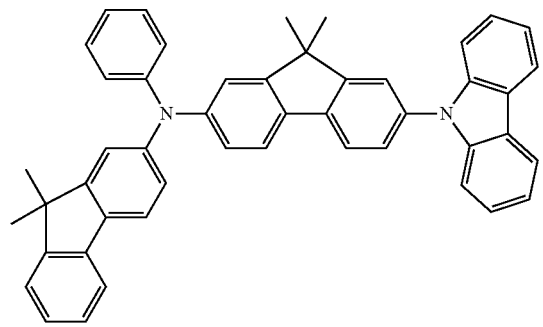
(2-40)
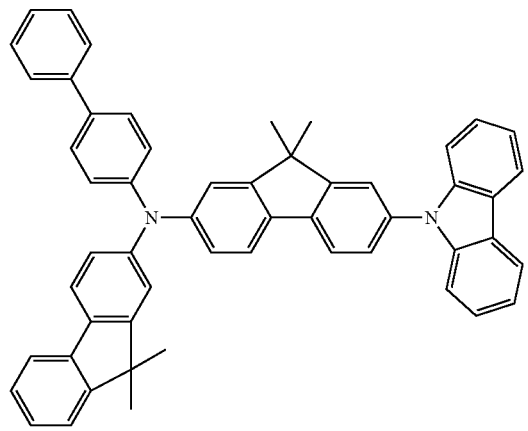
(2-41)
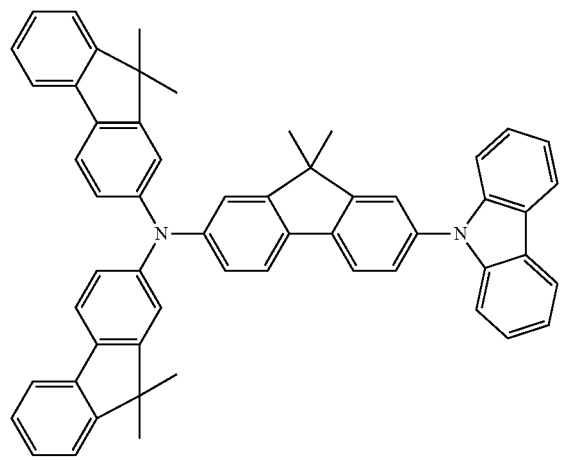
(2-42)
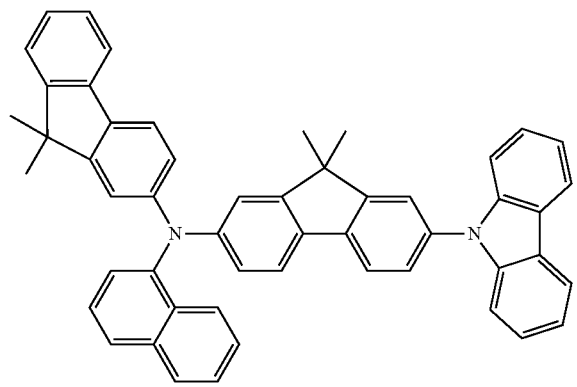
(2-43)
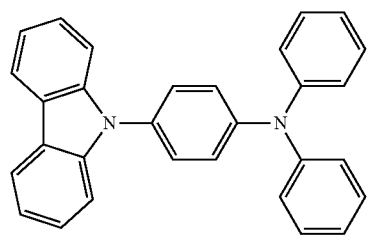
(2-44)
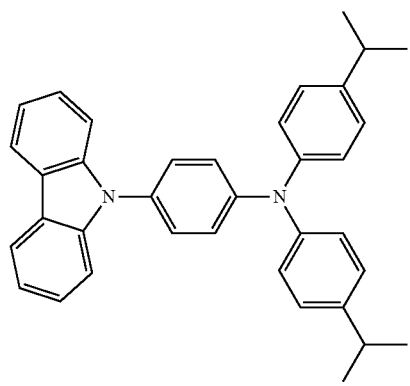

-continued
(2-45)
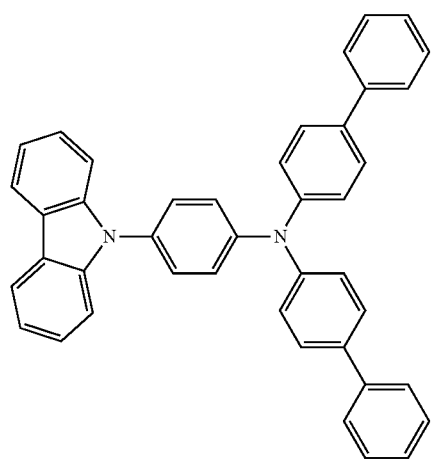
(2-46)
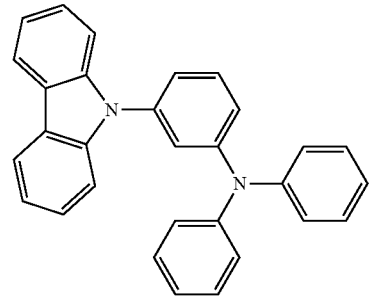
(2-47)
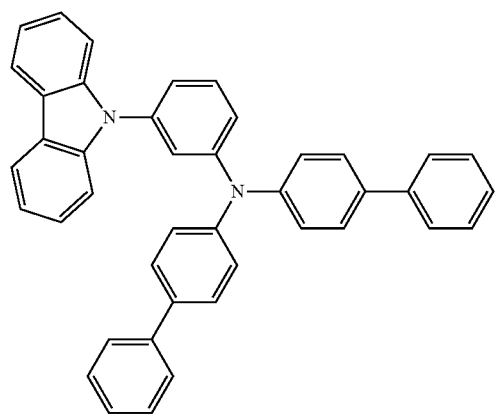
(2-48)
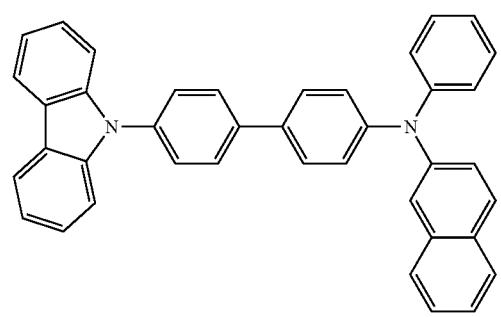
(2-49)
(2-50)
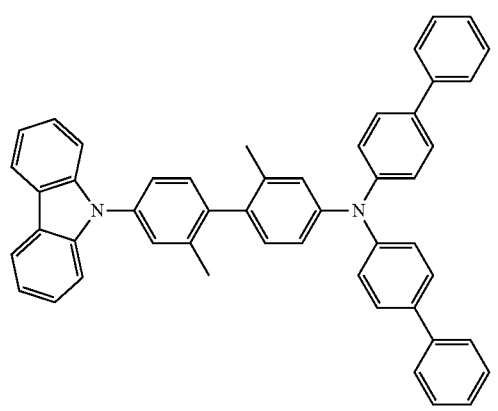
(2-51)
(2-52)
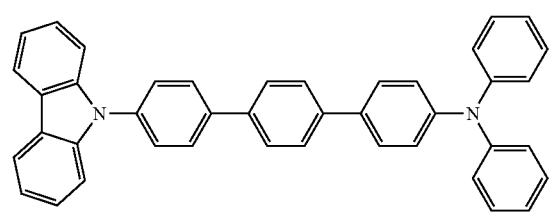

-continued
(2-53)
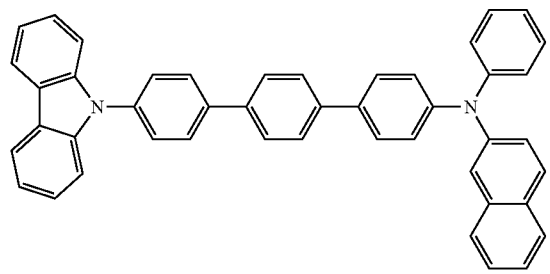
(2-54)
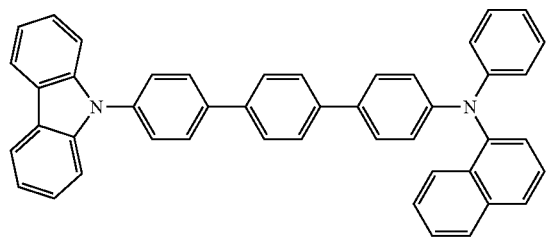
(2-55)
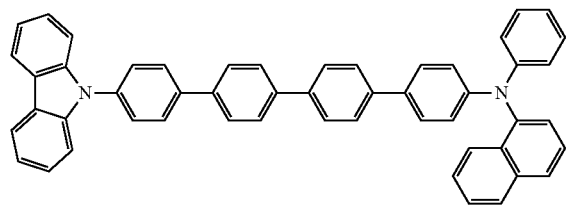
(2-56)
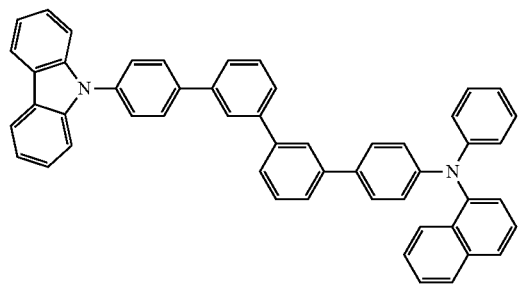
(2-57)
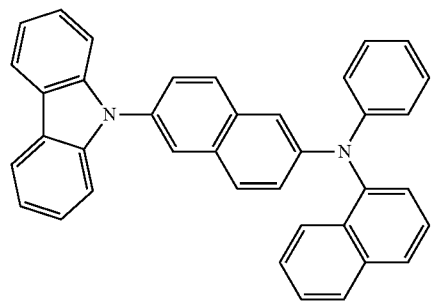
(2-58)
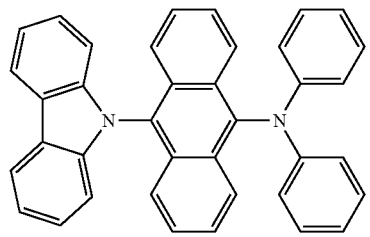
(2-59)
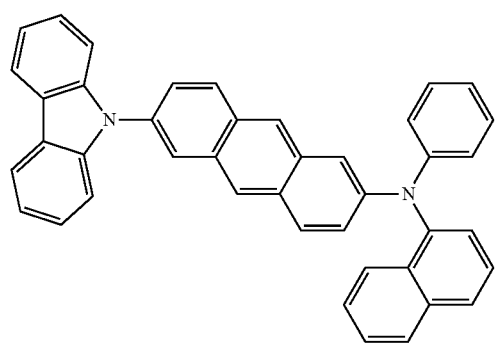
(2-60)
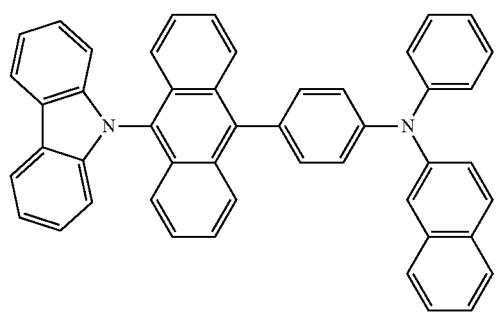
(2-61)
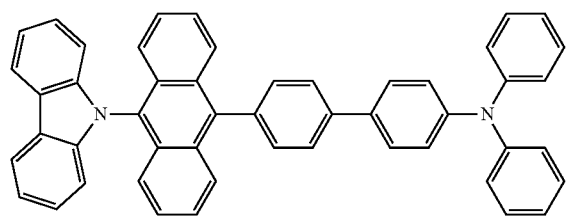
(2-62)
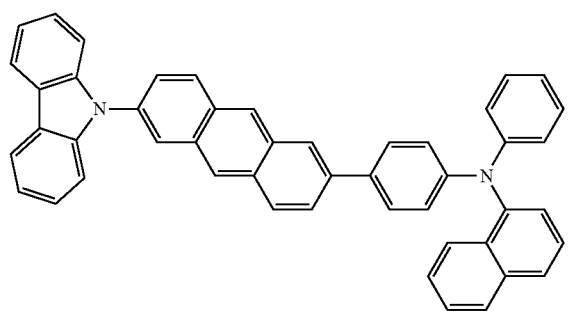

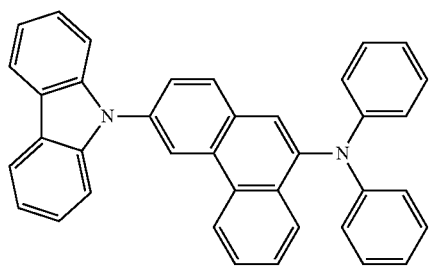
(2-63)
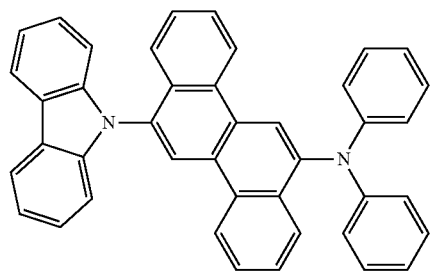
(2-64)
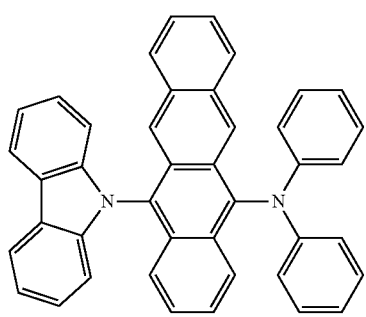
(2-65)
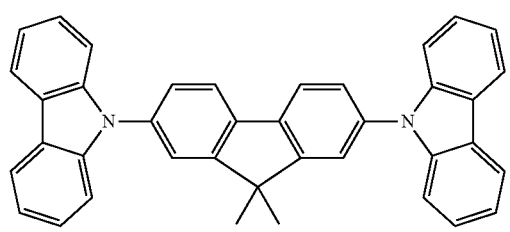
(2-66)
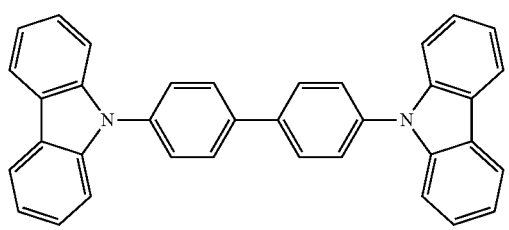
(2-67)
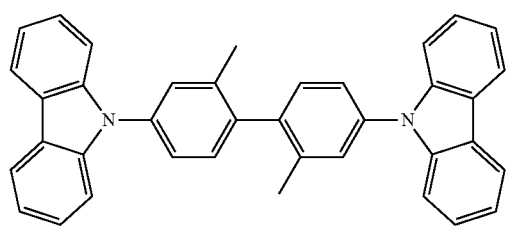
(2-68)
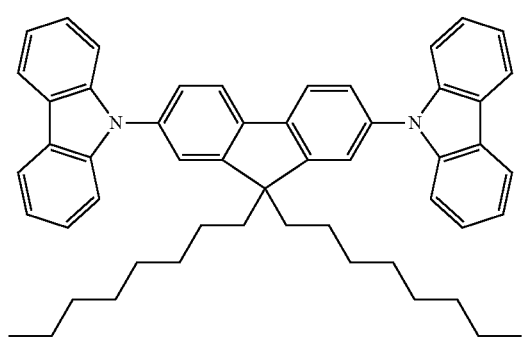
(2-69)
Specific examples of a compound represented by the formula (3) include compounds represented by the following formulas (3-1) to (3-45).

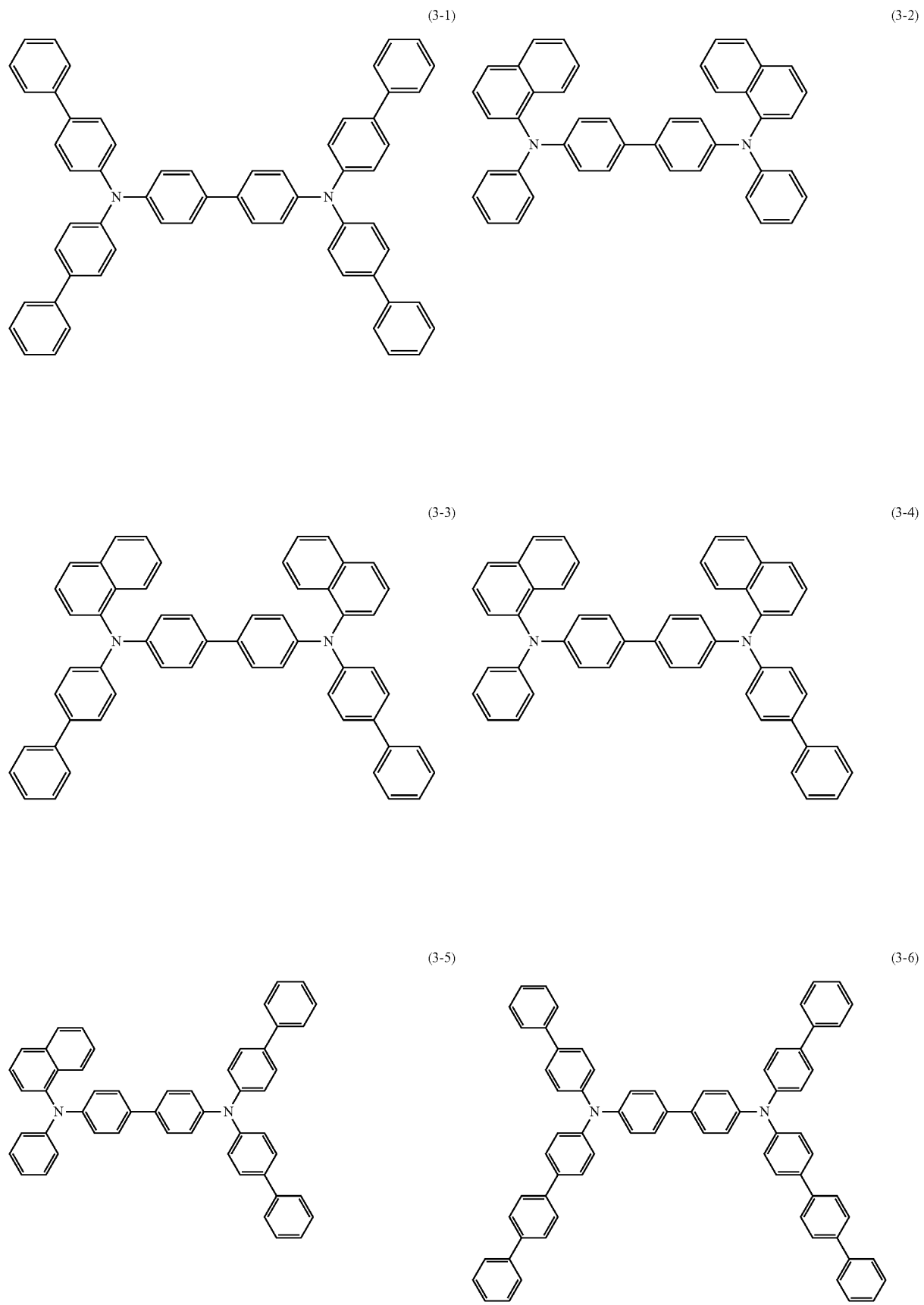

(3-7)
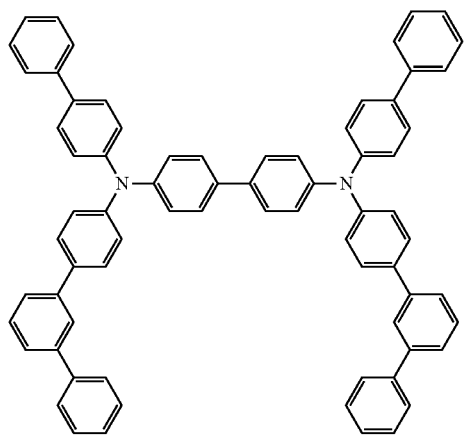
(3-8)
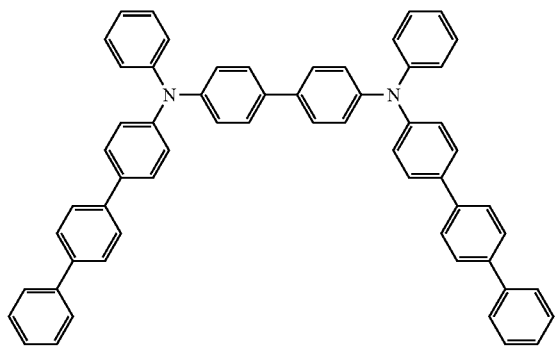
(3-9)
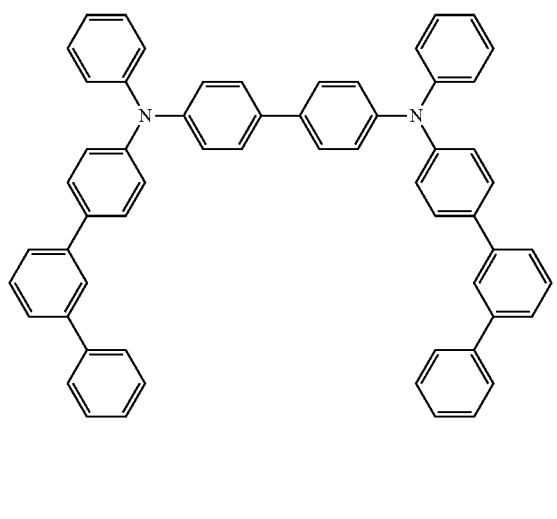
(3-10)
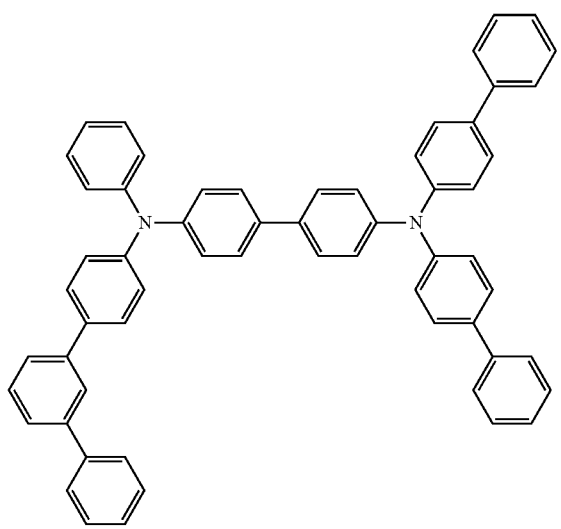
(3-11)
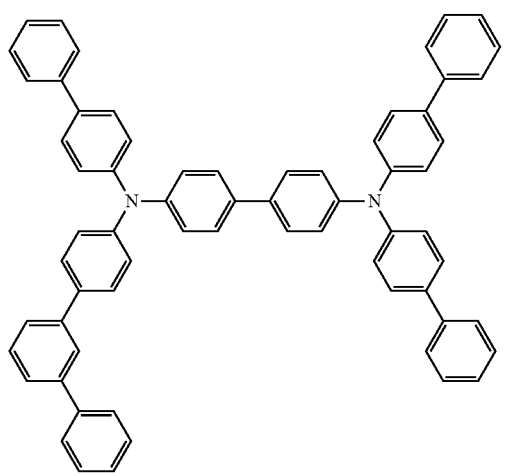
(3-12)
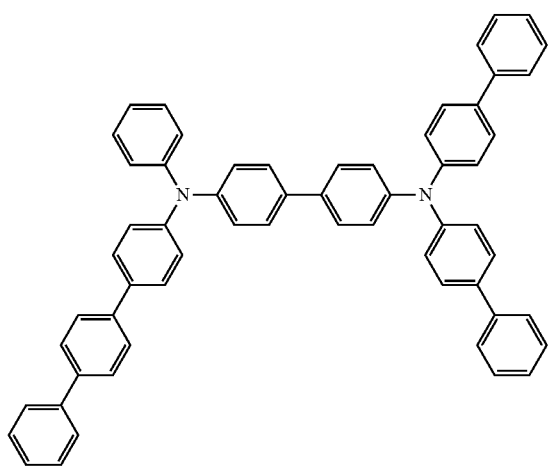

(3-13)
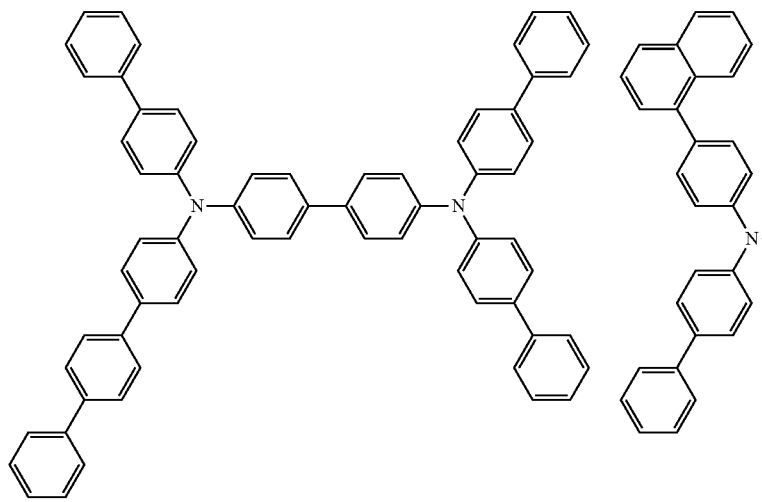
(3-14)
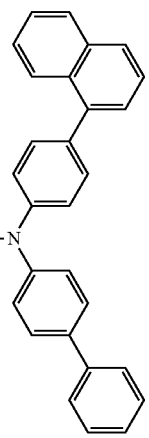
(3-15)
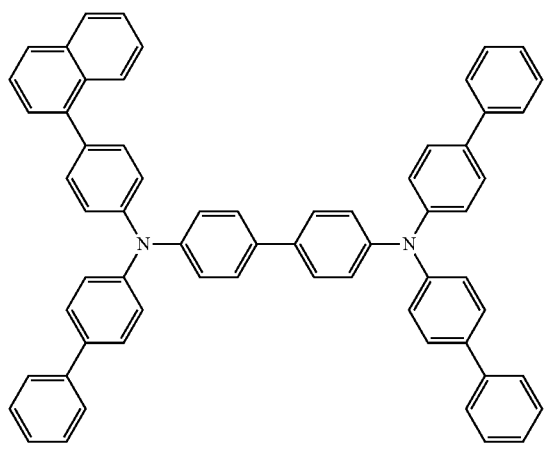
(3-16)
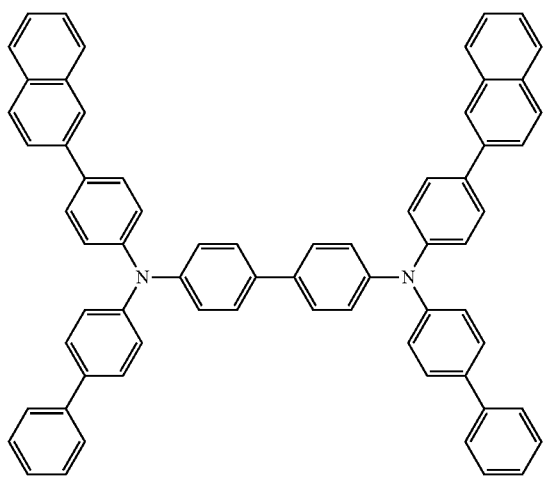
(3-17)
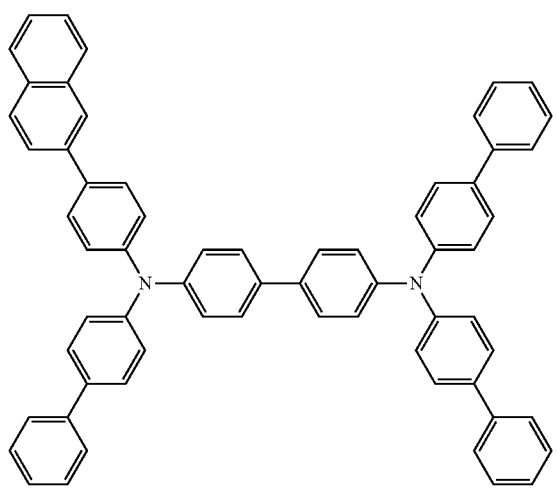
(3-18)
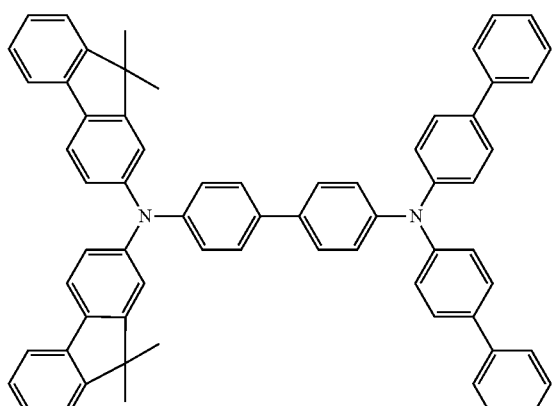

-continued
(3-19)
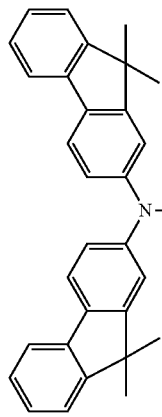
(3-20)
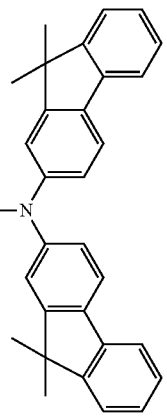
(3-21)
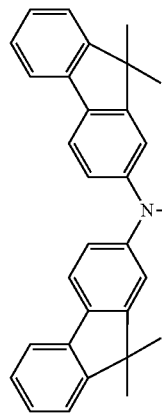
(3-22)
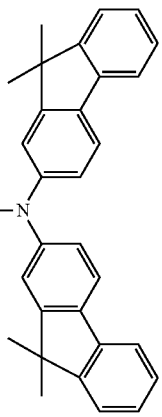
(3-23)
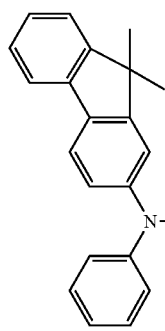
(3-24)
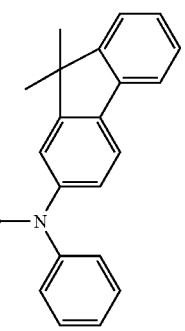
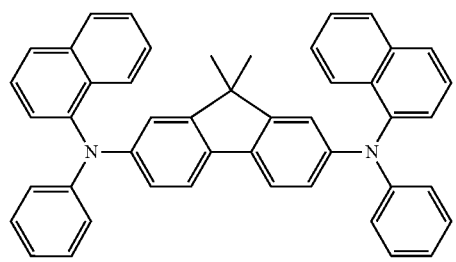
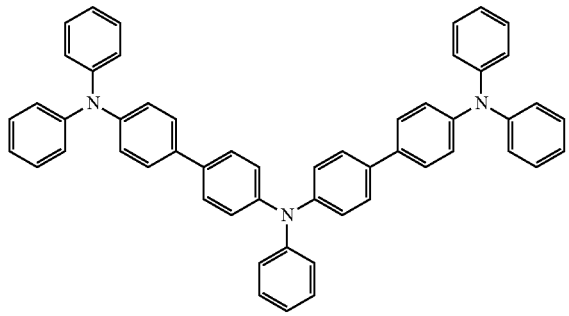
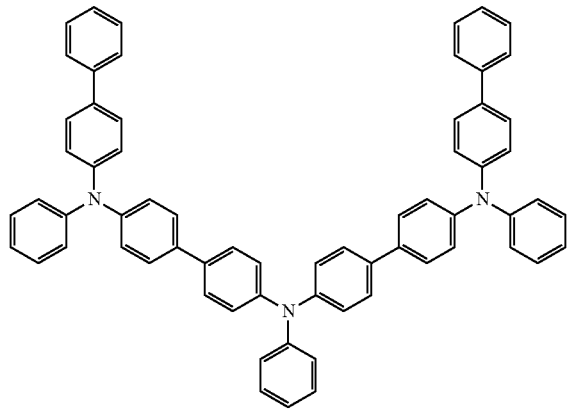
(3-25)
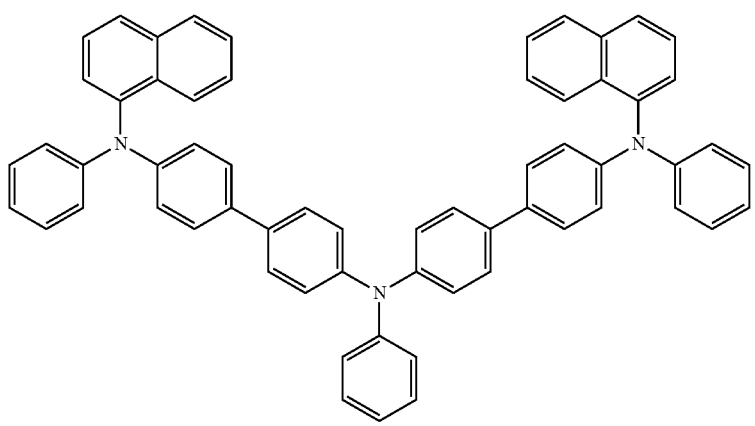

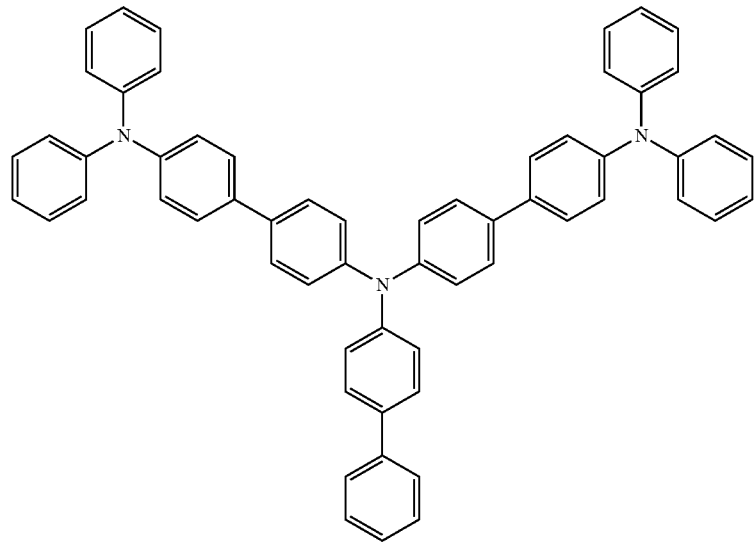
(3-26)
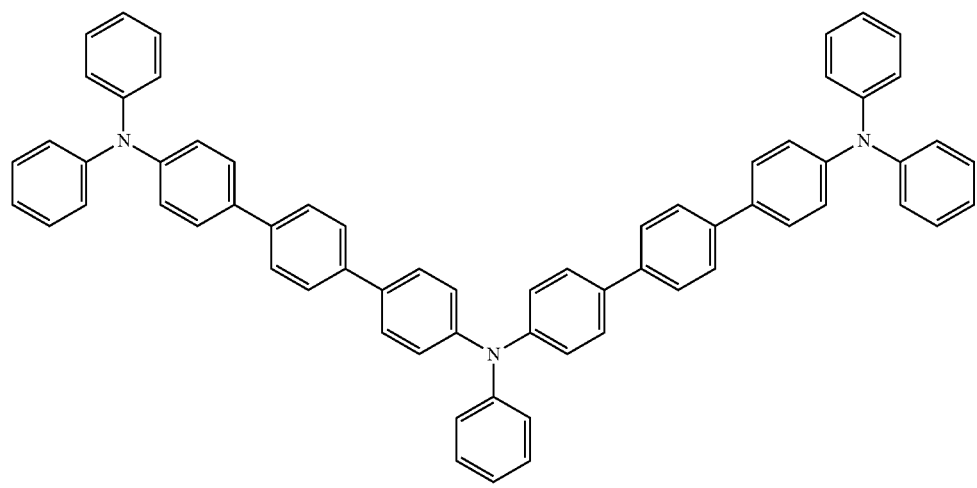
(3-27)
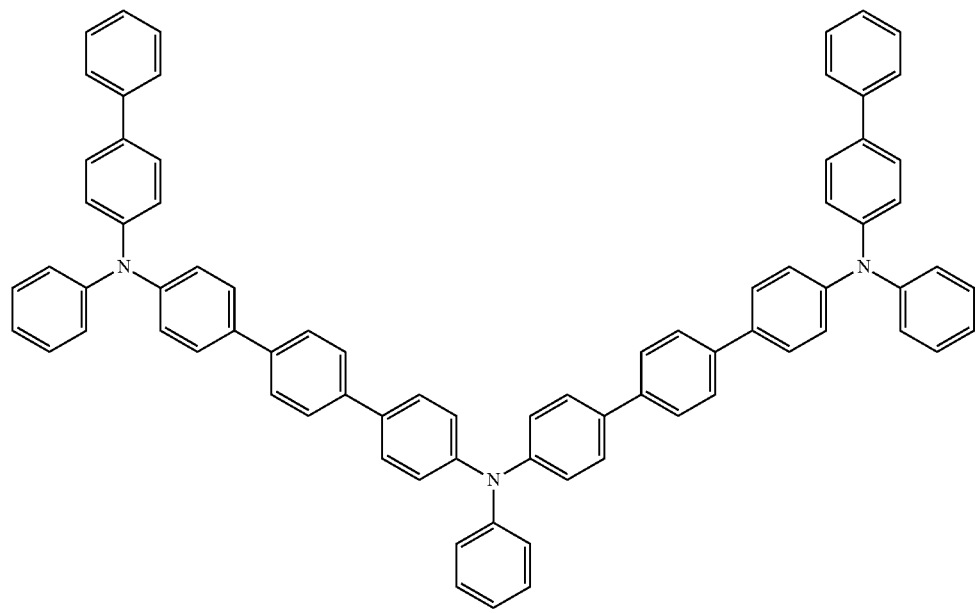
(3-28)

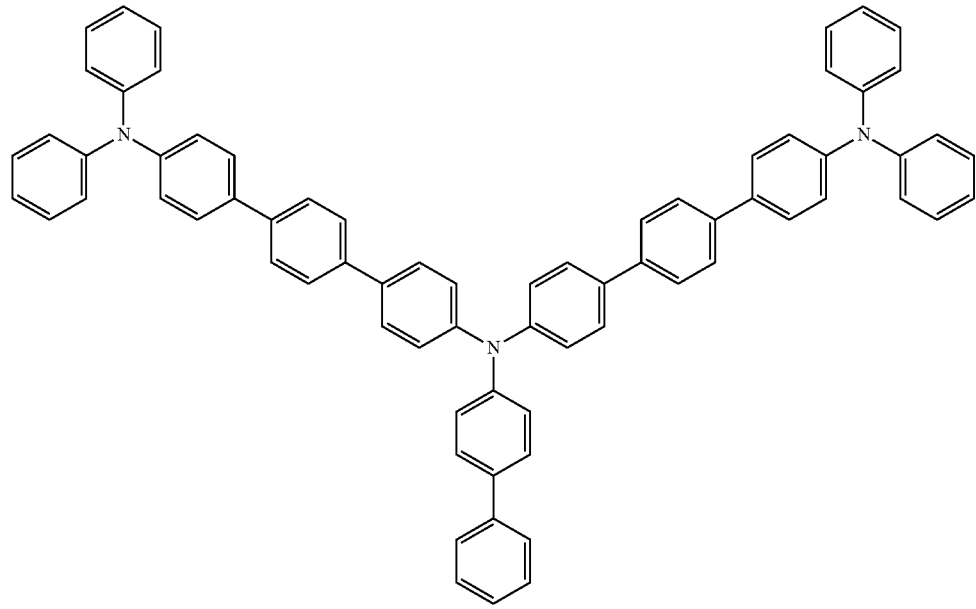
(3-29)
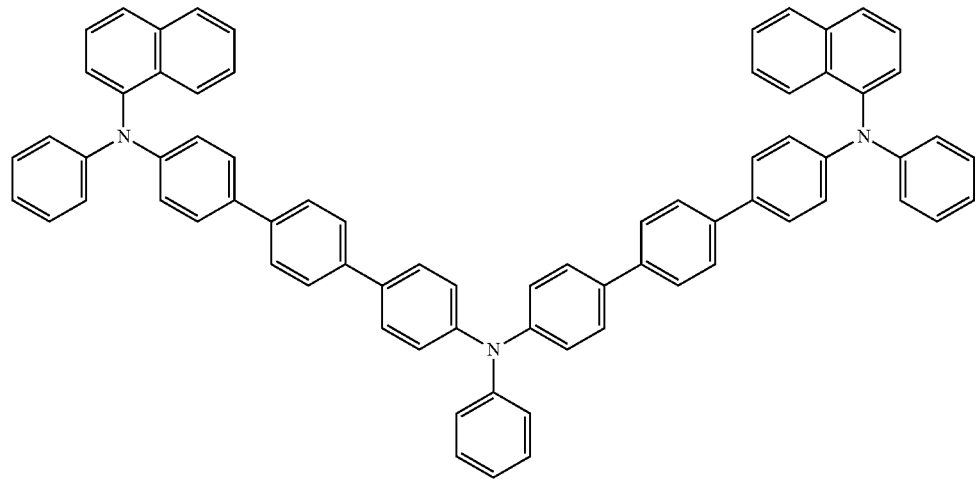
(3-30)
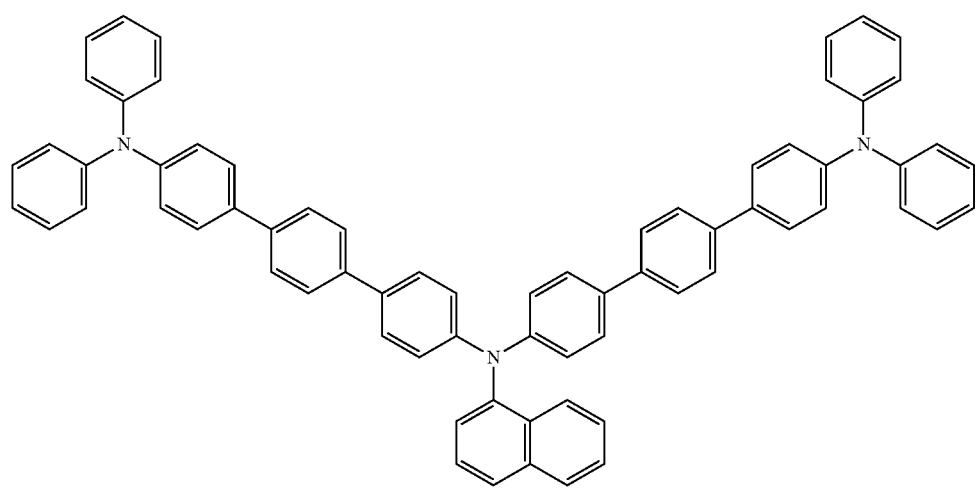
(3-31)

-continued
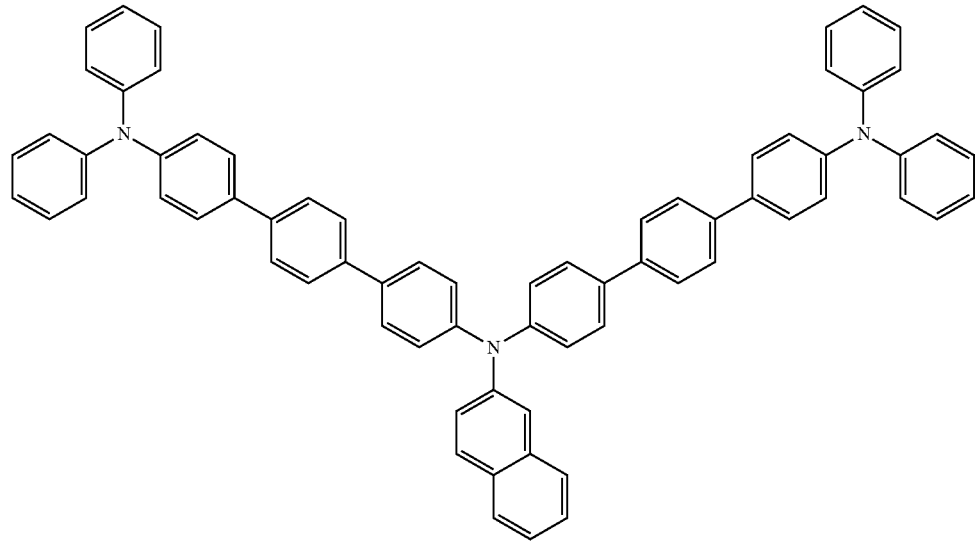
(3-32)
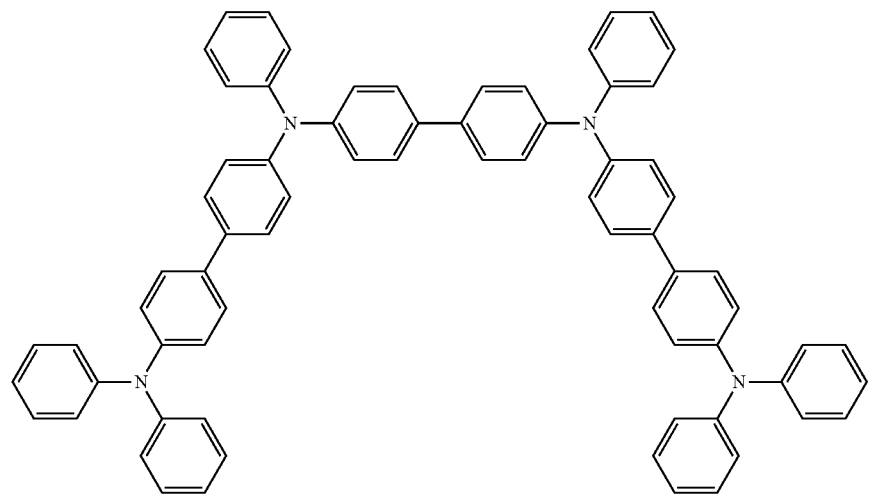
(3-33)
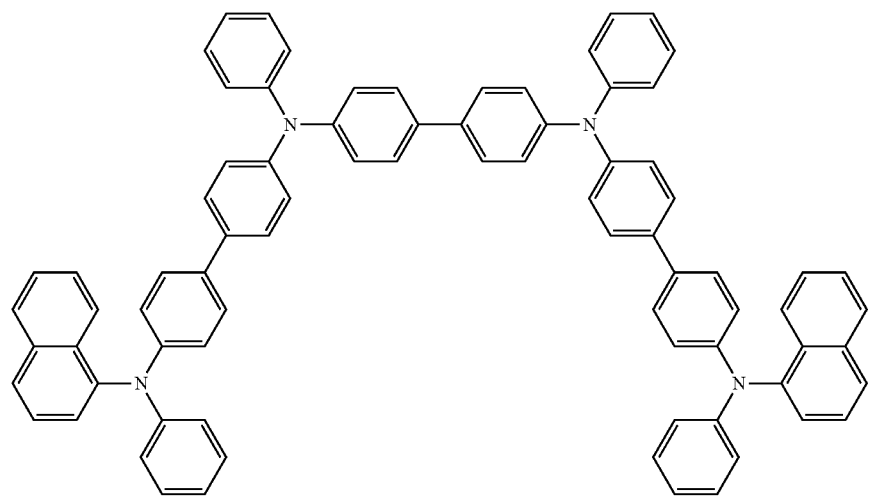
(3-34)

(3-35)
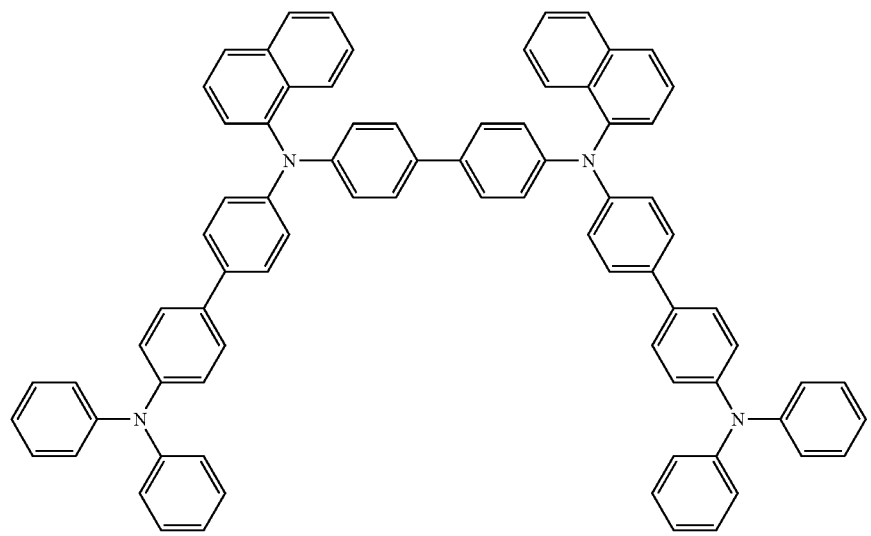
(3-36)
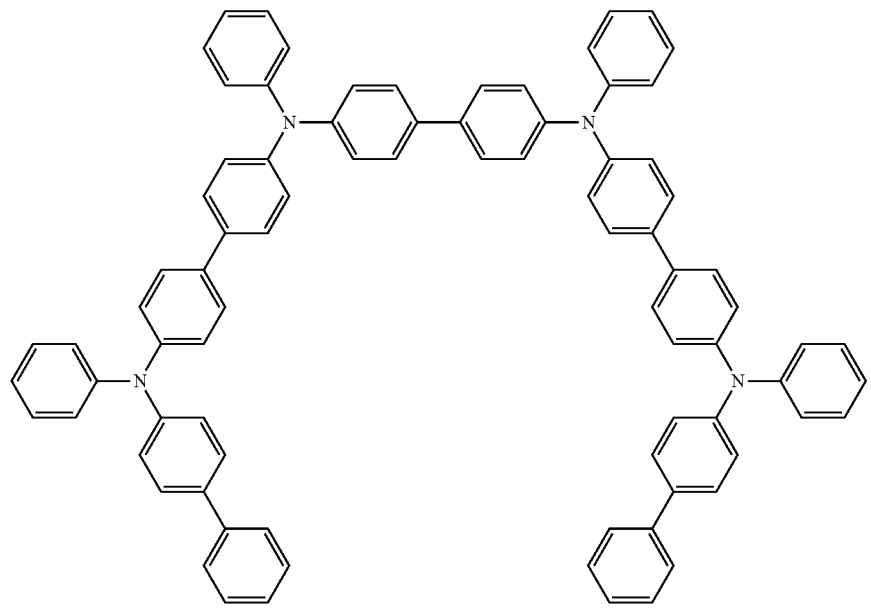
(3-37)
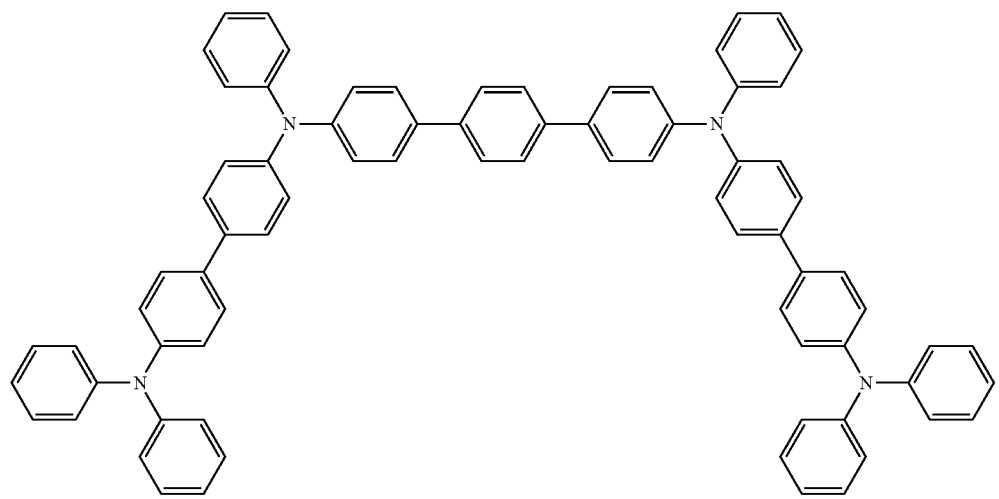

-continued
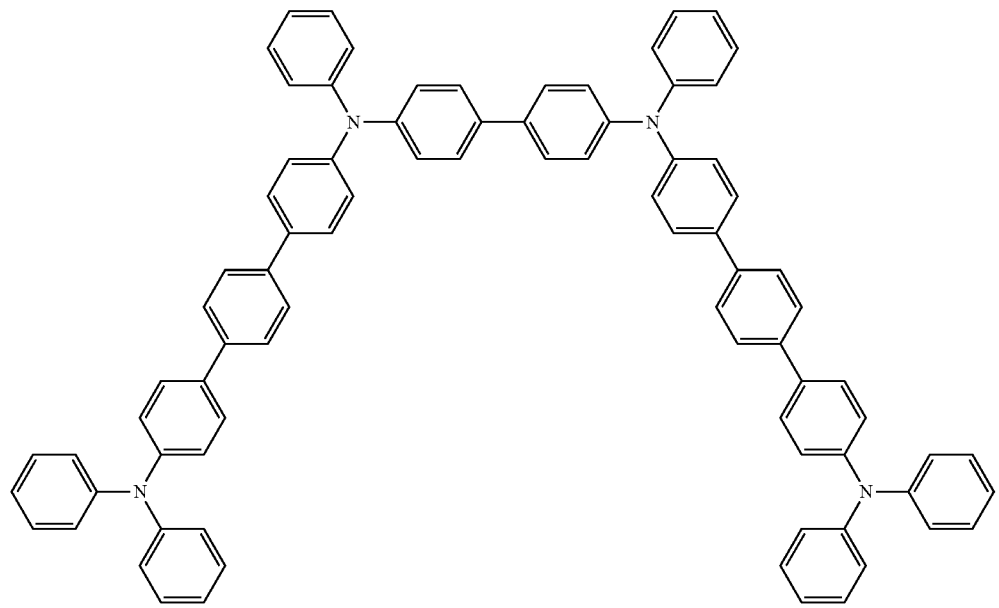
(3-38)
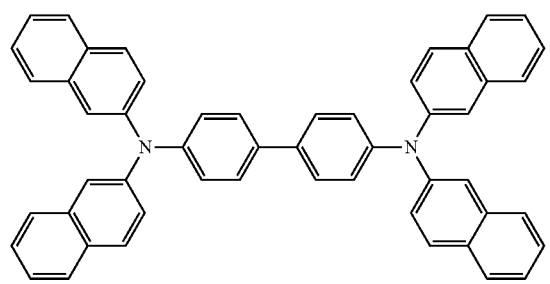
(3-39)
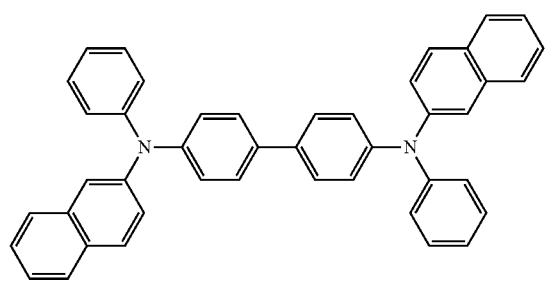
(3-40)
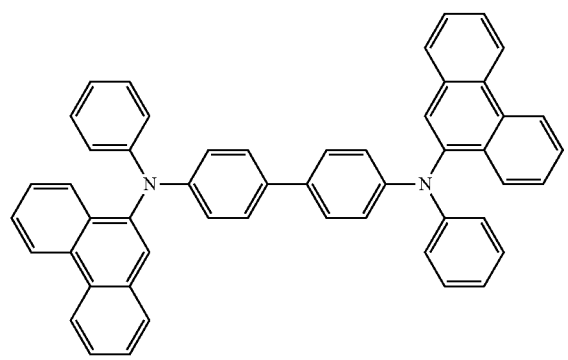
(3-41)
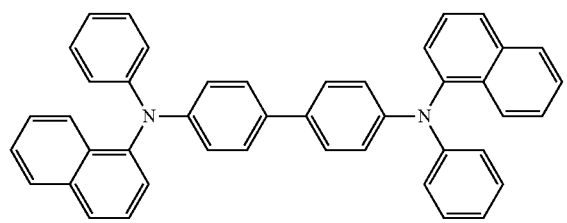
(3-42)
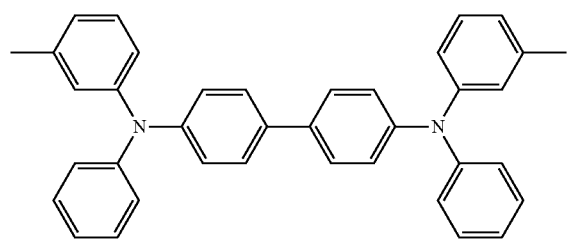
(3-43)
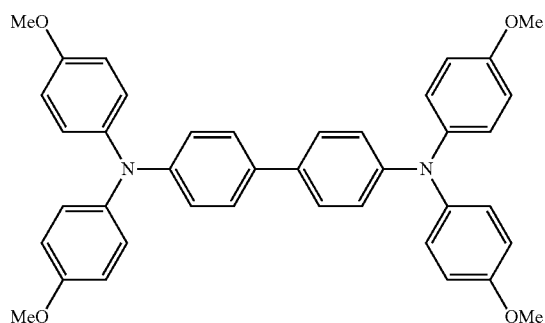
(3-44)

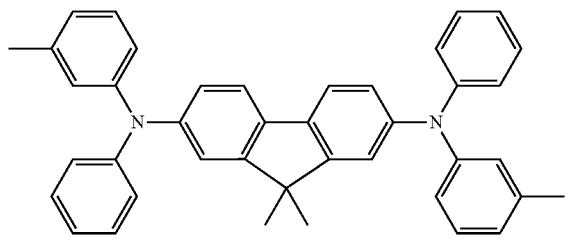

(3-45)

It is to be noted that not only one kind of low-molecular material added to the red light-emitting layer 16CR and the green light-emitting layer 16CG but also a mixture of a plurality of kinds of the low-molecular materials may be used.

The hole transport layers 16BB of the blue organic EL elements 10B are provided to enhance hole transport efficiency to the blue light-emitting layer 16CB, and are arranged on the hole injection layers 16AB, respectively. For example, the thickness of each hole transport layer 16BB, depending on a whole element configuration, is preferably within a range of 10 nm to 200 nm both inclusive, and more preferably 15 nm to 150 nm both inclusive.

The hole transport layers 16BB may be made of any one of a low-molecular material (a monomer or an oligomer) and a high-molecular material. The monomer in the low-molecular material used herein is the same as the low-molecular material added to the red light-emitting layers 16CR and the green light-emitting layers 16CG, that is, a low-molecular material having a single molecular weight and being present in a single molecular form except for a compound such as a polymer or a condensation product of a low-molecular compound. Moreover, the oligomer indicates a bond with a weight-average molecular weight (Mw) of 50000 or less of a plurality of monomers. Further, as in the case of the high-molecular material used for the hole transport layers 16BR and 16BG, the weight-average molecular weight of the high-molecular material may be within a range of 50000 to 300000 both inclusive, and in particular, preferably within a range of approximately 100000 to 200000. It is to be noted that as the low-molecular material and the high-molecular material used for the hole transport layer 16BB, a mixture of two or more kinds of materials with different molecular weights and different weight-average molecular weights may be used.

As the low-molecular material used in the hole transport layers 16BB, for example, benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene or a derivative thereof, or a heterocyclic conjugated monomer, oligomer or polymer such as a polysilane-based compound, vinylcarbazole-based compound, an thiophene-based compound or an aniline-based compound is allowed to be used.

More specifically, α-naphthyl phenyl phenylenediamine, porphyrin, metal tetraphenyl porphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenylphenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylene vinylene), poly(thiophene vinylene), or poly(2,2'-thienylpyrrole) is used, but the low-molecular material is not limited thereto.

Moreover, the hole transport layers 16BB are preferably formed with use of any of the low-molecular materials represented by the above-described formulas (1) to (3), and specific examples thereof include compounds represented by the above-described formulas (1-1) to (1-48), (2-1) to (2-69) and (3-1) to (3-45).

The high-molecular material may be appropriately selected based on a relationship with an electrode or a material of an adjacent layer, and as the high-molecular material, a light-emitting material which is soluble in an organic solvent, for example, polybinylcarbazole, polyfluorene, polyaniline, polysilane or a derivative thereof, a polysiloxane derivative having an aromatic amine in a side chain or a main chain, polythiophene and a derivative thereof, and polypyrrole are allowed to be used.

More preferably, a high-molecular material represented by a formula (4) having good adhesion with an adjacent organic layer and having solubility in an organic solvent is used.

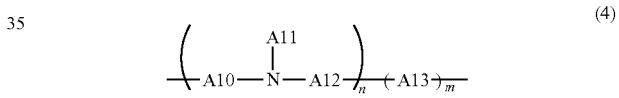

(4)

where A10 to A13 each are a group in which 1 to 10 aromatic hydrocarbon groups or 1 to 10 derivatives thereof, or 1 to 15 heterocyclic groups or 1 to 15 derivatives thereof are bonded, n and m each are an integer of 0 to 10000 both inclusive, and n+m is an integer of 10 to 20000 both inclusive.

Moreover, the arrangement sequence of an n-unit and an m-unit may be arbitrarily set, and may be any of a random polymer, an alternating copolymer, a periodic copolymer and a block copolymer. Moreover, n and m each are preferably an integer of 5 to 5000 both inclusive, and more preferably an integer of 10 to 3000 both inclusive. Further, n+m is preferably an integer of 10 to 10000 both inclusive and more preferably an integer of 20 to 6000 both inclusive.

Specific examples of the aromatic hydrocarbon group in A10 to A13 of the above-described formula (4) include benzene, fluorene, naphthalene and anthracene and a derivative thereof, and a phenylenevinylene derivative and a styryl derivative. Specific example of the heterocyclic group include thiophene, pyridine, pyrrol, carbazole and a derivative thereof.

Moreover, in the case where A10 to A13 in the above-described formula (4) includes a substituent group, examples of the substituent group include a straight or branched alkyl group and alkenyl group with 1 to 12 carbon atoms. More specifically, a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, an undecyl group, a dodecyl group, a vinyl group, an allyl group or the like is preferable.

Specific examples of the compound represented by the formula (4) preferably include compounds represented by the following formulas (4-1) to (4-3), that is, poly[(9,9-dioctylfluorenyl-2,7-diyl)-co-(4,4'-(N-(4-sec-butylphenyl))diphenylamine)] (TFB, represented by the formula (4-1)), poly[(9,9-dioctylfluorenyl-2,7-diyl)-alt-co-(N,N'-bis{4-butylphenyl}-benzidine-N,N'-{1,4-diphenylene})] (represented by the formula (4-2)) and poly[(9,9-dioctylfluorenyl-2,7-diyl)] (PFO, represented by the formula (4-3)), but the compound represented by the formula (4) is not limited thereto.

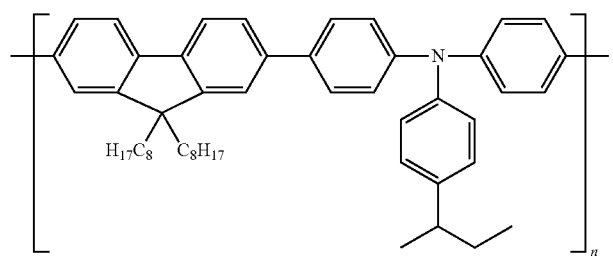

(4-1)

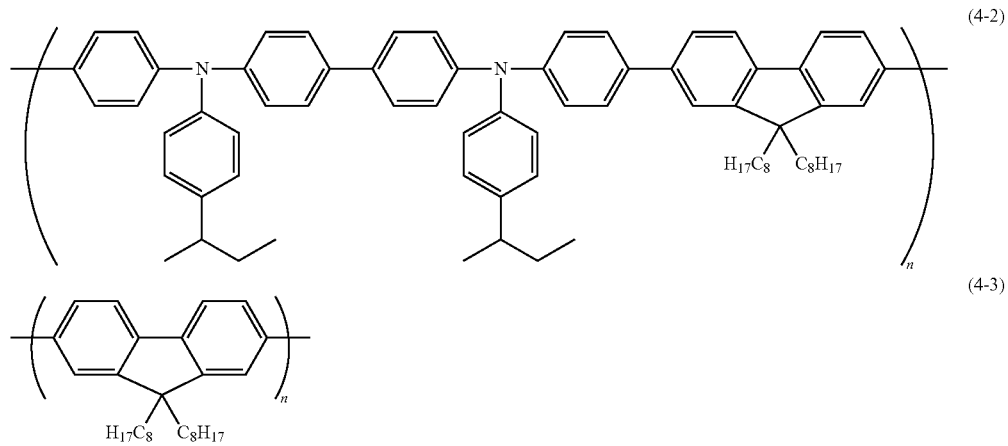

(4-2)

(4-3)

The blue light-emitting layer 16CB emits light by the recombination of electrons and holes in response to the application of an electric field, and the blue-light emitting layer 16CB is arranged on a whole surface of the common hole transport layer 16D. The blue light-emitting layer 16CB includes an anthracene compound as a host material doped with a blue or green fluorescent pigment as a guest material to emit blue or green light.

As the host material forming the blue light-emitting layer 16CB, a compound represented by a formula (5) is preferably used.

Chemical Formula 18

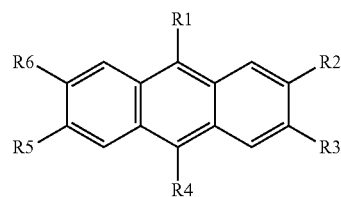

(5)

where R1 to R6 each are independently a hydrogen atom, a halogen atom, a hydroxyl group, a cyano group, a nitro group, a group including a carbonyl group with 20 or less carbon atoms, a group including a carbonyl ester group, an alkyl group, an alkenyl group, an alkoxyl group, or a derivative thereof, a group including a silyl group with 30 or less carbon atoms, a group including an aryl group, a group including a heterocyclic group, a group including an amino group, or a derivative thereof.

Examples of the group including an aryl group indicated by R1 to R6 in the compound represented by the formula (5) include a phenyl group, a 1-naphthyl group, a 2-naphthyl group, a fluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-chrysenyl group, a 6-chrysenyl group, a 2-fluoranthenyl group, a 3-fluoranthenyl group, a 2-biphenylyl group, a 3-biphenylyl group, a 4-biphenylyl group, an o-tolyl group, a m-tolyl group, a p-tolyl group, and a p-t-butylphenyl group.

Moreover, the group including a hetereocyclic group indicated by R1 to R6 is a five- or six-membered ring aromatic ring group containing an oxygen atom (O), a nitrogen atom (N) and a sulfur atom (S) as hetero atoms, or a condensed polycyclic aromatic ring group with 2 to 20 carbon atoms. Examples of such a heterocyclic group include a thienyl group, a furyl group, a pyrrolyl group, a pyridyl group, a quinolyl group, a quinoxalyl group, an imidazopyridyl group and a benzothiazole group. Representative examples include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group and a 9-acridinyl group.

The group including an amino group indicated by R1 to R6 may be any of an alkylamino group, an arylamino group, an aralkylamino group and the like. They preferably include an aliphatic hydrocarbon group with 1 to 6 carbon atoms and/or an aromatic ring group with 1 to 4 carbon atoms. Such groups include a dimethylamino group, a diethylamino group, a dibutylamino group, a diphenylamino group, a ditolylamino group, a bisbiphenylylamino group and a dinaphthylamino group. It is to be noted that the above-described substituent group may form a condensed ring configured of two or more substituent groups, and further, the above-described substituent group may be a derivative thereof.

Specific examples of the compound represented by the formula (5) include compounds represented by the following formulas (5-1) to (5-51).

(5-1)
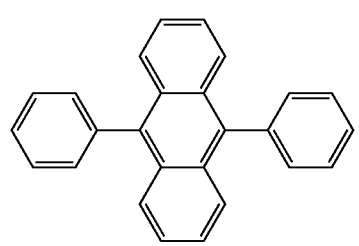

(5-2)
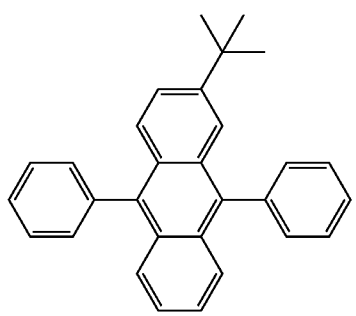

(5-3)
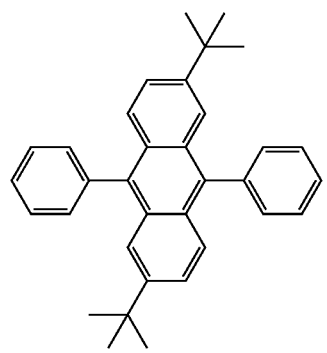

(5-4)
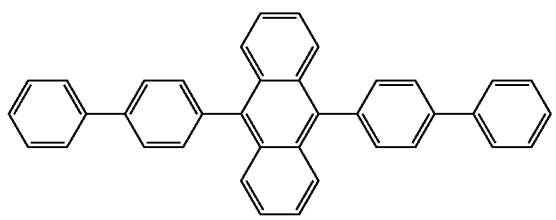

(5-5)
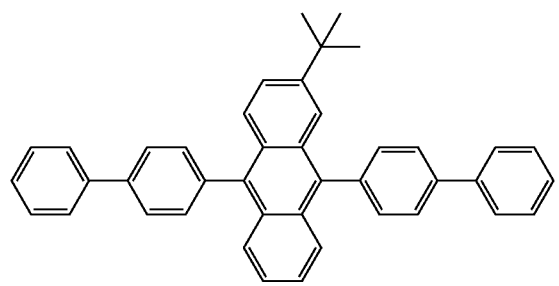

(5-6)
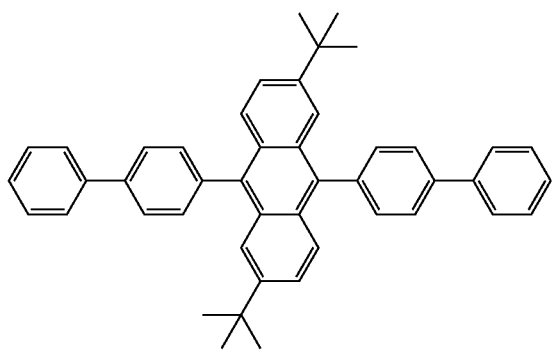

(5-7)
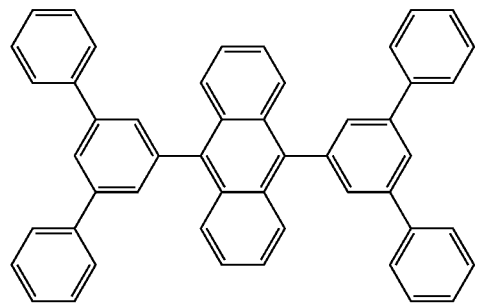
(5-8)
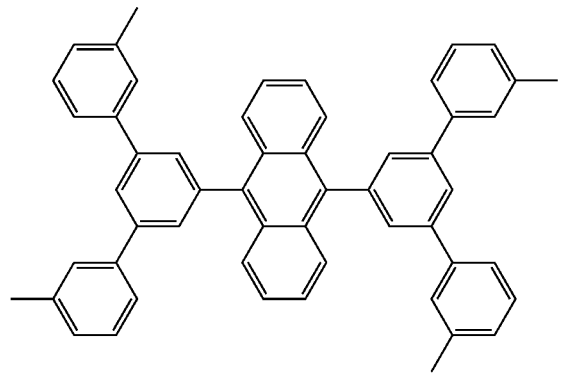
(5-9)
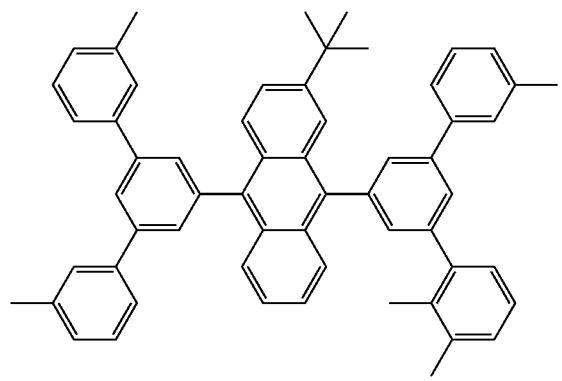
(5-10)
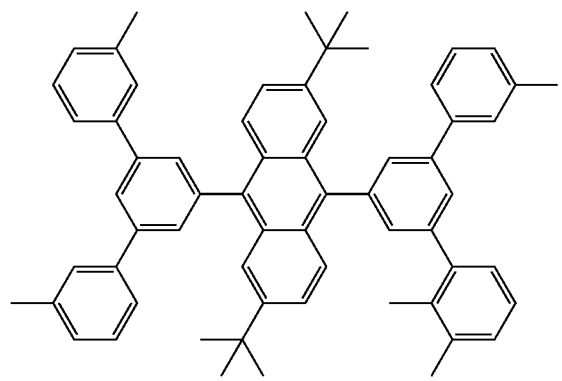
(5-11)
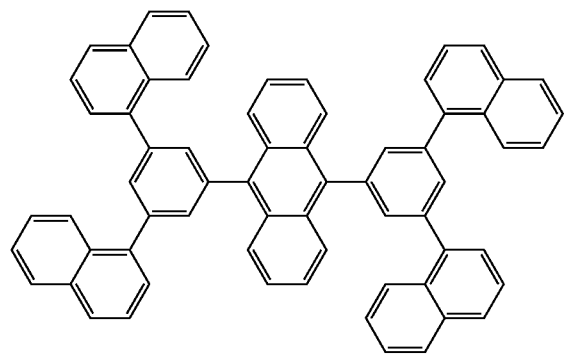
(5-12)
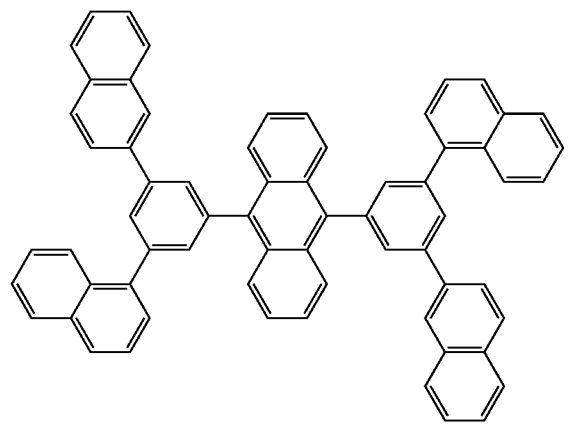
(5-13)
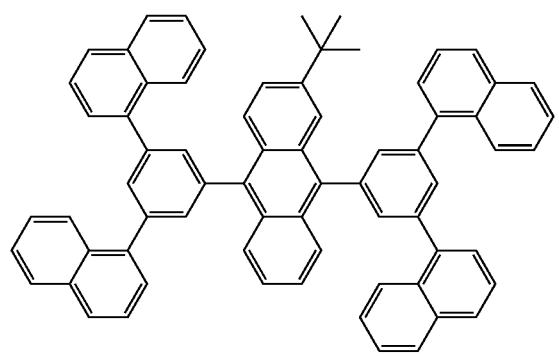
(5-14)
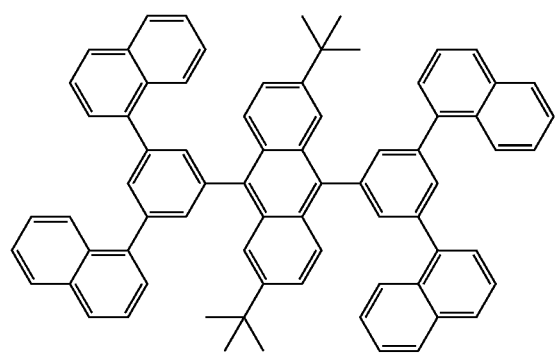

-continued
(5-15)
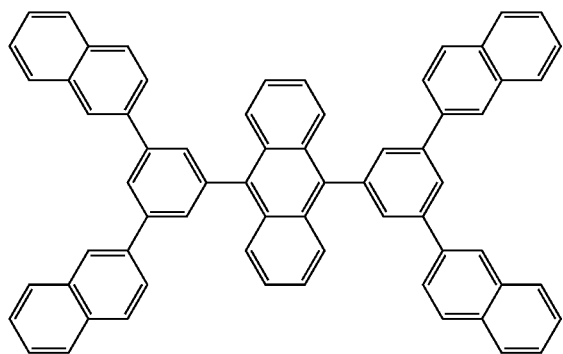
(5-16)
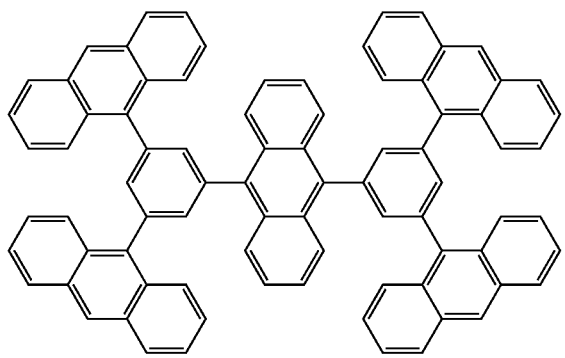
(5-17)
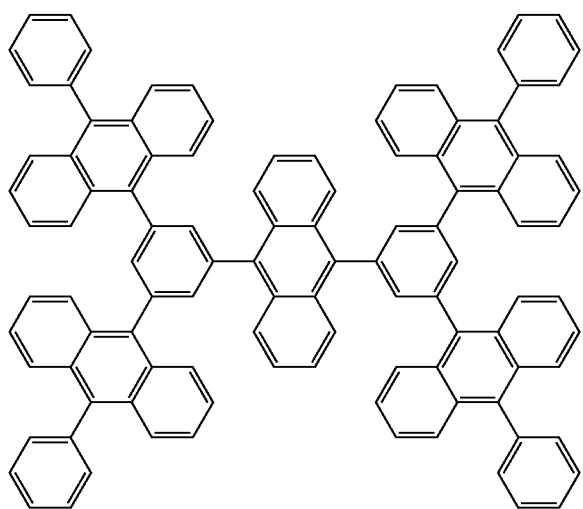
(5-18)
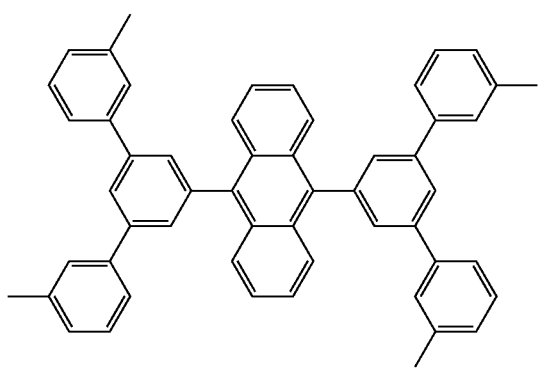
(5-19)
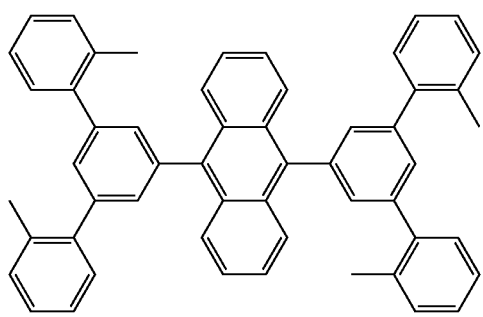
(5-20)
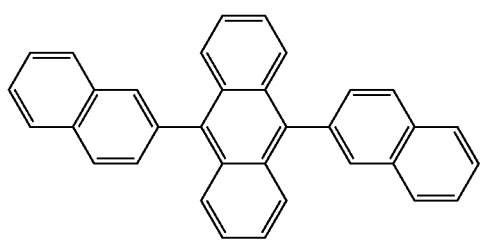
(5-21)
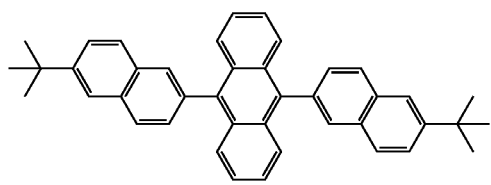
(5-22)
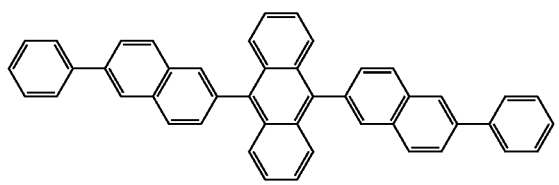

(5-23)
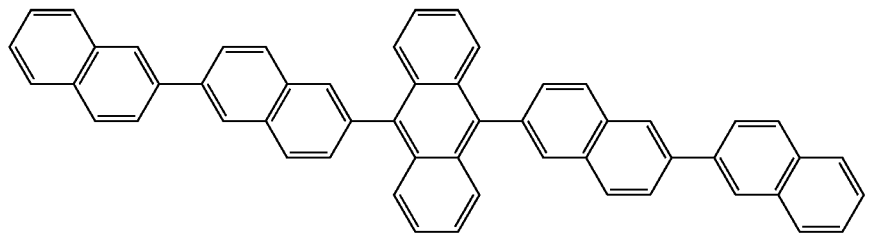
(5-24)
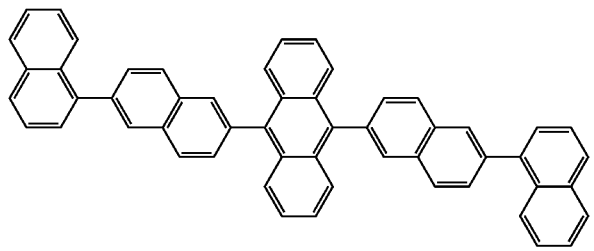
(5-25)
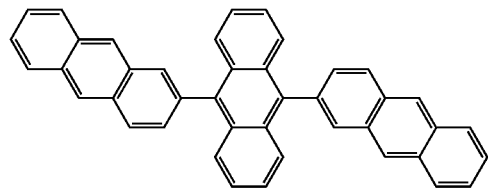
(5-26)
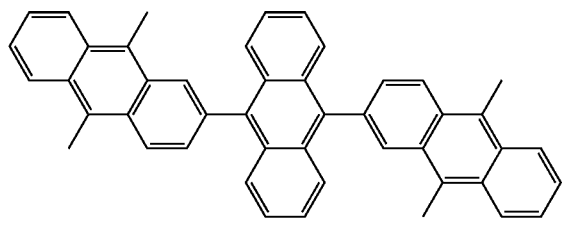
(5-27)
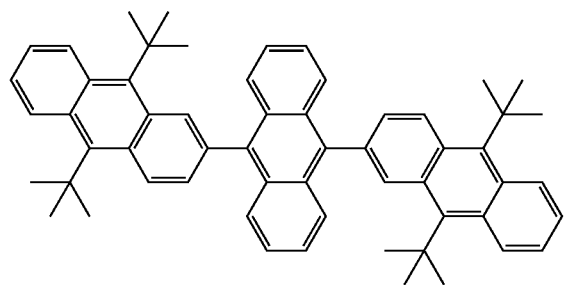
(5-28)
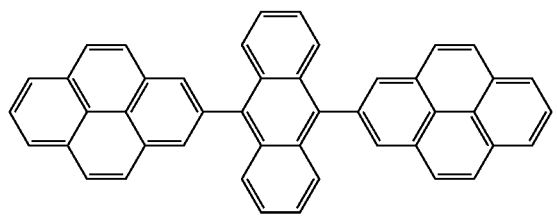
(5-29)
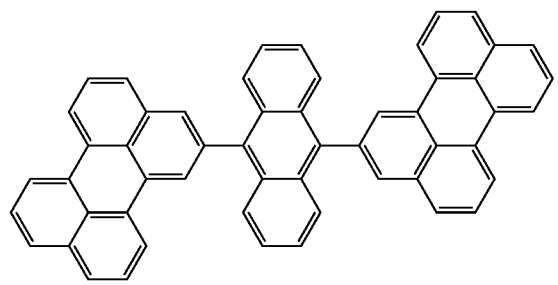
(5-30)
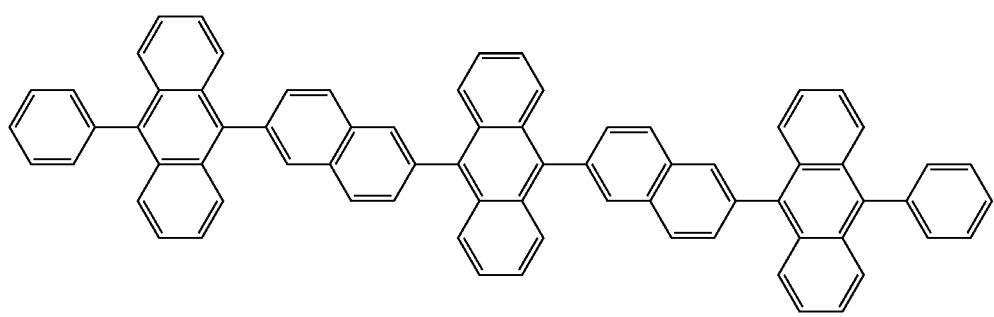

-continued
(5-31)
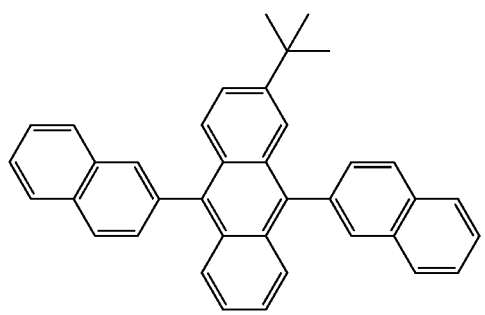
(5-32)
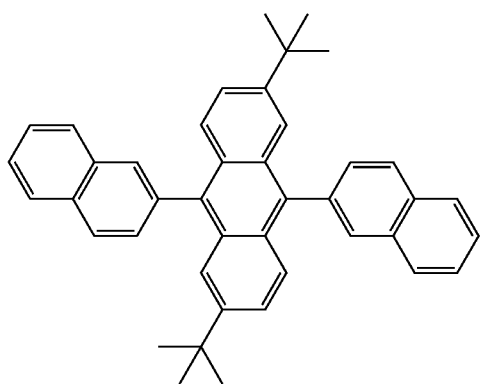
(5-33)
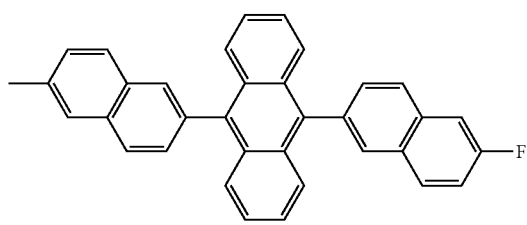
(5-34)
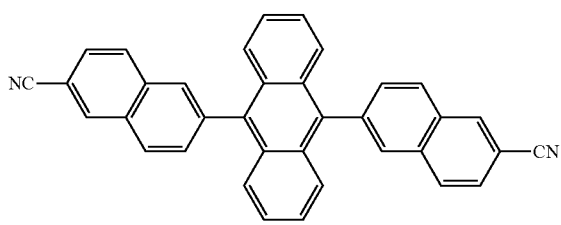
(5-35)
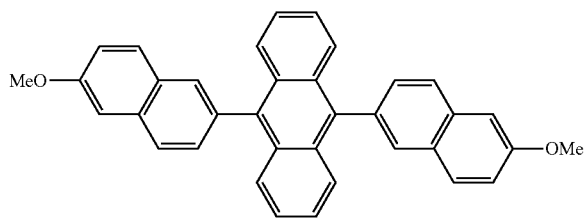
(5-36)
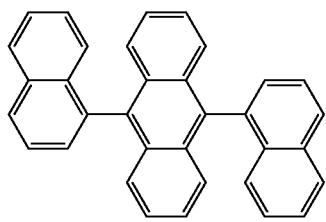
(5-37)
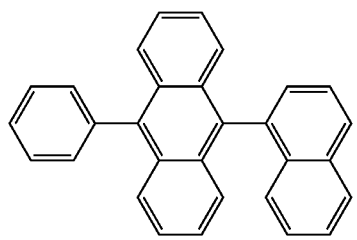
(5-38)
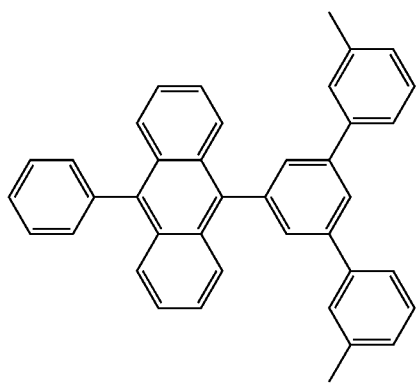
(5-39)
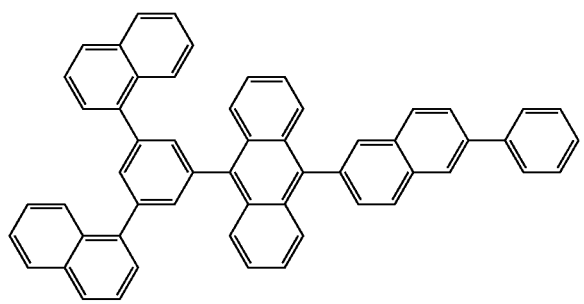
(5-40)
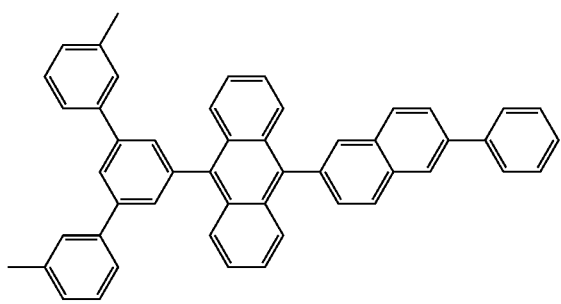

-continued
(5-41)
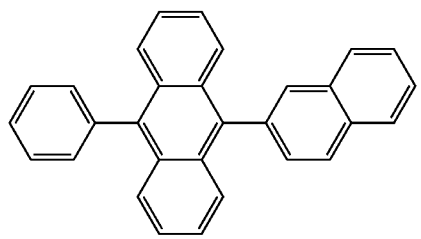
(5-42)
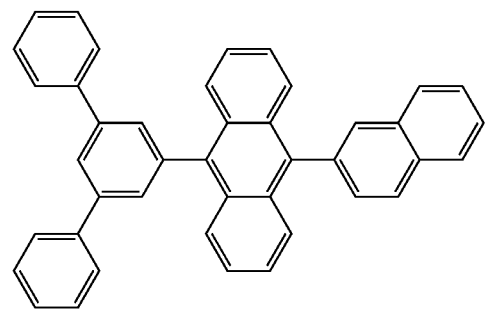
(5-43)
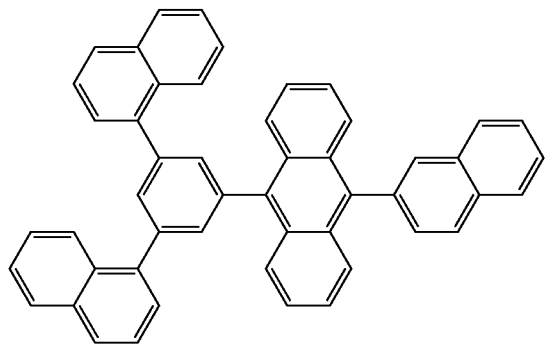
(5-44)
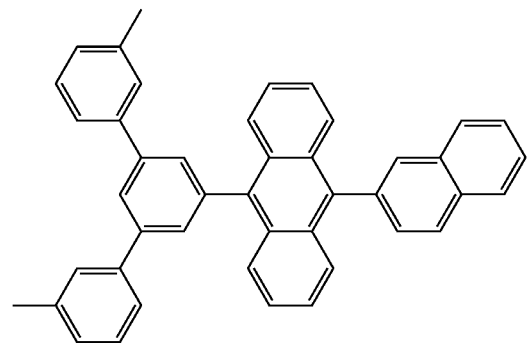
(5-45)
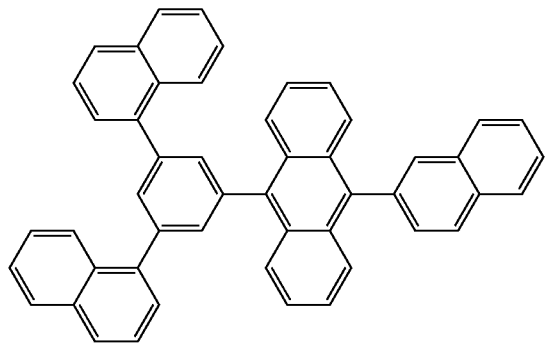
(5-46)
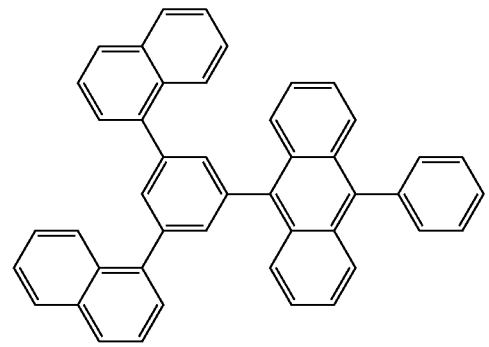
(5-47)
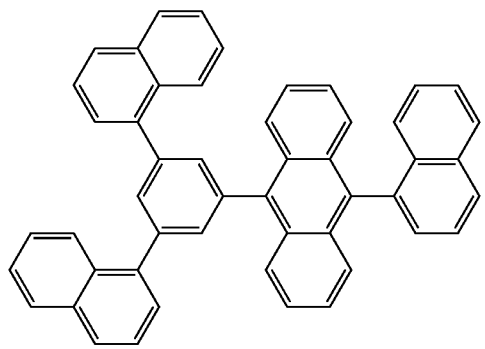
(5-48)
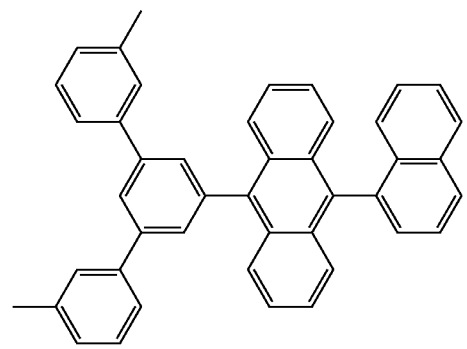

-continued (5-49)
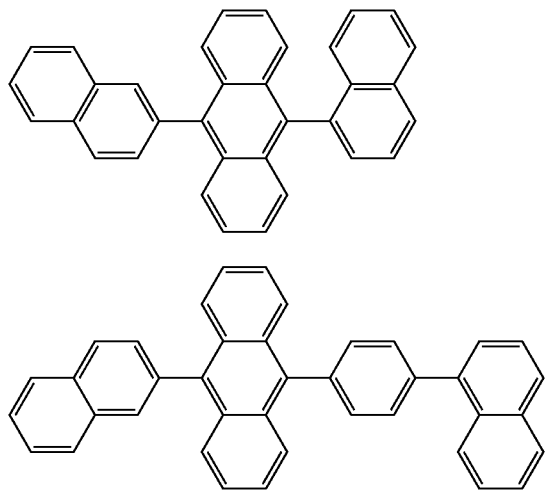

(5-50)
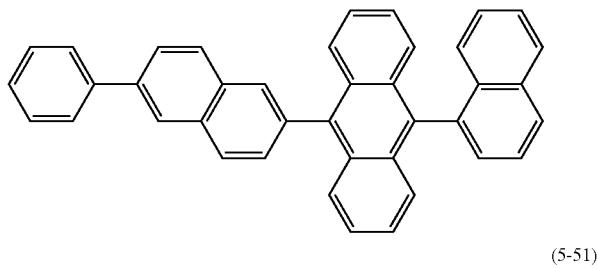

(5-51)

On the other hand, as a luminescent guest material forming the blue light-emitting layer 16CB, for example, an organic light-emitting material such as a low-molecular fluorescent material, a phosphorescent dye or a metal complex is used.

A blue luminescent guest material herein indicates a compound having a peak in a light emission wavelength range of approximately 400 nm to 490 nm. As such a compound, an organic material such as a naphthalene derivative, an anthracene derivative, a naphthacene derivative, a styrylamine derivative or a bis(azinyl)methene boron complex is used. In particular, as the compound, it is preferable to select one from the group consisting of an aminonaphthalene derivative, an aminoanthracene derivative, an aminochrysene derivative, an aminopyrene derivative, a styrylamine derivative and a bis(azinyl)methene boron complex.

The electron transport layer 16D is provided to enhance electron transport efficiency to the red light-emitting layers 16CR, the green light-emitting layers 16CG and the blue light-emitting layer 16CB, and is arranged on a whole surface of the blue light-emitting layer 16CB as a common layer. For example, the thickness of the electron transport layer 16D, depending on a whole element configuration, is preferably within a range of 5 nm to 300 nm both inclusive, and more preferably within a range of 10 nm to 170 nm both inclusive.

As the material of the electron transport layer 16D, an organic material with good electron transport properties is preferably used. When electron transport efficiency to light-emitting layers, in particular, the red light-emitting layers 16CR and the green light-emitting layers 16CG is enhanced, a change in emitted light colors in the red organic EL elements 10R and the green organic EL elements 10G due to electric field intensity which will be described later is reduced. As such an organic material, a nitrogen-containing heterocyclic derivative with an electron mobility of $10^{-6}$ cm²/Vs to $1.0 \times 10^{-1}$ cm²/Vs both inclusive is allowed to be used.

More specifically, as the material of the electron transport layer 16D, a benzimidazole derivative represented by the following formula (6), a pyridylphenyl derivative represented by the following formula (7) and a bipyridine derivative represented by the following formula (8) are used, but the material of the electron transport layer 16D is not limited thereto.

(6)
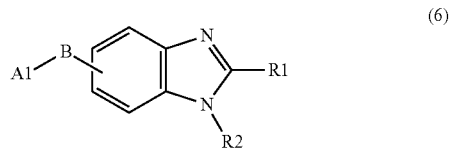

where A1 is a hydrogen atom or a halogen atom, an alkyl group with 1 to 20 carbon atoms, a hydrocarbon group with 6 to 60 carbon atoms including a polycyclic aromatic hydrocarbon group in which 3 to 40 aromatic rings are condensed, or a nitrogen-containing heterocyclic group or a derivative thereof, B is a single bond, a divalent aromatic ring group or a derivative thereof, R1 and R2 each are independently a hydrogen atom or a halogen atom, an alkyl group with 1 to 20 carbon atoms, an aromatic hydrocarbon group with 6 to 60 carbon atoms, a nitrogen-containing heterocyclic group or an alkoxy group with 1 to 20 carbon atoms, or a derivative thereof (7)
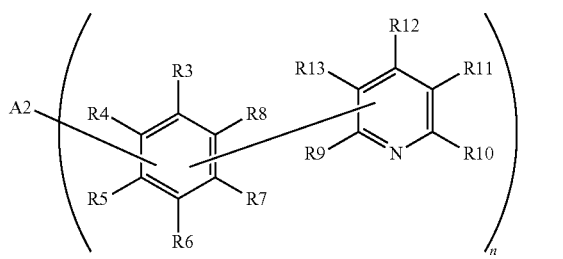

where A2 is an n-valent group in which 2 to 5 aromatic rings are condensed, more specifically, an n-valent acene-based aromatic ring group in which 3 aromatic rings are condensed or a derivative thereof, R3 to R8 each are independently a hydrogen atom or a halogen atom, or an isolated atomic valence bonded to any one of A2 and R9 to R13, R9 to R13 each are independently a hydrogen atom, a halogen atom or an isolated atomic valence bonded to any one of R3 to R8, n is an integer of 2 or more, and a number n of pyridylphenyl groups may be the same as or different from one another.

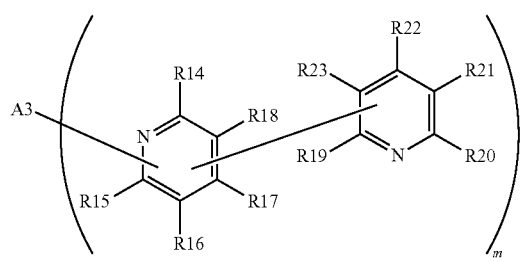

(8)

where A3 is an m-valent group in which 2 to 5 aromatic rings are condensed, more specifically, an m-valent acene-based aromatic ring group in which 3 aromatic rings are condensed, or a derivative thereof, R14 to R18 each are independently an hydrogen atom or a halogen atom, or an isolated atomic valence bonded to any one of A3 and R19 to R23, R19 to R23 each are independently a hydrogen atom, a halogen atom or an isolated atomic valence bonded to any one of R14 to R18, m is an integer of 2 or more and a number m of bipyridyl groups may be the same as or different from one another.

Specific examples of the compound represented by the formula (6) include compounds represented by the following formulas (6-1) to (6-43). It is to be noted that Ar(α) corresponds to a benzimidazole skeleton including R1 and R2 in the formula (6) and B corresponds to B in the formula (6). Ar(1) and Ar(2) correspond to A1 in the formula (6), and are bonded to B in order of Ar(1) and Ar(2).

| | Ar (α) | B | Ar (1) | Ar (2) |
|---|---|---|---|---|
| (6-1) | | | | |
| (6-2) | | | | |
| (6-3) | | | | |
| (6-4) | | | | |

|     | Ar (α) | B | Ar (1) | Ar (2) |
| --- | --- | --- | --- | --- |
| (6-5) | | | | |
| (6-6) | | | | |
| (6-7) | | | | |
| (6-8) | | | | |
| (6-9) | | | | |
| (6-10) | | | | |

-continued

| | Ar (α) | B | Ar (1) | Ar (2) |
|---|---|---|---|---|
| (6-11) | | | | |
| (6-12) | | | | |
| (6-13) | | | | |
| (6-14) | | | | |
| (6-15) | | | | |
| (6-16) | | | | |
| (6-17) | | | | |

-continued

| | Ar (α) | B | Ar (1) | Ar (2) |
|---|---|---|---|---|
| (6-18) | | | | |
| (6-19) | | | | |
| (6-20) | | | | |
| (6-21) | | | | |
| (6-22) | | | | |
| (6-23) | | | | |

|  | Ar (α) | B | Ar (1) | Ar (2) |
|---|---|---|---|---|
| (6-24) | 6-methyl-1-phenyl-2-methyl-benzimidazole | | 9,10-anthracenyl | 2-naphthyl |
| (6-25) | 5-methyl-1-methyl-2-phenyl-benzimidazole | | 9,10-anthracenyl | 2-naphthyl |
| (6-26) | 5-methyl-1-methyl-2-phenyl-benzimidazole | | 9,10-anthracenyl | 2-naphthyl |
| (6-27) | 6-methyl-1-phenyl-2-(2-pyridyl)-benzimidazole | | 9,10-anthracenyl | 2-naphthyl |
| (6-28) | 5-methyl-1-phenyl-2-(2-pyridyl)-benzimidazole | | 9,10-anthracenyl | 2-naphthyl |
| (6-29) | 6-methyl-1-phenyl-2-(3-pyridyl)-benzimidazole | | 9,10-anthracenyl | 2-naphthyl |

-continued

| | Ar (α) | B | Ar (1) | Ar (2) |
|---|---|---|---|---|
| (6-30) | | | | |
| (6-31) | | | | |
| (6-32) | | | | |
| (6-33) | | | | |
| (6-34) | | | | |
| (6-35) | | | | |
| (6-36) | | | | |

| | Ar (α) | B | Ar (1) | Ar (2) |
|---|---|---|---|---|
| (6-37) | 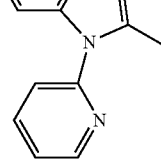 | | 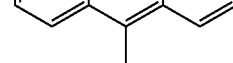 |  |
| (6-38) | 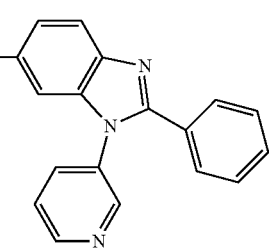 | | 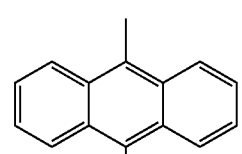 |  |
| (6-39) | 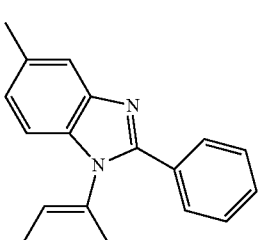 | | 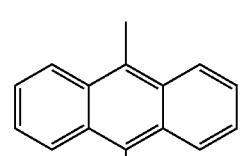 | 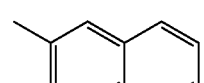 |
| (6-40) | 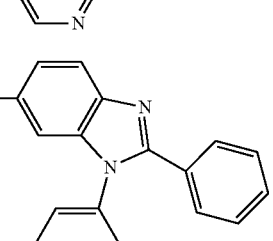 | | 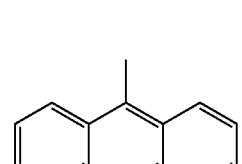 |  |
| (6-41) | 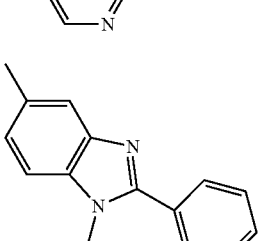 | | 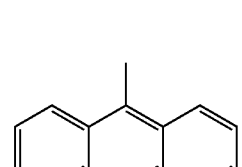 |  |
| (6-42) | 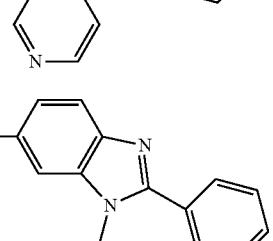 | | 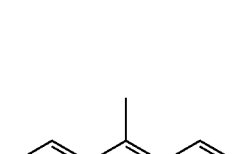 |  |

| Ar (α) | B | Ar (1) | Ar (2) |
|---|---|---|---|
| (6-43) 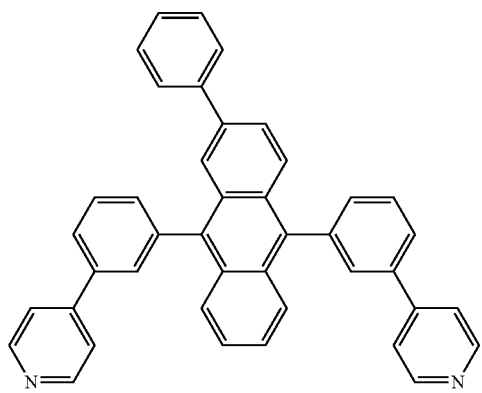 | | 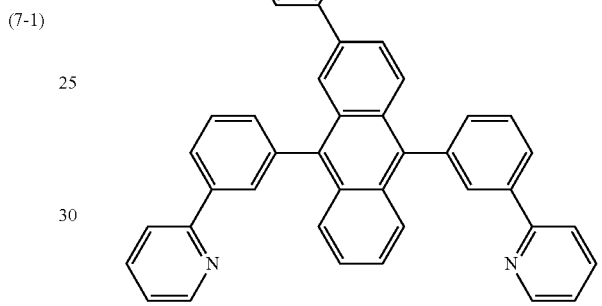 | |
Specific examples of the compound represented by the formula (7) include compounds represented by the following formulas (7-1) to (7-81).
(7-1)
(7-2)
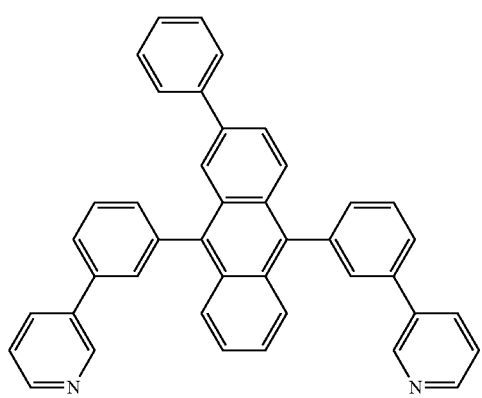
-continued
(7-3)
(7-4)
(7-5)
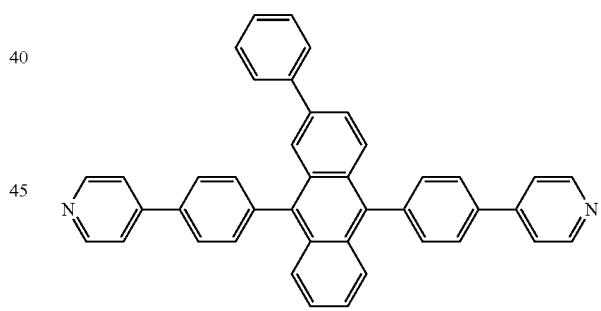
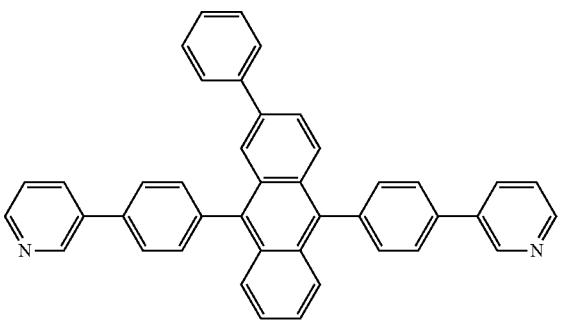

(7-6)
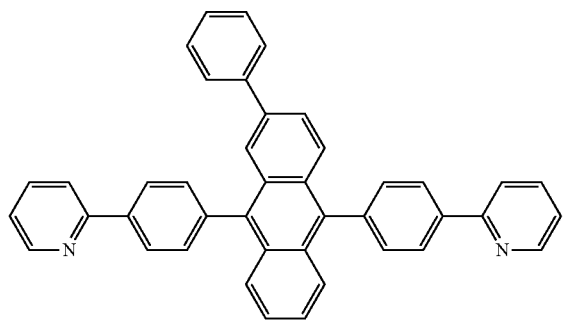
(7-7)
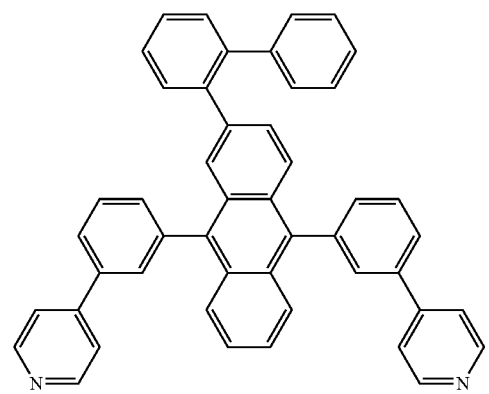
(7-8)
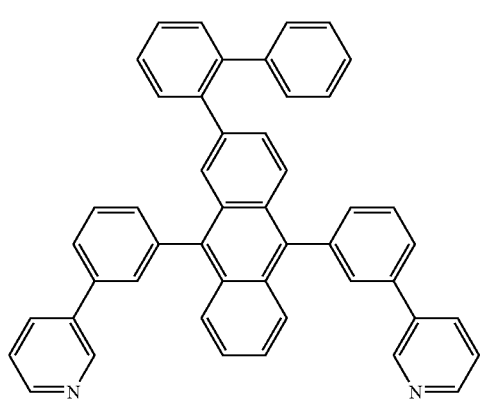
(7-9)
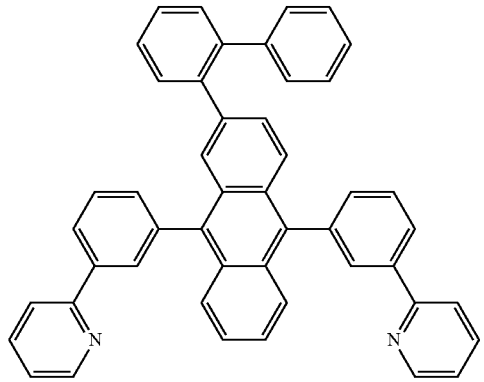
(7-10)
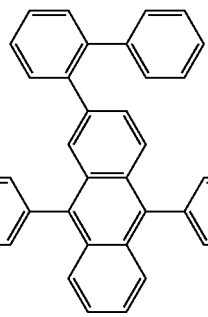
(7-11)
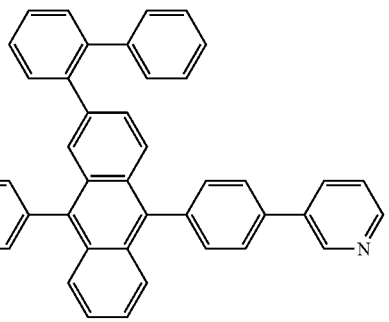
(7-12)
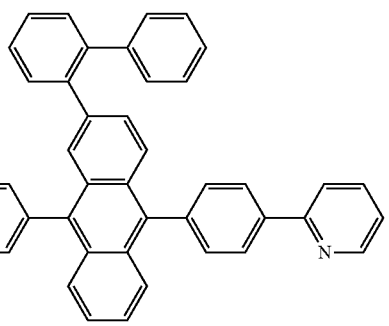
(7-13)
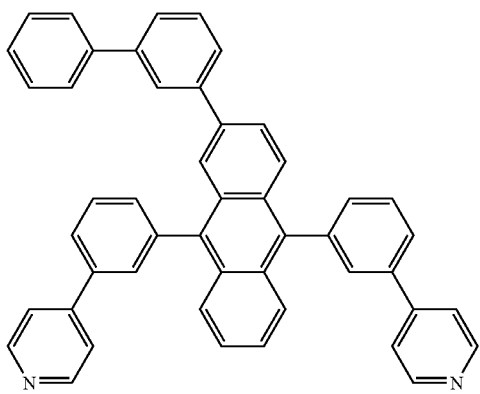

(7-14)
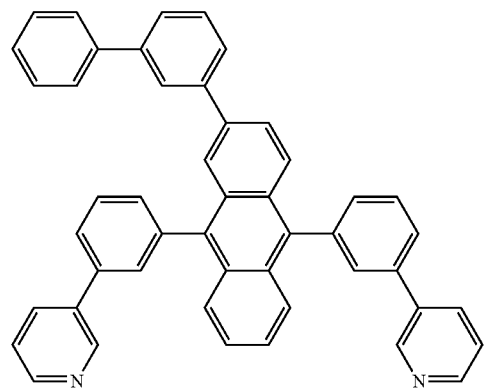
(7-15)
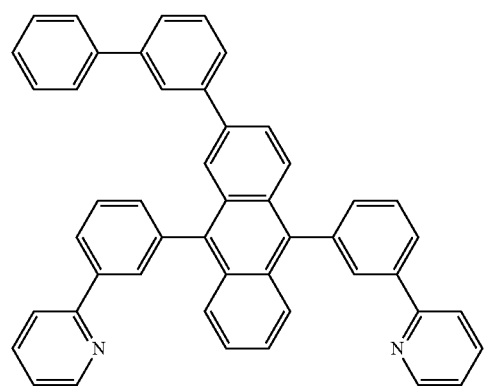
(7-16)
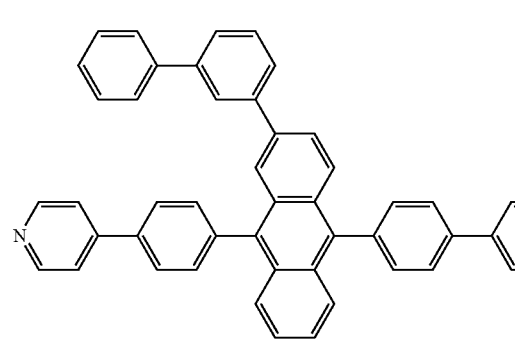
(7-17)
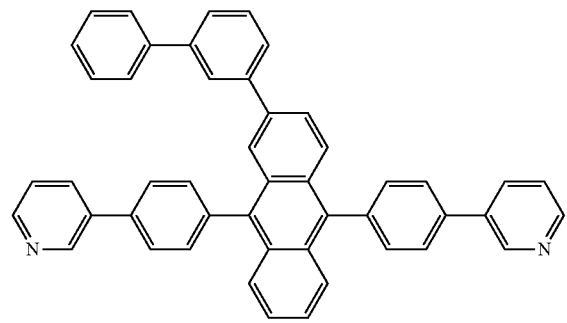
(7-18)
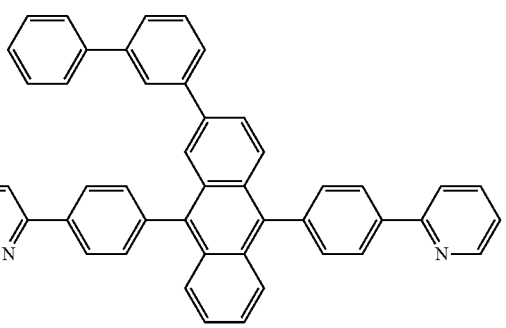
(7-19)
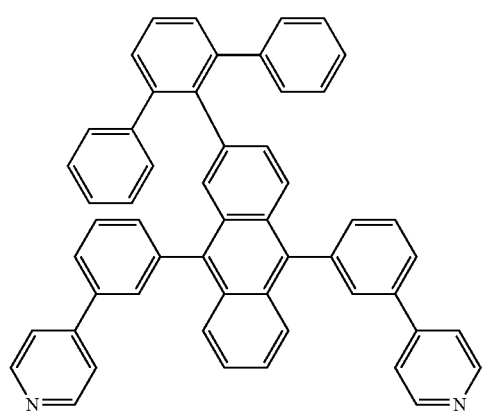
(7-20)
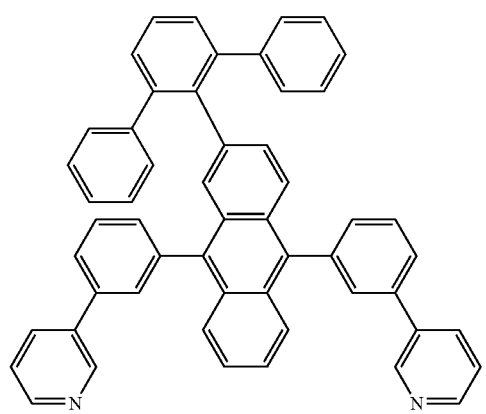
(7-21)
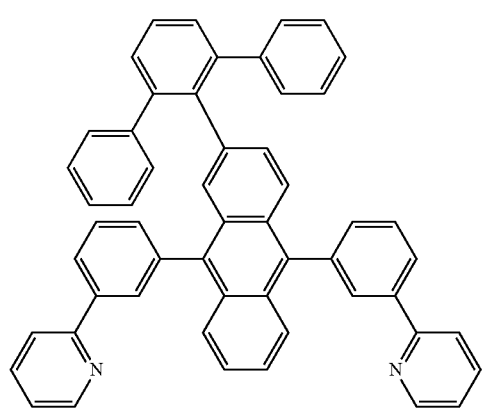

(7-22)
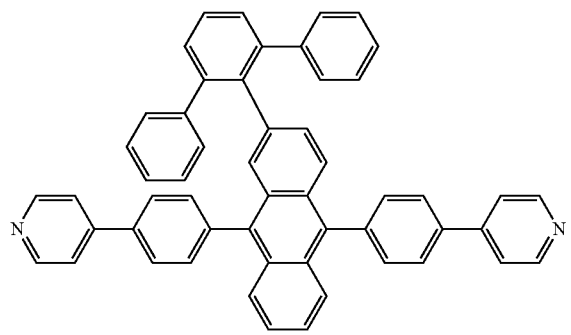
(7-23)
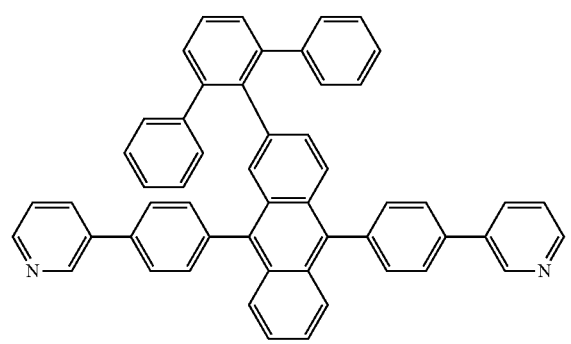
(7-24)
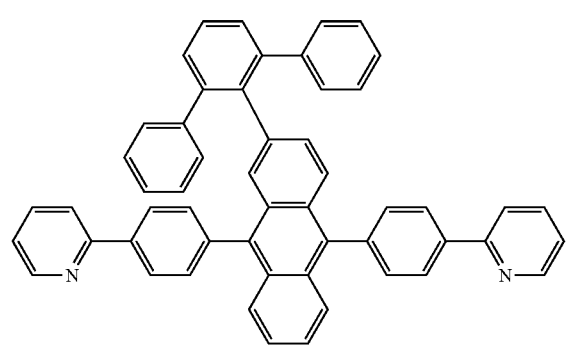
(7-25)
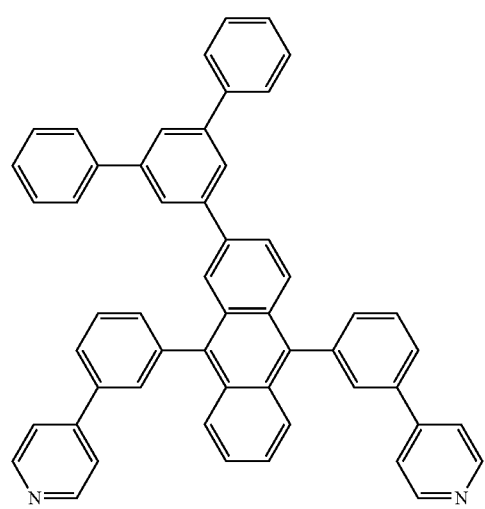
(7-26)
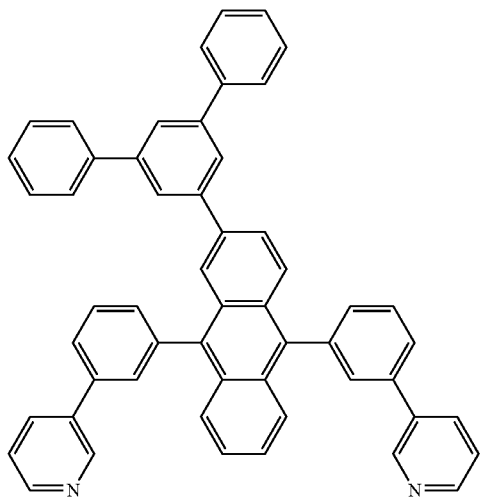
(7-27)
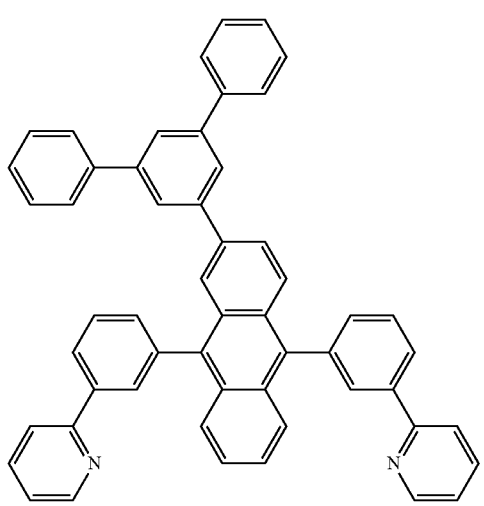
(7-28)
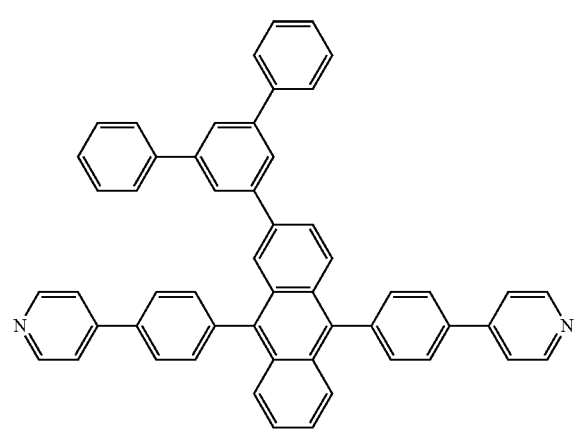

(7-29)
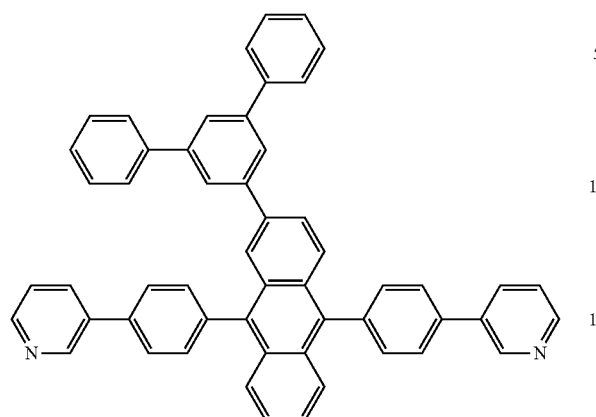
(7-30)
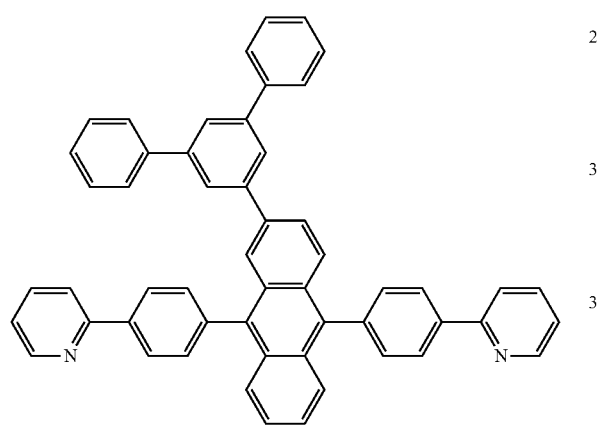
(7-31)
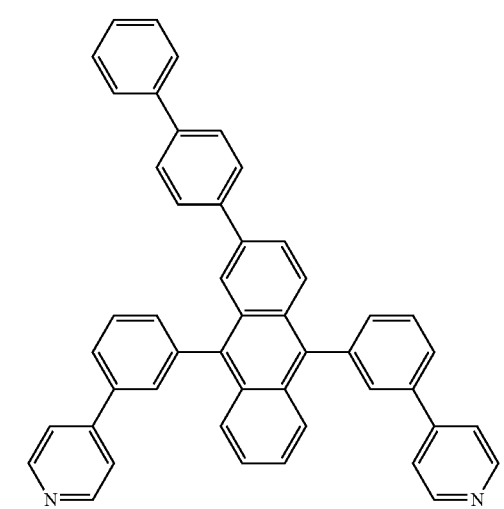
(7-32)
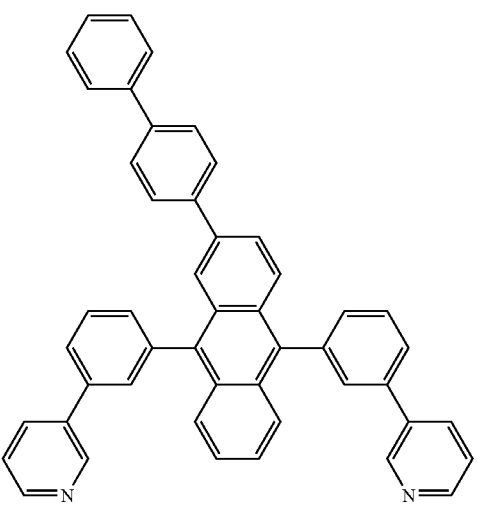
(7-33)
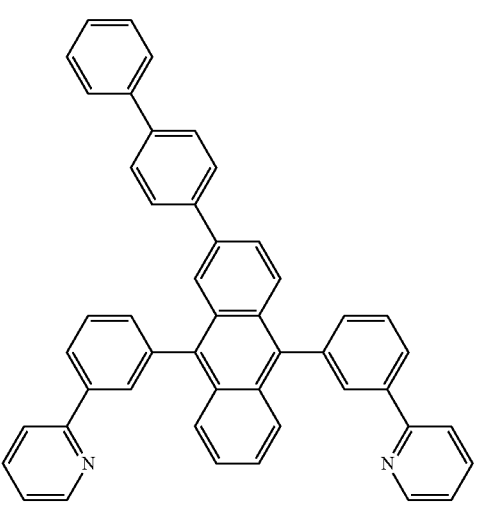
(7-34)
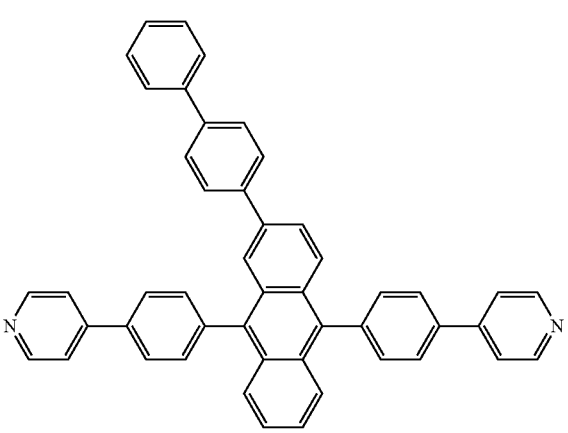

(7-35)
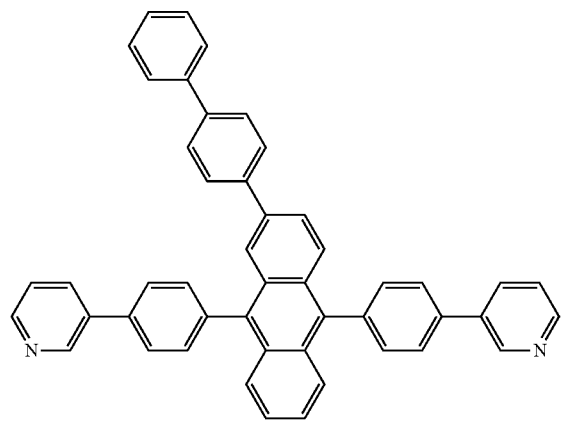
(7-36)
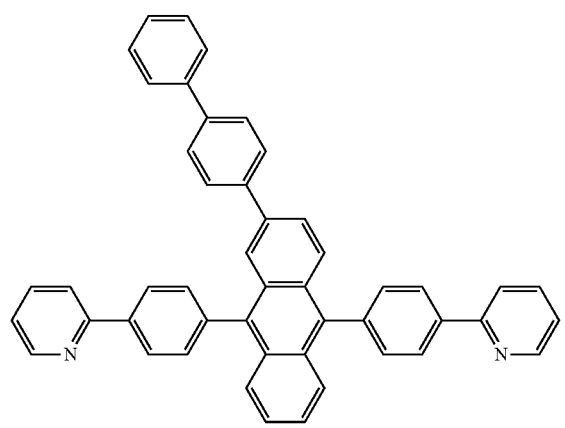
(7-37)
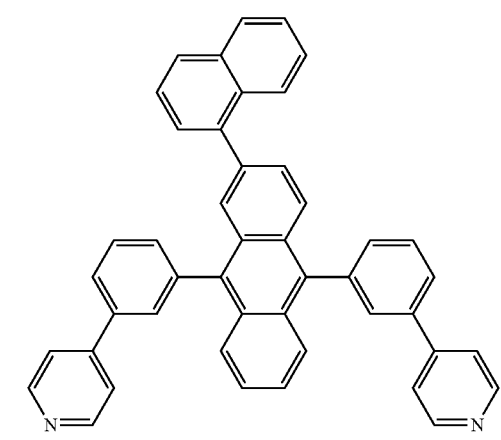
(7-38)
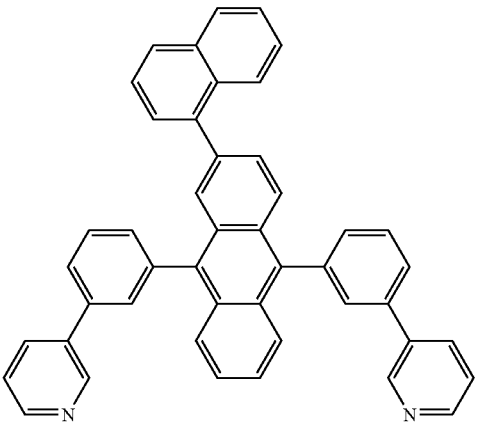
(7-39)
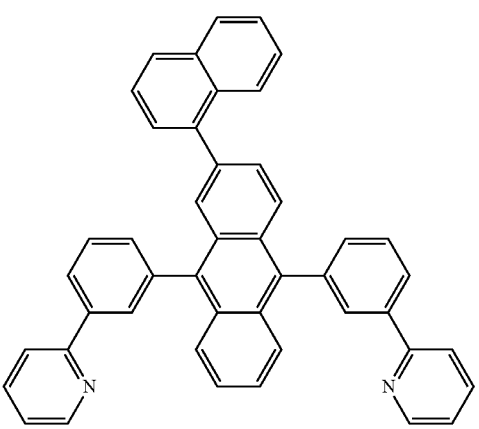
(7-40)
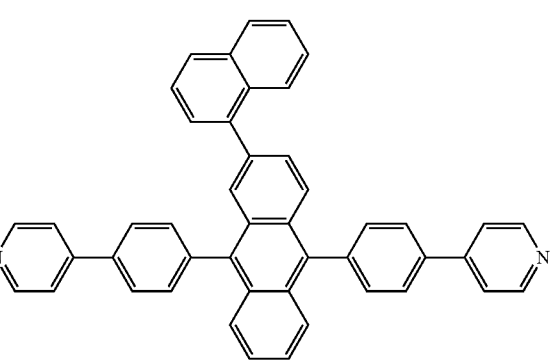
(7-41)
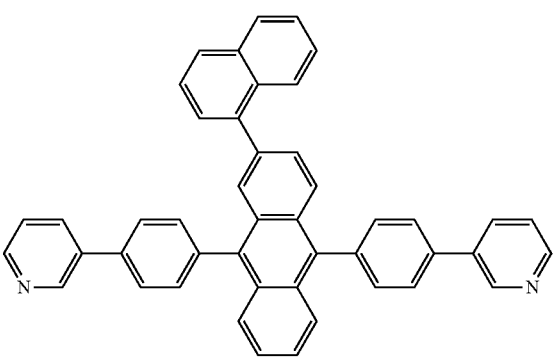

(7-42)
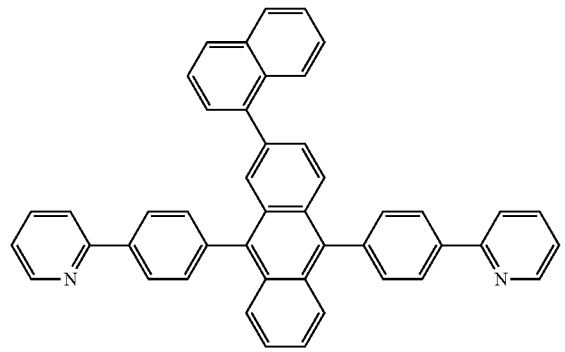
(7-43)
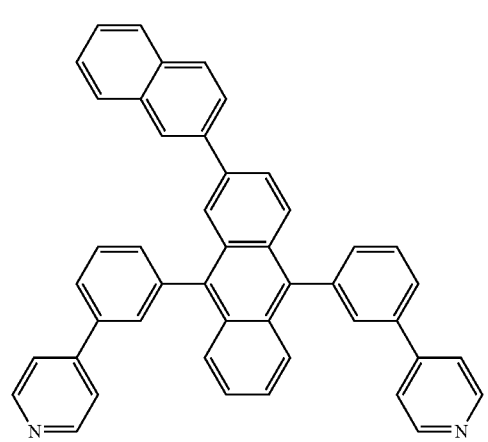
(7-44)
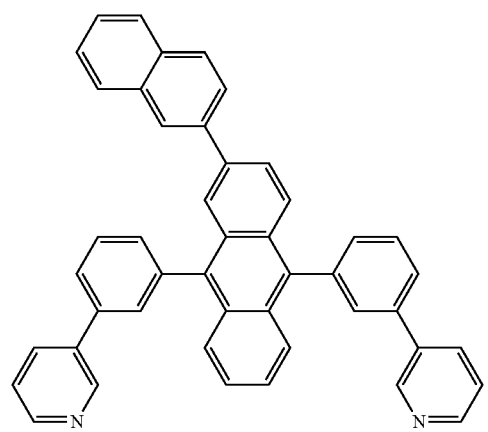
(7-45)
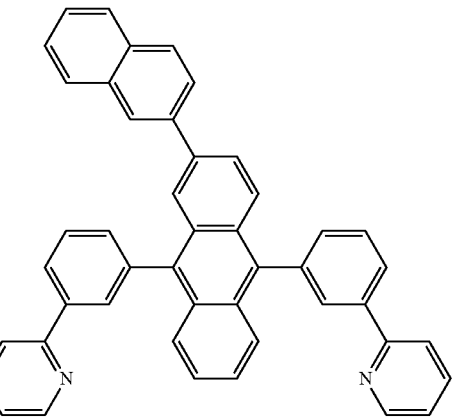
(7-46)
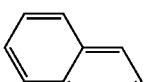
(7-47)
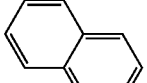
(7-48)
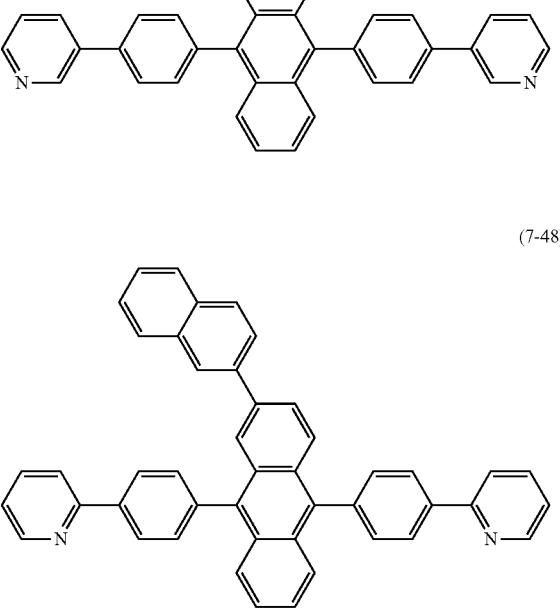

(7-49)
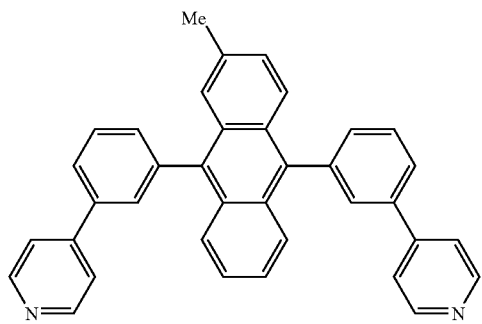
(7-50)
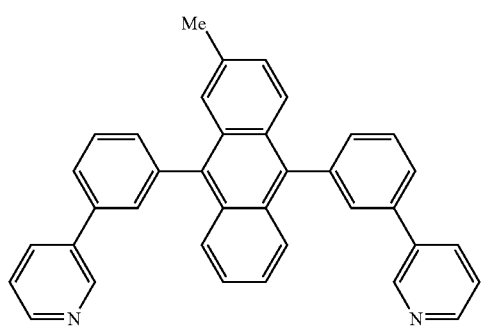
(7-51)
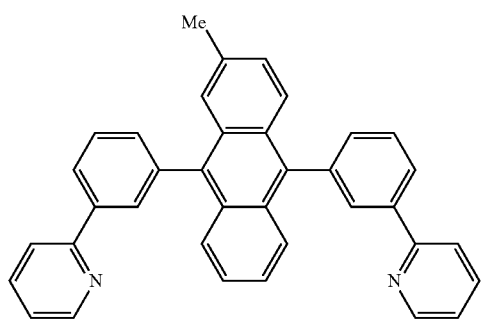
(7-52)
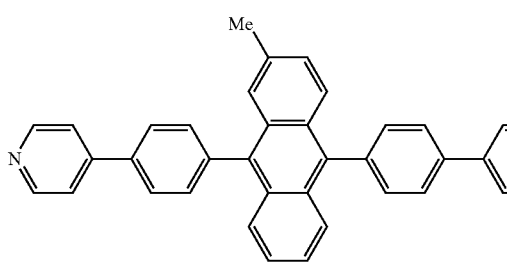
(7-53)
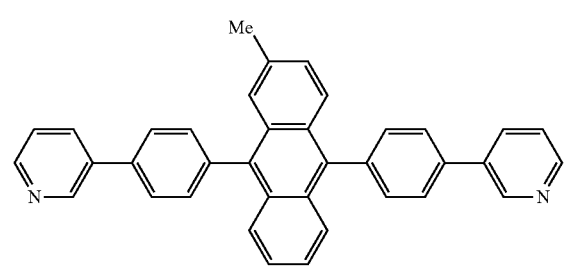
(7-54)
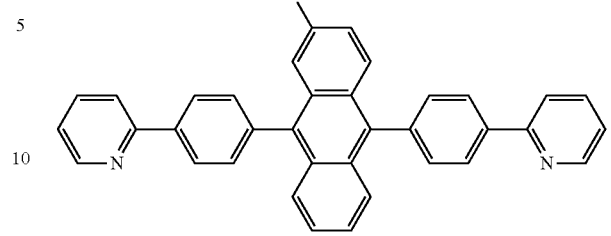
(7-55)
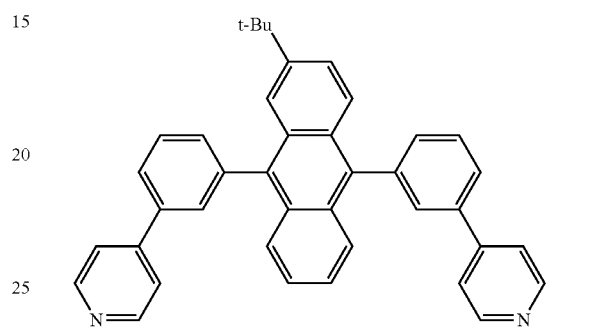
(7-56)
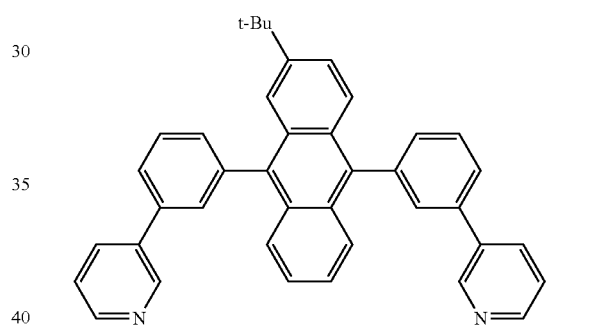
(7-57)
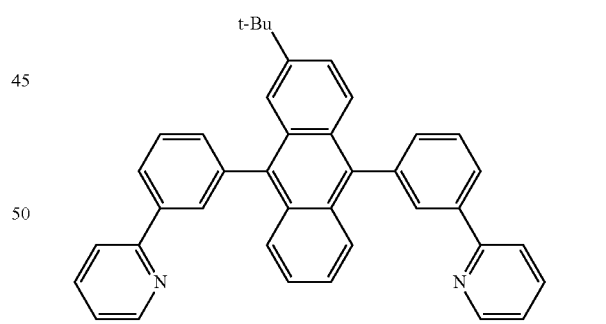
(7-58)
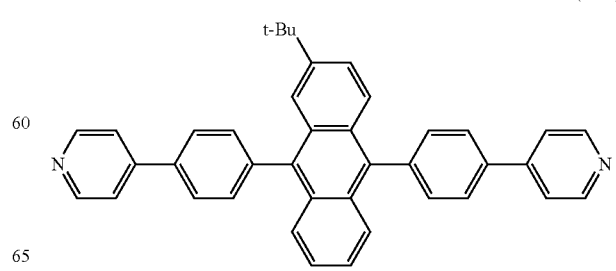

(7-59)
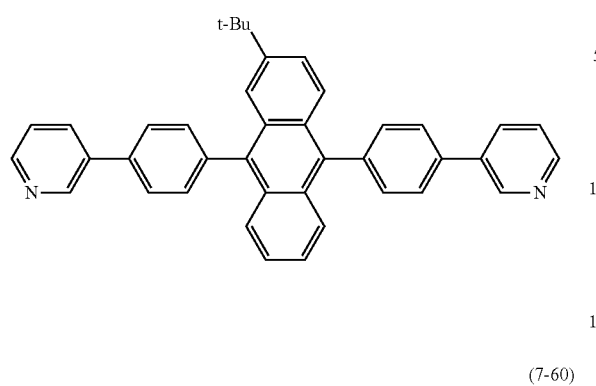
(7-63)
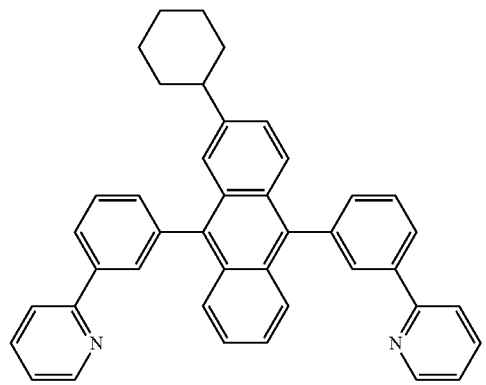
(7-60)
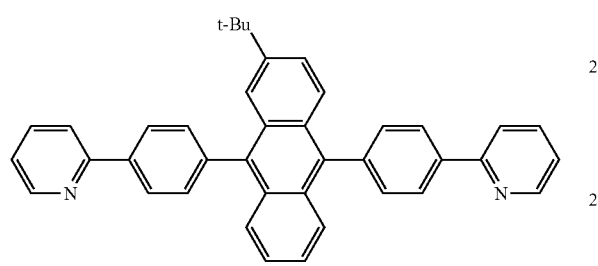
(7-64)
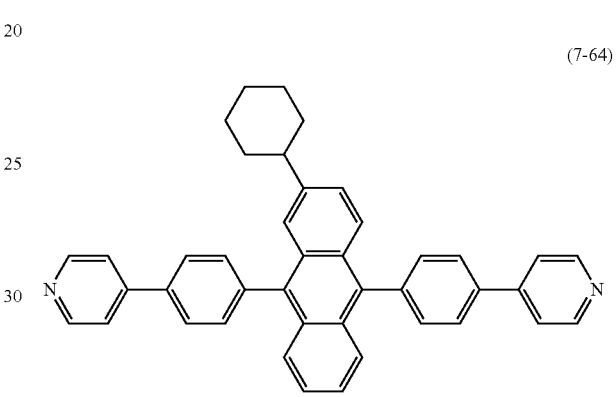
(7-61)
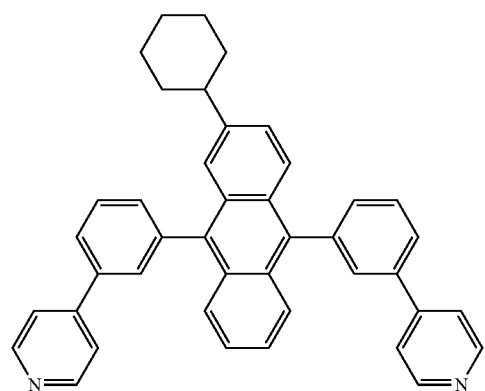
(7-65)
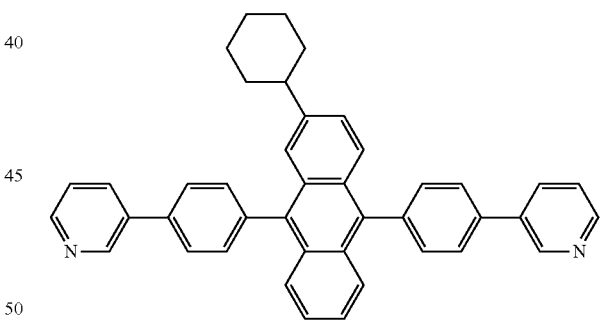
(7-62)
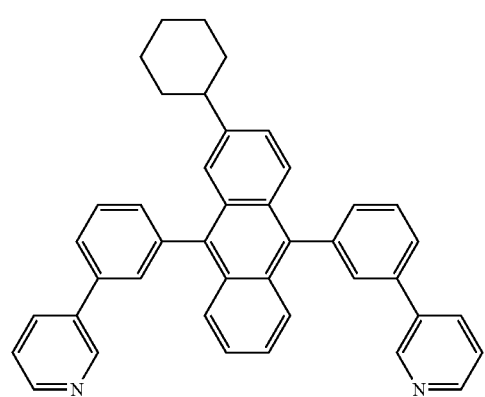
(7-66)
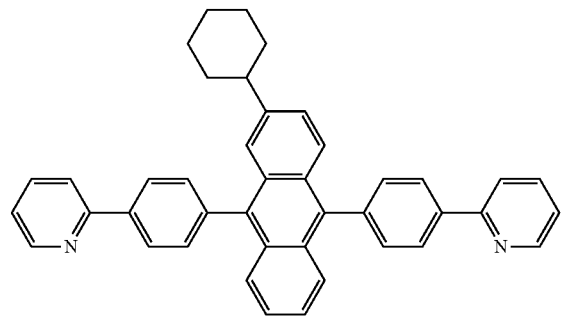

(7-67)
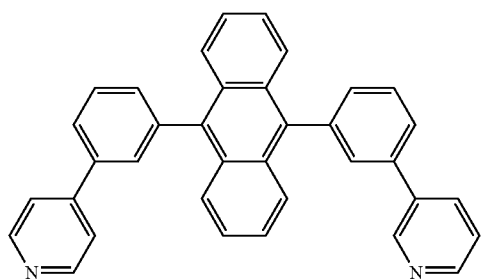
(7-68)
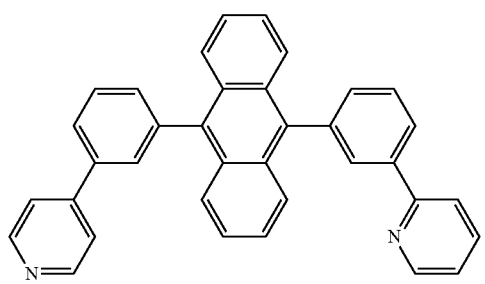
(7-69)
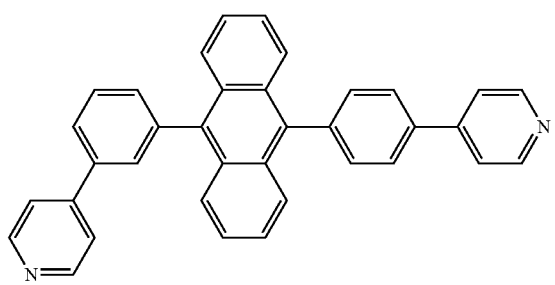
(7-70)
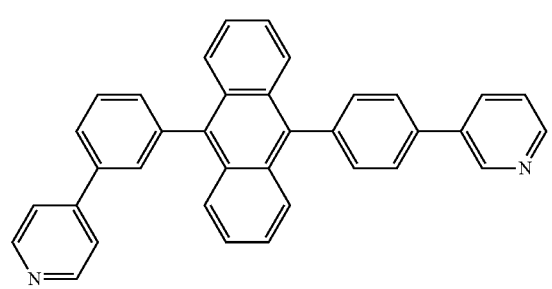
(7-71)
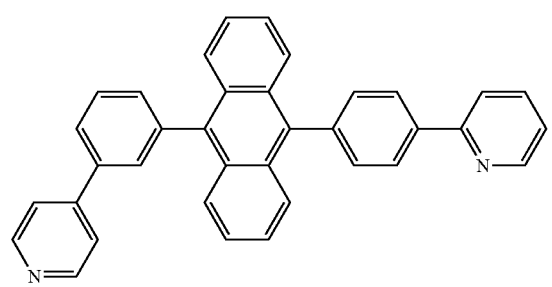
(7-72)
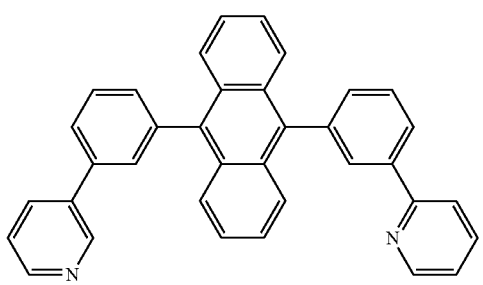
(7-73)
(7-74)
(7-75)
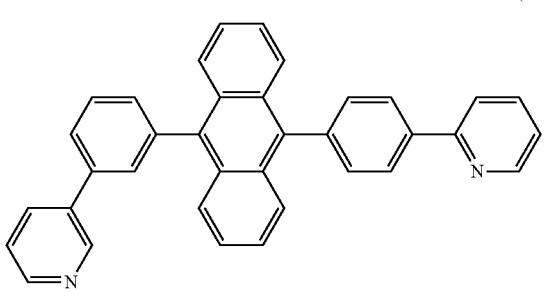
(7-76)
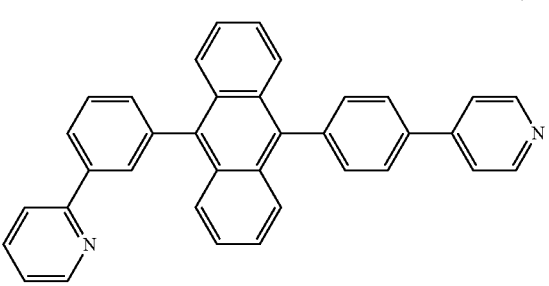

(7-77)
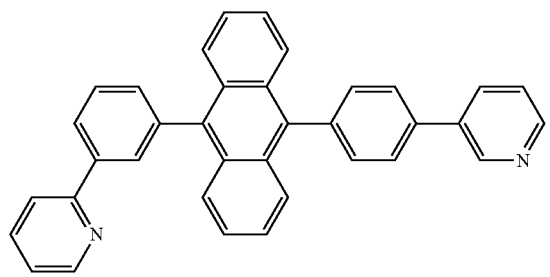
(7-78)
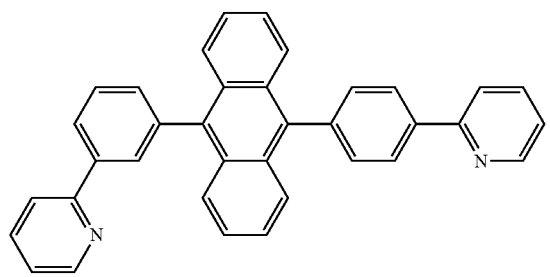
(7-79)
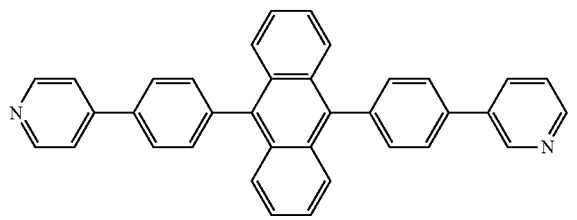
(7-80)
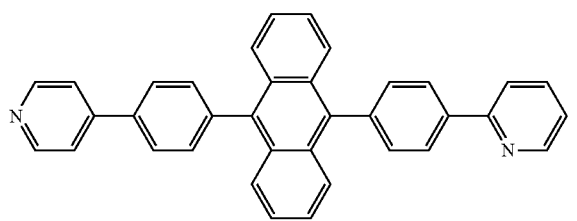
(7-81)
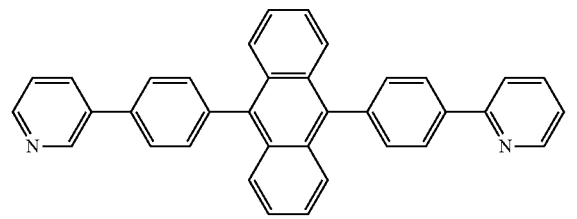
Specific examples of the compound represented by the formula (8) include compounds represented by the following formulas (8-1) to (8-17).
(8-1)
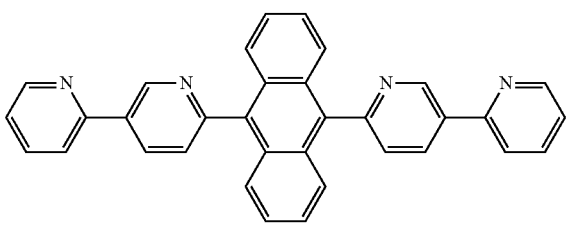
(8-2)
(8-3)
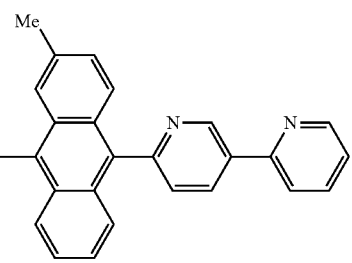
(8-4)
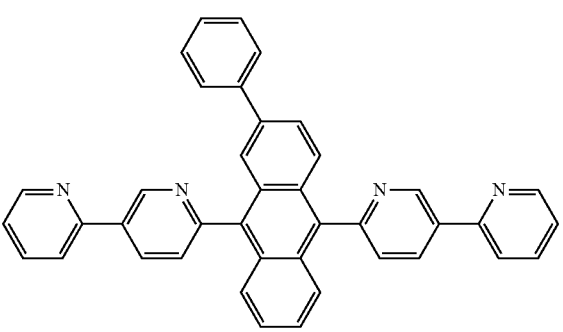
(8-5)
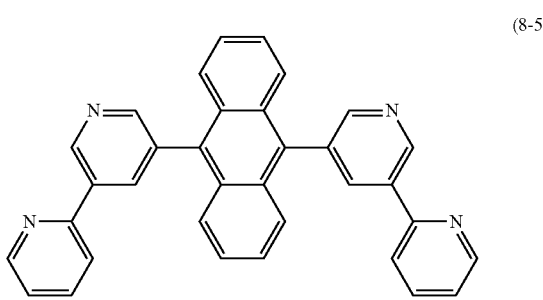

(8-6) 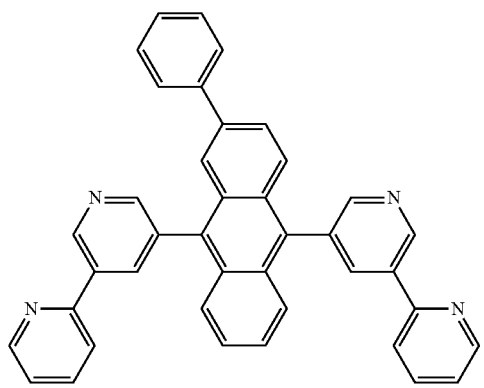
(8-7) 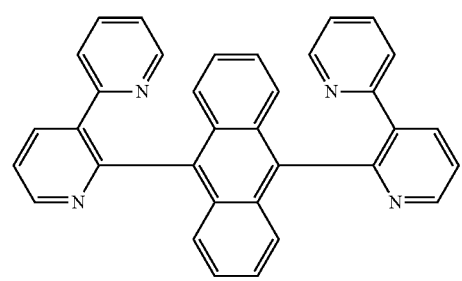
(8-8) 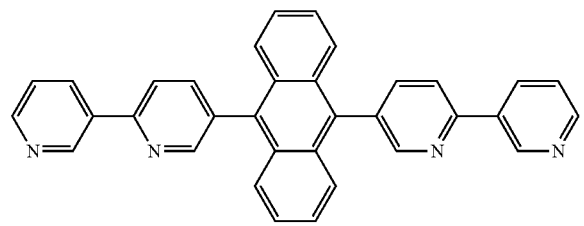
(8-9) 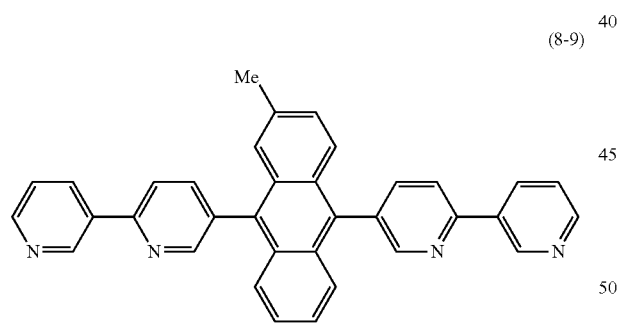
(8-10) 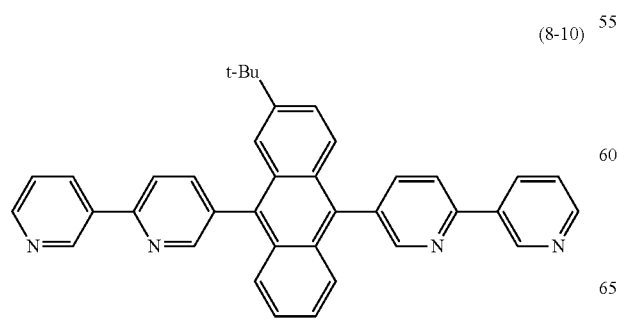
(8-11) 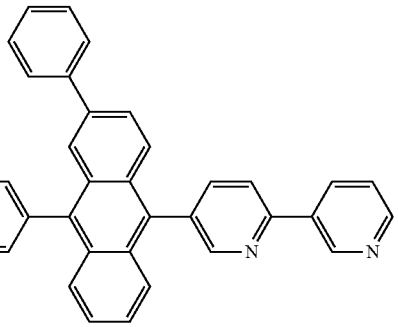
(8-12) 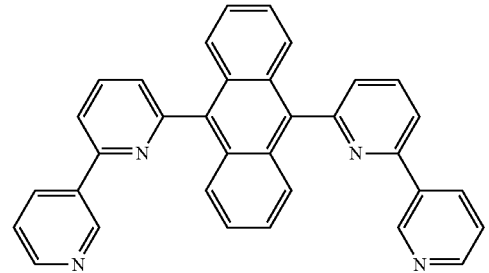
(8-13) 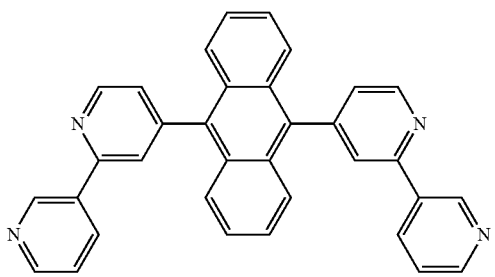
(8-14) 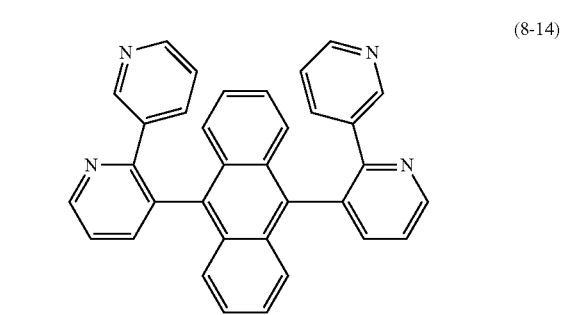
(8-15) 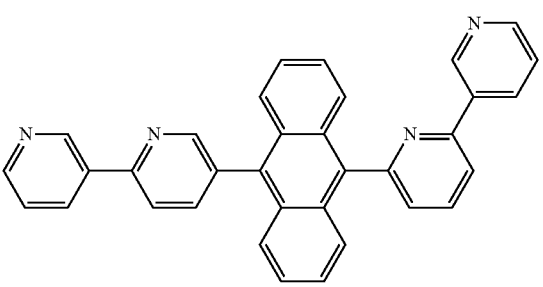

-continued (8-16)

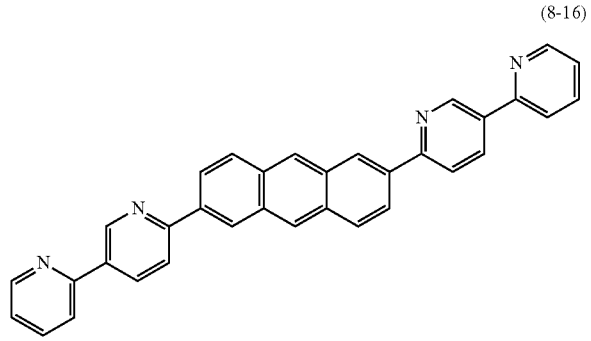

(8-17)

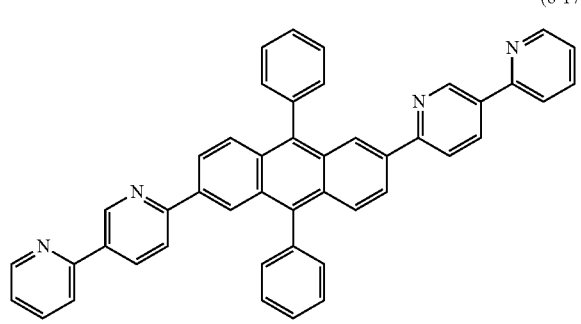

It is to be noted that the organic material used for the electron transport layer 16D is preferably, but not exclusively, a compound having an anthracene skeleton such as the above-described compounds. For example, instead of the anthracene skeleton, a benzimidazole derivative, a pyridyl-phenyl derivative or a bipyridyl derivative including a pyrene skeleton or a chrysene skeleton may be used. Moreover, as the organic material used for the electron transport layer 16D, not only one kind of organic material, but also a mixture or a laminate of a plurality of kinds of organic materials may be used. Further, the above-described compound may be used for the electron injection layer 16E which will be described later.

The electron injection layer 16E is provided to enhance electron injection efficiency, and is arranged on a whole surface of the electron transport layer 16D as a common layer. As the material of the electron injection layer 16E, lithium oxide ($Li_2O$) which is an oxide of lithium (Li), cesium carbonate ($Cs_2CO_3$) which is a complex oxide of cesium (Cs), or a mixture of the oxide and the complex oxide may be used. Moreover, the material of the electron injection layer 16E is not limited thereto, and, for example, an alkali-earth metal such as calcium (Ca) or barium (Ba), an alkali metal such as lithium or cesium, and further a metal with a small work function such as indium (In) or magnesium (Mg), or an oxide, a complex oxide or a fluoride of any of these metals may be used singly, or a mixture or an alloy thereof for improving stability may be used. Moreover, the organic materials represented by the formulas (6) to (8) as the material of the above-described electron transport layer 16D may be used.

The upper electrode 17 has, for example, a thickness of 2 nm to 15 nm both inclusive, and is configured of a metal conductive film. More specifically, an alloy of Al, Mg, Ca or Na is used. In particular, an alloy of magnesium and silver (a Mg—Ag alloy) is preferable, because the Mg—Ag alloy has both of electrical conductivity and small absorption in a thin film. The ratio between magnesium and silver in the Mg—Ag alloy is not specifically limited, but the ratio is preferably within a range of Mg:Ag=20:1 to 1:1 both inclusive in film thickness ratio. Moreover, the material of the upper electrode 17 may be an alloy of Al and Li (an Al—Li alloy).

Moreover, the upper electrode 17 may be configured of a mixture layer including an organic light-emitting material such as an aluminum quinoline complex, a styrylamine derivative or a phthalocyanine derivative. In this case, the upper electrode 17 may further include a layer with light transmittance such as MgAg as a third layer. It is to be noted that in the case of an active matrix drive system, the upper electrode 17 is formed on the whole substrate 11 to be insulated from the lower electrodes 14 by the organic layer 16 and the barrier rib 15, and is used as a common electrode for the red organic EL elements 10R, the green organic EL elements 10G and the blue organic EL elements 10B.

The protective layer 30 has, for example, a thickness of 2 to 3 μm both inclusive, and may be made of an insulating material or a conductive material. As the insulating material, an inorganic amorphous insulating material, for example, amorphous silicon (α-Si), amorphous silicon carbide (α-SiC), amorphous silicon nitride (α-$Si_{1-x}N_x$) or amorphous carbon (α-C) is preferable. Such an inorganic amorphous insulating material does not form grains, so the inorganic amorphous insulating material forms a good protective film with low water permeability.

The sealing substrate 40 is arranged on a side close to the upper electrode 17 of the red organic EL elements 10R, the green organic EL elements 10G and the blue organic EL elements 10B, and is provided to seal the red organic EL elements 10R, the green organic EL elements 10G and the blue organic El elements 10B with an adhesive layer (not illustrated). The sealing substrate 40 is made of a transparent material to light emitted from the red organic EL elements 10R, the green organic EL elements 10G and the blue organic EL elements 10B such as glass. In the sealing substrate 40, for example, a color filter and a light-shielding film as a black matrix (both not illustrated) are arranged to extract light emitted from the red organic EL elements 10R, the green organic EL elements 10G and the blue organic EL elements 10B and absorb outside light reflected from the red organic EL elements 10R, the green organic EL elements 10G and the blue organic EL elements 10B and wiring therebetween, thereby improving contrast.

The color filter includes red filters, green filters and blue filters (all not illustrated) which are arranged in order to correspond to the red organic EL elements 10R, the green organic EL elements 10G and the blue organic EL elements 10B, respectively. The red filters, the green filters and the blue filters have, for example, a rectangular shape, and are formed without space. The red filters, the green filters and the blue filters are made of a resin mixed with a pigment of a corresponding color, and are adjusted by selecting the pigment to have high light transmittance in a target red, green or blue wavelength range and low light transmittance in other wavelength ranges.

Moreover, the wavelength range with high transmittance in the color filter and a peak wavelength λ of a spectrum of light to be extracted from a resonator configuration MC1 are equal to each other. Therefore, only light of a wavelength equal to the peak wavelength λ of the spectrum of light to be extracted in outside light entering from the sealing substrate 40 passes through the color filter, and outside light of other wavelengths is prevented from entering into the red, green and blue organic EL elements 10R, 10G and 10B.

The light-shielding film is configured of, for example, a black resin film mixed with a black colorant with an optical density of 1 or over, or a thin-film filter utilizing interference of a thin film. In particular, the light-shielding film is preferably configured of the black resin film, because the light-shielding film is easily formed at low cost. The thin-film filter is formed, for example, by laminating one or more thin films made of a metal, a metal nitride or a metal oxide, and utilizes interference of the thin film to attenuate light. More specifically, as the thin-film filter, a thin-film filter formed by alternately laminating chromium and chromium (III) oxide ($Cr_2O_3$) is used.

The organic EL display is allowed to be manufactured by, for example, the following steps.

Figure 4:
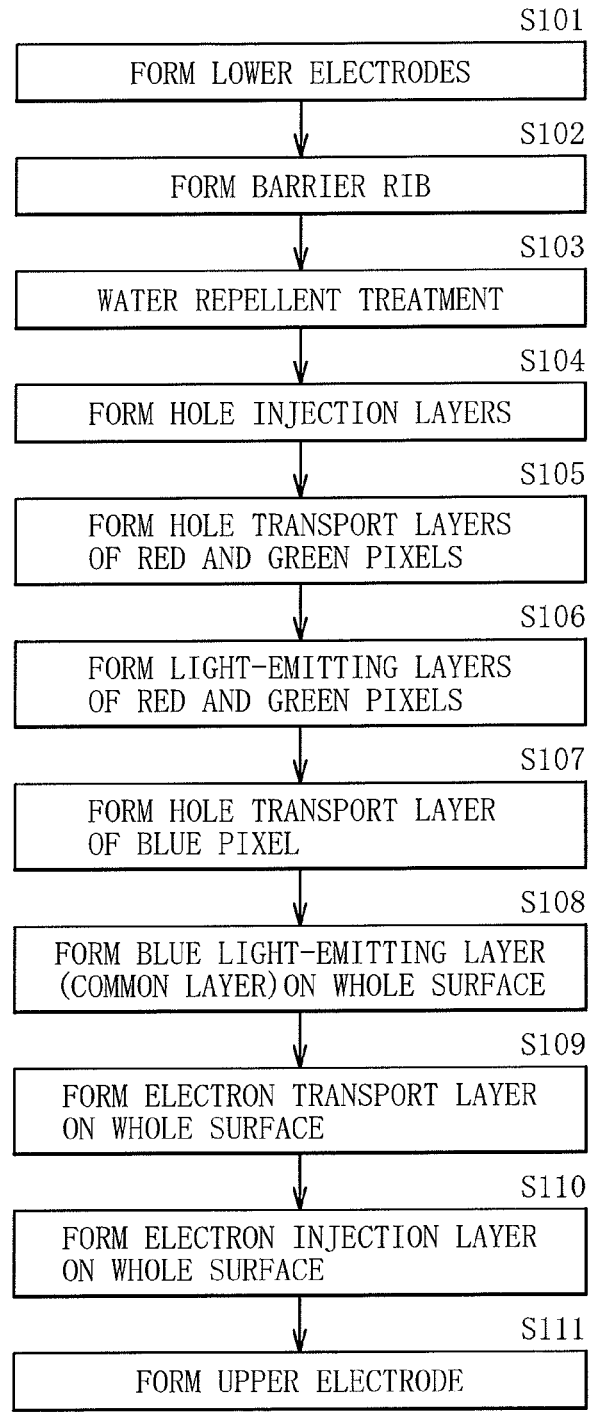
FIG. 4 is a flow chart illustrating a method of manufacturing the organic EL display illustrated in FIG. 1.

FIG. 4 illustrates a flow of a method of manufacturing the organic EL display, and FIGS. 5A to 5C to FIGS. 7A to 7C illustrate the manufacturing method illustrated in FIG. 4 in order of steps. First, the pixel drive circuit 140 including the driving transistor Tr1 is formed on the substrate 11 made of the above-described material, and, for example, an planarization insulating film (not illustrated) made of a photosensitive resin is arranged.
(Step of Forming Lower Electrodes 14)

Figure 5A:
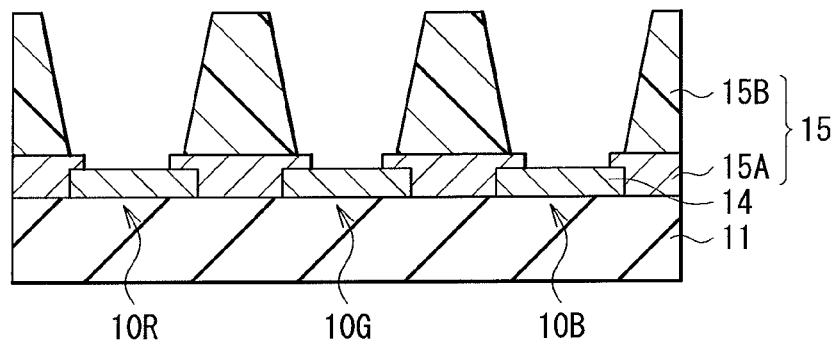
FIGS. 5A to 5C are sectional views illustrating the manufacturing method illustrated in FIG. 4 in order of steps.

Next, for example, a transparent conductive film made of ITO is formed on a whole surface of the substrate 11, and the transparent conductive film is patterned to form the lower electrodes 14 for the red organic EL elements 10R, the green organic EL elements 10G and the blue organic EL elements 10B, respectively, as illustrated in FIG. 5A (step S101). At this time, the lower electrodes 14 each are electrically connected to a drain electrode of the driving transistor Tr1 through a contact hole (not illustrated) of the planarization insulating film (not illustrated).
(Step of Forming Barrier Rib 15)

Next, also as illustrated in FIG. 5A, a film made of an inorganic insulating material such as $SiO_2$ is formed on the lower electrodes 14 and the planarization insulating film (not illustrated) by, for example, a CVD (Chemical Vapor Deposition) method, and is patterned with use of a photolithography technique and an etching technique to form the lower barrier rib 15A.

After that, also as illustrated in FIG. 5A, the upper barrier rib 15B made of the above-described photosensitive resin is formed in a predetermined position of the lower barrier rib 15A, more specifically a position around a light emission region of each pixel. Therefore, the barrier rib 15 including the upper barrier rib 15A and the lower barrier rib 15B is formed (step S102).

After the barrier rib 15 is formed, a surface where the lower electrodes 14 and the barrier rib 15 are formed of the substrate 11 is subjected to oxygen plasma treatment to remove a contaminant such as an organic matter adhered to the surface, thereby improving wettability. More specifically, the substrate 11 is heated at a predetermined temperature, for example, approximately 70 to 80° C., and then is subjected to plasma treatment ($O_2$ plasma treatment) using oxygen as a reactive gas under atmospheric pressure.
(Step of Performing Water Repellent Treatment)

After the plasma treatment is performed, water repellent treatment (liquid repellent treatment) is performed (step S103) to reduce wettabilitiy of specifically a top surface and a side surface of the upper barrier rib 15B. More specifically, plasma treatment ($CF_4$ plasma treatment) using tetrafluoromethane as a reactive gas is performed under atmospheric pressure, and after that, the substrate 11 heated by the plasma treatment is cooled to a room temperature to make the top surface and the side surface of the upper barrier rib 15B liquid-repellent, thereby reducing wattability thereof.

In the $CF_4$ plasma treatment, a little influence is exerted on exposed surfaces of the lower electrodes 14 and the lower barrier rib 15A, but ITO which is the material of the lower electrodes 14, $SiO_2$ which is the material of the lower barrier rib 15A, and the like have poor affinity for fluorine, so the wettability of the surface with improved wettability by the oxygen plasma treatment is maintained as it is.
(Step of Forming Hole Injection Layers 16AR, 16AG and 16AB)

Figure 5B:
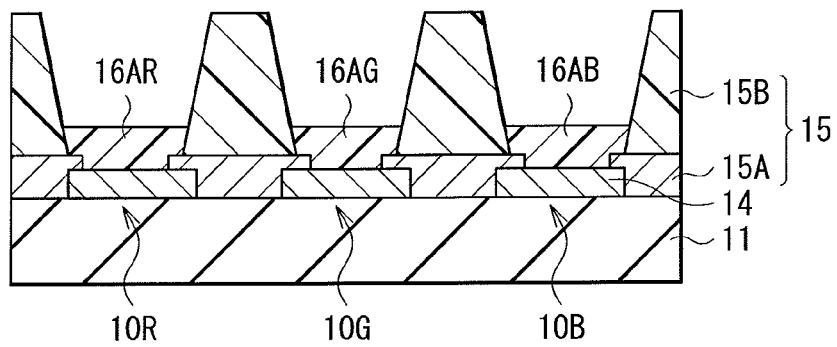

After the water repellent treatment is performed, as illustrated in FIG. 5B, the hole injection layers 16AR, 16AG and 16AB made of the above-described material are formed in regions surrounded by the upper barrier rib 15B (step S104). The hole injection layers 16AR, 16AG and 16AB are formed by a coating method such as a spin coating method or a liquid droplet discharging method. In particular, as it is necessary to selectively arrange the forming material of the hole injection layers 16AR, 16AG and 16AB in regions surrounded by the upper barrier rib 15B, an ink-jet printing method which is the liquid droplet discharging method, or a nozzle coating method is preferably used.

More specifically, a solution or a dispersion liquid such as polyaniline or polythiophene which is the forming material of the hole injection layers 16AR, 16AG and 16AB is discharged to the exposed surfaces of the lower electrodes 14 by, for example, the ink-jet printing method. After that, heat treatment (drying treatment) is performed to form the hole injection layers 16AR, 16AG and 16AB.

In the heat treatment, a solvent or a dispersion medium is dried, and then heated at high temperature. In the case where a conductive high polymer such as polyaniline or polythiophene is used, the heat treatment is preferably performed in an air or oxygen atmosphere, because electrical conductivity is easily developed by oxidation of the conductive high polymer by oxygen.

The heating temperature is preferably within a range of 150° C. to 300° C. both inclusive, and more preferably within a range of 180° C. to 250° C. both inclusive. The heating time, depending on temperature and atmosphere, is preferably within a range of approximately 5 minutes to 300 minutes, and more preferably within a range of 10 minutes to 240 minutes both inclusive. The thickness of a dried film is preferably within a range of 5 nm to 100 nm both inclusive, and more preferably within a range of 8 nm to 50 nm both inclusive.
(Step of Forming Hole Transport Layers 16BR and 16BG of Red Organic EL Elements 10R and Green Organic EL Elements 10G)

Figure 5C:
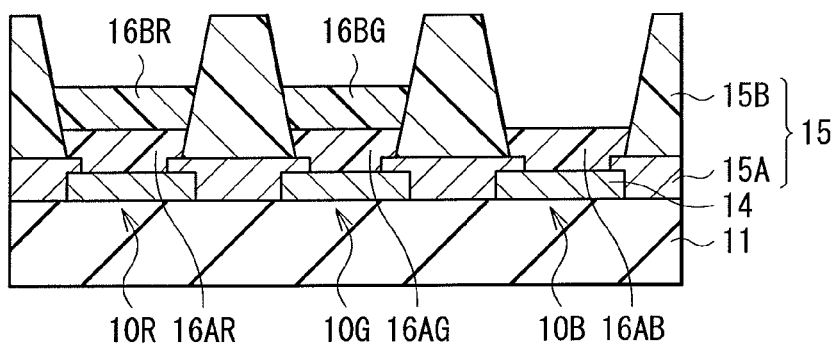

After the hole injection layers 16AR, 16AG and 16AB are formed, as illustrated in FIG. 5C, the hole transport layers 16BR and 16BG made of the above-described high-molecular material are formed on the hole injection layers 16AR and 16AG of the red organic EL elements 10R and the green organic EL elements 10G, respectively (step S105). The hole transport layers 16BR and 16BG are formed by a coating method such as a spin coating method or a liquid droplet discharging method. In particular, as it is necessary to selectively arrange the forming material of the hole transport layers 16BR and 16BG in regions surrounded by the upper barrier rib 15B, the ink jetprinting method which is the liquid droplet discharging method, or the nozzle coating method is preferably used.

More specifically, a solution or a dispersion liquid of a high polymer which is the forming material of the hole transport layers 16BR and 16BG is discharged to exposed surfaces of the hole injection layers 16AR and 16AG by, for example, a ink-jet printing method. After that, heat treatment (drying treatment) is performed to form the hole transport layers 16BR and 16BG of the red organic EL elements 10R and the green organic EL elements 10G.

In the heat treatment, a solvent or dispersion liquid is dried, and then heated at high temperature. As an atmosphere for coating or an atmosphere for drying and heating the solvent, an atmosphere including nitrogen ($N_2$) as a main component is preferable, because when oxygen or water is included in the atmosphere, the light emission efficiency or lifetime of the formed organic EL display may be reduced. In particular, in a heating step, the influence of oxygen or water is large, so it is necessary to pay attention to oxygen or water. The oxygen concentration is preferably within a range of 0.1 ppm to 100 ppm both inclusive, and more preferably within a range of 50 ppm or less. When the oxygen concentration is larger than 100 ppm, an interface of a formed thin film may be contaminated to reduce the light emission efficiency and lifetime of the obtained organic EL display. Moreover, in the case where the oxygen concentration is smaller than 0.1 ppm, such a low concentration does not cause an issue in properties of the elements, but in a present mass-production process, the cost of an apparatus for maintaining an atmosphere with an oxygen concentration of smaller than 0.1 ppm may be high.

Moreover, the dew point of water is preferably within a range of, for example, −80° C. to −40° C. both inclusive, more preferably −50° C. or less, and more preferably −60° C. or less. When water with a dew point of higher than −40° C. is present, an interface of a formed thin film may be contaminated to reduce the light emission efficiency or lifetime of the obtained organic EL display. Moreover, in the case of water with a dew point of lower than −80° C., such a low temperature does not cause the properties of the elements, but as a present mass-production process, the cost of an apparatus for keeping an atmosphere at lower than −80° C. may be high.

The heating temperature is preferably within a range of 100° C. to 230° C. both inclusive, and more preferably within a range of 100° C. to 200° C. both inclusive. At least the heating temperature is preferably lower than a temperature for forming the hole injection layers 16AR, 16AG and 16AB. The heating time, depending on temperature or atmosphere, is preferably within a range of approximately 5 minutes to 300 minutes, and more preferably within a range of 10 minutes to 240 minutes both inclusive. The thickness of a dried film, depending on a whole element configuration, is preferably within a range of 10 nm to 200 nm both inclusive and more preferably within a range of 15 nm to 150 nm both inclusive.

(Step of Forming Red Light-Emitting Layers 16CR and Green Light-Emitting Layers 16CG)

Figure 6A:
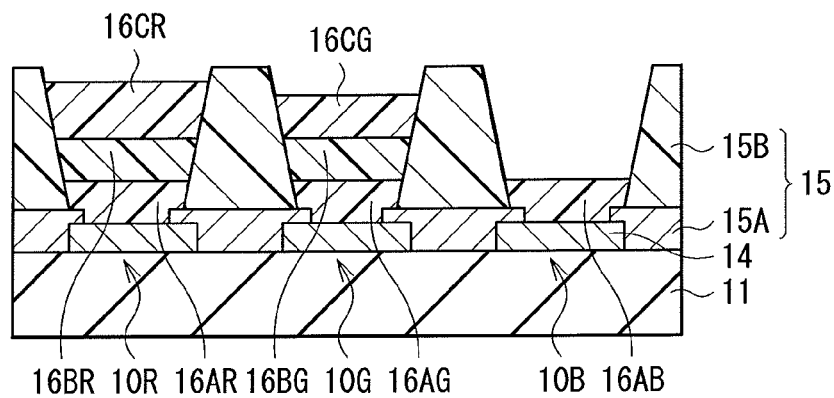
FIGS. 6A to 6C are sectional views illustrating steps following FIGS. 5A to 5C.

After the hole transport layers 16BR and 16BG of the red organic EL elements 10R and the green organic EL elements 10G are formed, as illustrated in FIG. 6A, the red light-emitting layers 16CR made of a mixture material of the above-described high-molecular material and the above-described low-molecular material are formed on the hole transport layers 16BR of the red organic EL elements 10R. Moreover, the green light-emitting layers 16CG made of a mixture material of the above-described high-molecular material and the above-described low-molecular material are formed on the hole transport layers 16BG of the green organic EL elements 10G (step S106). The red light-emitting layers 16CR and the green light-emitting layers 16CG are formed by a coating method such as a spin coating method or a liquid droplet discharging method. In particular, as it is necessary to selectively arrange the forming materials of the red light-emitting layers 16CR and the green light-emitting layers 16CG in regions surrounded by the upper barrier rib 15B, the ink jet printing method which is the liquid droplet discharging method, or the nozzle coating method is preferably used.

More specifically, a mixture solution or a dispersion liquid prepared by dissolving, the high-molecular material and the low-molecular material as the forming materials of the red-emitting layer 16CR and the green light-emitting layer 16CG at, for example, 1 wt % in a mixture solvent of xylene and cyclohexylbenzene at a ratio of 2:8 is discharged on exposed surfaces of the hole transport layers 16BR and 16BG by, for example, the ink-jet printing method. After that, heat treatment by the same method under the same conditions as in the heat treatment (drying treatment) described in the step of forming the hole transport layers 16BR and 16BG of the above-described red organic EL elements 10R and the above-described green organic EL elements 10G is performed to form the red light-emitting layers 16BR and the green light-emitting layers 16BG.

(Step of Forming Hole Transport Layers 16BB of Blue Organic EL Elements 10B)

Figure 6B:
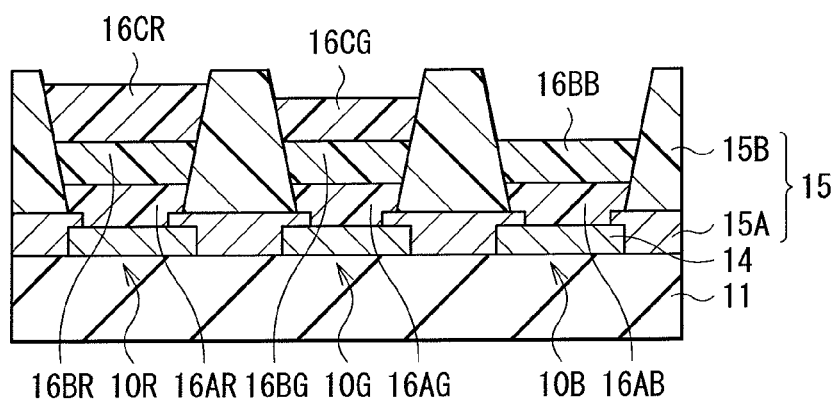

After the red light-emitting layers 16CR and the green light-emitting layers 16CG are formed, as illustrated in FIG. 6B, the hole transport layers 16BB made of the above-described low-molecular material are formed on the hole injection layers 16AB for the blue organic EL elements 10B (step S107). The hole transport layers 16BB are formed by a coating method such as a spin coating method or a liquid droplet discharging method. In particular, as it is necessary to selectively arrange the forming material of the hole transport layers 16BB in regions surrounded by the upper barrier rib 15B, the ink-jet printing method which is the liquid droplet discharging method, or the nozzle coating method is preferably used.

More specifically, a solution or a dispersion liquid of the low-molecular material which is the forming material of the hole transport layers 16BB is discharged on exposed surfaces of the hole injection layers 16AB by, for example, the ink jet printing method. After that, heat treatment by the same method under the same conditions as in the heat treatment (drying treatment) described in the step of forming the hole transport layers 16BR and 16BG of the above-described red organic EL elements 10R and the above-described green organic EL elements 10G is performed to form the hole transport layers 16BB.

(Order of Steps)

The step of forming the hole transport layers 16BR and 16BG of the red organic EL elements 10R and the green organic EL elements 10G, the step of forming the hole transport layers 16BB of the blue organic EL elements 10B, and the step of forming the red light-emitting layers 16CR and the green light-emitting layers 16CG may be performed in any order, but it is necessary to previously form a base where layers to be formed are developed and to undergo a heating step in each heating and drying step. Moreover, it is necessary to perform coating at a temperature in the heating step equal to or lower than a temperature in a previous step. For example, in the case where the temperature for heating the red light-emitting layers 16CR and the green light-emitting layers 16CG is 130° C. and the temperature for heating the hole transport layers 16BB of the blue organic EL elements 10B are the same, that is, 130° C., coating may be performed to form the red light-emitting layers 16CR and the green light-emitting layers 16CG, and then without drying the red light-emitting layers 16CR and the green light-emitting layers 16CG, coating may be performed to form the hole transport layers 16BB of the blue organic EL elements 10B, and after that, the step of drying and heating the red light-emitting layers 16CR, the green light-emitting layers 16CG and the hole transport layers 16BB of the blue organic EL elements 10B may be performed.

Moreover, in each of the above-described steps, the drying step and the heating step are preferably performed separately, because in the drying step, a coated wet film easily flows, thereby easily forming the film uneven. A preferable drying step is a method of uniformly drying a film in a vacuum at normal pressure, and more preferably, the film is dried with keeping wind off the film. In the heating step, a solvent is removed to some extent to reduce fluidity, and the film is hardened. Then, when the film is slowly heated, a small amount of the remaining solvent is allowed to be removed, or the light-emitting material or the material of the hole transport layer is allowed to be rearranged at a molecular level.

(Step of Forming Blue Light-Emitting Layer 16CB)

Figure 6C:
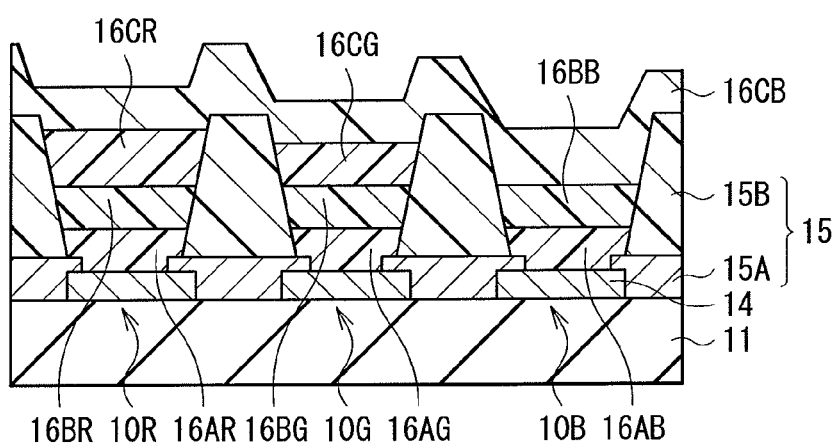

After the red light-emitting layers 16CR, the green light-emitting layers 16CG and the hole transport layers 16BB are formed, as illustrated in FIG. 6C, the blue light-emitting layer 16CB made of the above-described low-molecular material is formed as a common layer on the whole surfaces of the red light-emitting layers 16CR, the green light-emitting layers 16CG and the hole transport layers 16BB (step S108).

(Step of Forming Electron Transport Layer 16D, Electron Injection Layer 16E and Upper Electrode 17)

Figure 7A:
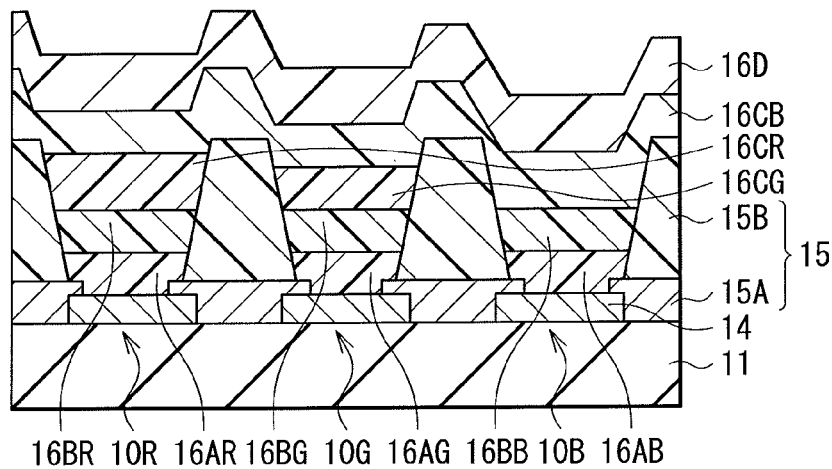
FIGS. 7A to 7C are sectional views illustrating steps following FIGS. 6A to 6C.
Figure 7B:
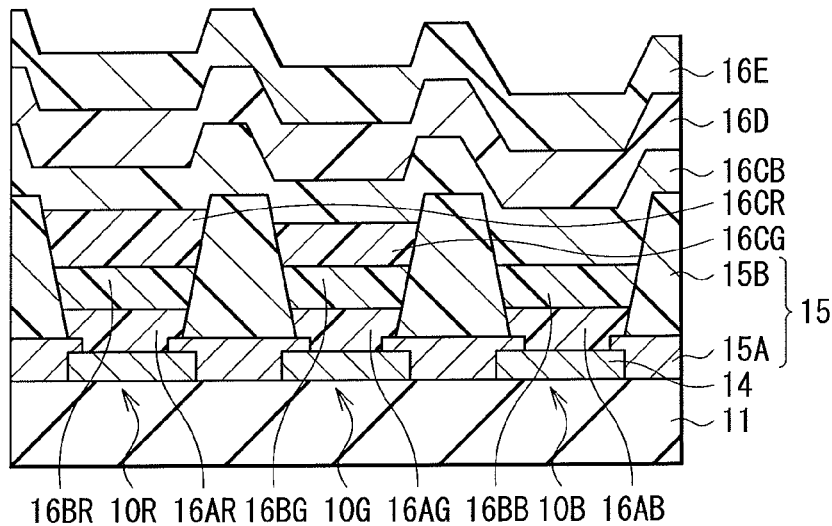
Figure 7C:
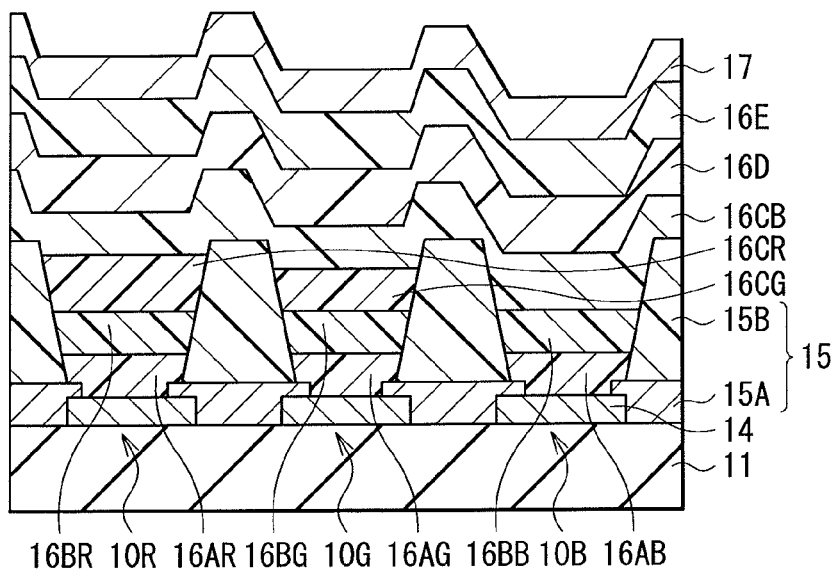

After the blue light-emitting layer 16CB is formed, as illustrated in FIGS. 7A, 7B and 7C, the electron transport layer 16D, the electron injection layer 16E and the upper electrode 17 made of the above-described materials are formed by an evaporation method on a whole surface of the blue light-emitting layer 16CB (step S109, S110 and S111).

After the upper electrode 17 is formed, as illustrated in FIG. 3, the protective layer 30 is formed by a film formation method with small energy of film formation particles, for example, an evaporation method or a CVD method so as not to exert an influence on the base. For example, in the case where the protective layer 30 made of amorphous silicon nitride is formed, the protective layer 30 is formed by the CVD method to have a thickness of 2 to 3 μm both inclusive. At this time, to prevent a decline in luminance due to deterioration in the organic layer 16, it is desirable that the film formation temperature be set to room temperature and a film be formed under a condition in which stress on the film is minimized to prevent peeling of the protective layer 30.

The blue light-emitting layer 16CB, the electron transport layer 16D, the electron injection layer 16E, the upper electrode 17 and the protective layer 30 are formed on a whole surface without using a mask. Moreover, the blue light-emitting layer 16CB, the electron transport layer 16D, the electron injection layer 16E, the upper electrode 17 and the protective layer 30 are preferably formed sequentially in one and the same film formation apparatus without being exposed to air. Therefore, deterioration in the organic layer 16 due to water in air is preventable.

In the case where an auxiliary electrode (not illustrated) is formed in the same step as the step of forming the lower electrodes 14, the organic layer 16 formed on a whole top surface of the auxiliary electrode may be removed by a technique such as laser ablation before forming the upper electrode 17. Therefore, the upper electrode 17 is allowed to be directly connected to the auxiliary electrode, thereby improving contact.

After the protective layer 30 is formed, for example, the light-shielding film made of the above-described material is formed on the sealing substrate 40 made of the above-described material. Next, the sealing substrate 40 is coated with the material of the red filter (not illustrated) by spin coating or the like, and the material is patterned by a photolithography technique and fired to form the red filter. Next, as in the case of the red filter (not illustrated), the blue filter and the green filter (both not illustrated) are formed in order.

After that, the adhesive layer (not illustrated) is formed on the protective layer 30, and the sealing substrate 40 is bonded to the protective layer 30 with the adhesive layer in between. Thus, the organic EL display 1 illustrated in FIGS. 1 to 3 is completed.

In the organic EL display 1, a scanning signal is supplied from the scanning line drive circuit 130 to each pixel through a gate electrode of the writing transistor Tr2, and an image signal supplied from the signal line drive circuit 120 through the writing transistor Tr2 is retained in the retention capacitor Cs. In other words, on/off control of the driving transistor Tr1 is performed in response to the signal retained in the retention capacitor Cs, and a drive current Id is thereby injected into each of the red organic EL elements 10R, the green organic EL elements 10G and the blue organic EL elements 10B to emit light by the recombination of electrons and holes. In the case of bottom emission, the light passes through the lower electrodes 14 and the substrate 11, and in the case of a top emission, the light passes through the upper electrode 17, the color filter (not illustrated) and the sealing substrate 40, and then the light is extracted.

In a red organic EL light-emitting element and a green organic EL light-emitting element formed of a material used in related art, as described above, carrier balance is changed depending on the magnitude of loading electric field intensity. Light emission regions in the red light-emitting layer 16DR and the green light-emitting layer 16CG are shifted by a change in carrier balance to cause a change in chromaticity. In particular, as electron transport efficiency is low under low-current load, the carrier balance is shifted to the blue light-emitting layer arranged on the red light-emitting layer and the green light-emitting layer to increase the influence of the blue light-emitting layer. Therefore, when the red organic EL element 10R or the green organic EL element 10G emits light at a low current, there is an issue that blue light with a peak at 430 to 500 nm is also emitted. In other words, blue light is mixed with red light or green light to cause a change in chromaticity of the red organic EL element 10R and the green organic EL element 10G, that is, a decline in color purity. This is a major issue as a display element forming a display.

On the other hand, in the embodiment, the nitrogen-containing heterocyclic compound with an electron mobility of $1.0 \times 10^{-6}$ $cm^2/Vs$ to $1.0 \times 10^{-1}$ $cm^2/Vs$ both inclusive is used for the electron transport layer 16D; therefore, electron injection efficiency into the red light-emitting layers 16CR and the green light-emitting layers 16CG is improved. In other words, the transport speed of electrons under low-current load is improved; therefore, the light emission regions are prevented from being shifted to the blue light-emitting layer 16CB, and a change in chromaticity due to current density is allowed to be reduced.

Thus, in the organic EL display 1 according to the embodiment, the nitrogen-containing heterocyclic compound with an electron mobility of $1.0 \times 10^{-6}$ $cm^2/Vs$ to $1.0 \times 10^{-1}$ $cm^2/Vs$ both inclusive is used for the electron transport layer 16D, electron injection efficiency into the red light-emitting layers 16CR and the green light-emitting layers 16CG is improved. Therefore, light emission regions are allowed to be prevented from being shifted to the blue light-emitting layer 16CB due to current density, and light emission from the blue light-emitting layer 16CB in the red organic EL elements 10R and the green organic EL elements 10G is preventable. More specifically, current density dependence of emission spectra of the red organic EL elements 10R and the green organic EL elements 10G is allowed to be reduced, thereby reducing a change in chromaticity due to current density. Therefore, a high-definition display in which a change in a color reproduction region in gradation is reduced is allowed to be formed.

Second Embodiment

Like components are denoted by like numerals as of the first embodiment and will not be further described. Although a configuration of an organic EL display according to a second embodiment of the disclosure is not illustrated, as in the case of the first embodiment, for example, a display region in which a plurality of red organic EL elements 20R, a plurality of green organic EL elements 20G and a plurality of blue organic EL elements 20B are arranged in a matrix form on the substrate 11 is formed. A pixel drive circuit is arranged in the display region.

Moreover, in the display region, the red organic EL elements 20R emitting red light, the green organic EL elements 20G emitting green light and the blue organic EL elements 20B emitting blue light are arranged in a matrix form as a whole. It is to be noted that a combination of the red organic EL element 20R, the green organic EL element 20G and the blue organic EL element 20B which are adjacent to one another configures one pixel.

Moreover, as in the case of the first embodiment, a signal line drive circuit and a scanning line drive circuit as drivers for picture display are arranged around the display region.

Figure 8:
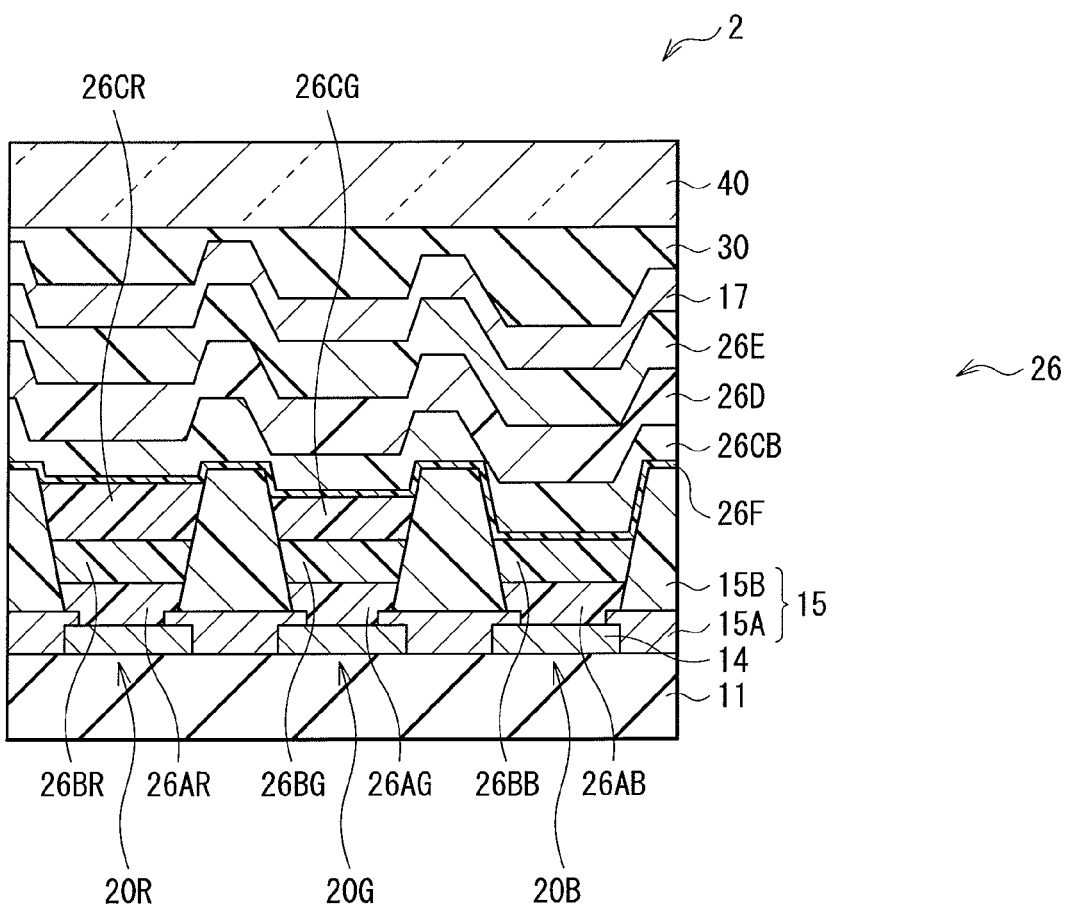
FIG. 8 is a sectional view illustrating a configuration of an organic EL display according to a second embodiment of the disclosure.

FIG. 8 illustrates a sectional configuration of the display region of an organic EL display 2 in the second embodiment. As in the case of the first embodiment, the red organic EL elements 20R, the green organic EL elements 20G and the blue organic EL elements 20B each have a configuration in which the lower electrode 14 as an anode, the barrier rib 15, an organic layer 26 including a light-emitting layer 26C which will be described later, and the upper electrode 17 as a cathode are laminated in this order from the substrate 11 with the driving transistor Tr1 of the pixel drive circuit and a planarization insulating film (not illustrated) in between. Except for the light-emitting layer 26, the substrate 11, the lower electrode 14, the barrier rig 15, the upper electrode 17, the protective layer 30 and the sealing substrate 40 have the same configurations as those in the first embodiment.

The organic EL display 2 in the embodiment is different from the first embodiment in that a common hole transport layer 26F is arranged between red light-emitting layers 26CR, green light-emitting layers 26CG and hole transport layers 26BB and a blue light-emitting layer 26CB arranged on whole surfaces of these layers 26CR, 26CG and 26BB.

More specifically, for example, as in the case of the red organic EL element 10R in the first embodiment, the organic layer 26 of each red organic EL element 20R has, for example, a configuration in which a hole injection layer 26AR, a hole transport layer 26BR, a red light-emitting layer 26CR, the common hole transport layer 26F, a blue light-emitting layer 26CB, an electron transport layer 26D and an electron injection layer 16E are laminated in order from the lower electrode 14. For example, as in the case of the green organic EL element 10G in the first embodiment, the organic layer 26 of each green organic EL element 20G has, for example, a configuration in which a hole injection layer 26AG, a hole transport layer 26BG, a green light-emitting layer 26CG, the common hole transport layer 26F, the blue light-emitting layer 26CB, the electron transport layer 26D and the electron injection layer 26E are laminated in order from the lower electrode 14. The organic layer 26 of each blue organic EL element 20B has, for example, a configuration in which a hole injection layer 26AB, a hole transport layer 26BB, the common hole transport layer 26F, the blue light-emitting layer 26CB, the electron transport layer 26D and the electron injection layer 26E are laminated in order from the lower electrode 14. The common hole transport layer 26F, the blue light-emitting layer 26CB, the electron transport layer 26D and the electron injection layer 26E are arranged as common layers for the red organic EL elements 20R, the green organic EL elements 20G and the blue organic EL elements 20B.

The common hole transport layer 26F is provided to enhance hole transport efficiency to the blue light-emitting layer 26CB, and is arranged as a common layer on whole surfaces of the red light-emitting layers 26CR, the green light-emitting layers 26CG and the hole transport layers 26BB for the blue organic EL elements 20B. For example, the thicknesses of the hole transport layer 26F, depending on a whole element configuration, are preferably within a range of 1 nm to 20 nm both inclusive, and more preferably within a range of 1 nm to 10 nm both inclusive.

As the common hole transport layer 26F is formed by an evaporation method, a low-molecular material, specifically a monomer is preferably used, because polymerized molecules such as an oligomer or a high-molecular material may be decomposed during evaporation. It is to be noted that a mixture of two or more kinds of low-molecular materials with different molecular weights may be used for the common hole transport layer 26F.

As in the case of the low-molecular material used for the red light-emitting layers 16CR, the green light-emitting layers 16CB and the blue light-emitting layer 16CB described in the first embodiment, as the low-molecular material used for the common hole transport layer 26F, benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene or a derivative thereof, or a heterocyclic conjugated monomer, oligomer or polymer such as a polysilane-based compound, a vinylcarbazole-based compound, a thiophene-based compound or an aniline-based compound is allowed to be used.

More specifically, α-naphthyl phenyl phenylenediamine, porphyrin, metal tetraphenyl porphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenylphenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylene vinylene), poly (thiophene vinylene), and poly(2,2'-thienylpyrrole) or the like is used, but the low-molecular material is not limited thereto.

Moreover, the low-molecular materials represented by the above-described formulas (1) to (3) are preferably used, and specific examples thereof include compounds represented by the following formulas (1-1) to (1-48), formulas (2-1) to (2-69) and formulas (3-1) to (3-45).

Figure 9:
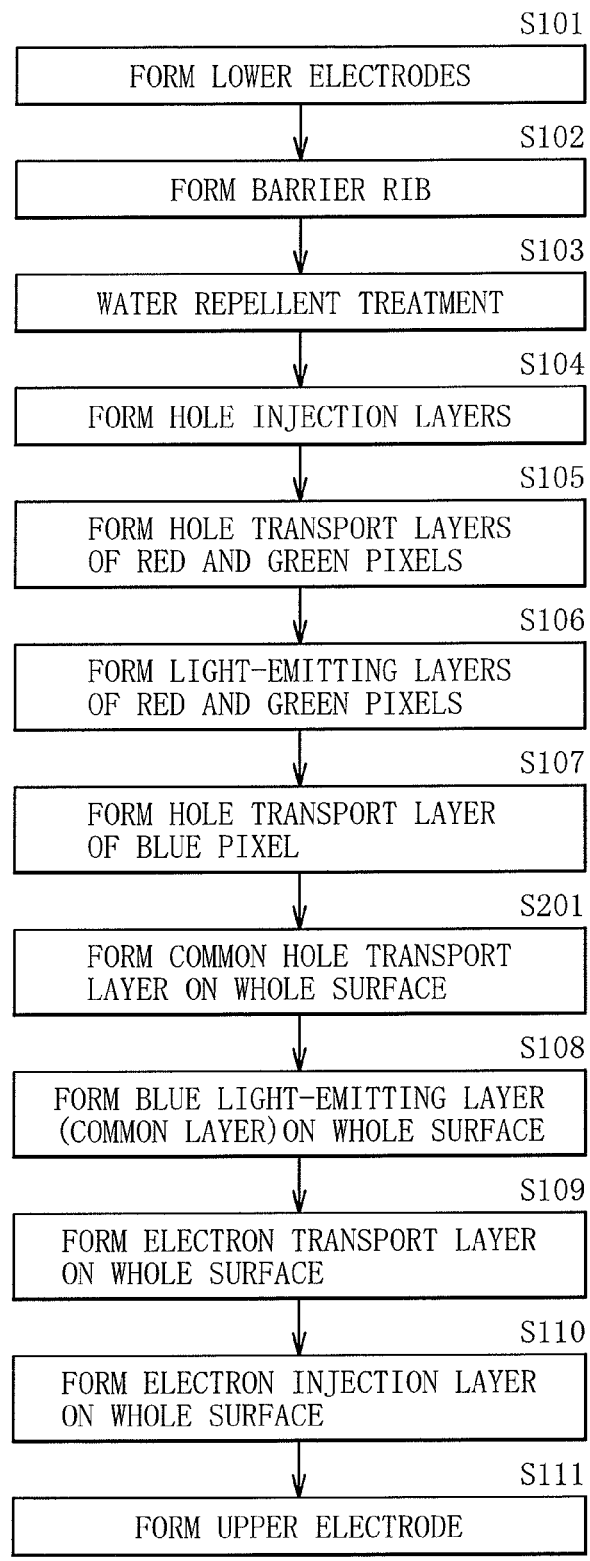
FIG. 9 is a flow chart illustrating a method of manufacturing the organic EL display illustrated in FIG. 8.

As illustrated in a flow chart in FIG. 9, the organic EL display 2 is allowed to be manufactured by adding a step of forming the common hole transport layer 26F (step S201) which will be described later between the step S107 and the step S108 described in the first embodiment.

(Step of Forming Common Hole Transport Layer 26F)

After the hole transport layers 26BB of the blue organic EL elements 20B, the red light-emitting layers 26CR and the green light-emitting layers 26CG are formed, the common hole transport layer 26F made of the above-described low-molecular material is formed as a common layer on whole surfaces of the red light-emitting layers 26CR, the green light-emitting layers 26CG and the hole transport layers 26BB of the blue organic EL elements 20B by an evaporation method (step S201).

It is to be noted that as in the case of the blue light-emitting layer 16CB, the electron transport layer 16D, the electron injection layer 16E, the upper electrode 17 and the protective layer 30 in the first embodiment, the common hole transport layer 26F is formed on a whole surface without using a mask. Moreover, as in the case of the above-described layers 16CB, 16D, 16E, 17 and 30 in the first embodiment, the common hole transport layer 26F is preferably formed sequentially in one and the same film formation apparatus without being exposed to air. Therefore, deterioration in the organic layer 26 due to water in air is prevented.

In the organic EL display 2 according to the embodiment, in addition to the effects of the first embodiment, the following effects are exerted. In the case where the blue light-emitting layer 16CB is arranged directly on the hole transport layer 16BB formed by a coating method used in related art, intrinsic properties of the light-emitting layer 16CB are not exerted because of the following reasons. A first reason is a decline in hole injection properties due to entry of water, a remaining solvent or the like when the hole transport layer 16BB is formed by a coating method. A second reason is deterioration due to interface contamination or the like caused by forming the hole transport layer 16BB in an atmospheric environment. On the other hand, in the organic EL display 2, the common hole transport layer 26F made of the low-molecular material is formed on whole surfaces of the red light-emitting layers 26CR, the green light-emitting layers 26CG and the hole transport layers 26BB by an evaporation method; therefore, an interface of the blue light-emitting layer 26CB is improved. Therefore, hole injection efficiency into the blue light-emitting layer 26CB is improved, and a value close to intrinsic properties of the blue light-emitting layer 26CB is obtainable. In other words, as light emission efficiency and lifetime characteristics of the blue organic EL elements 20B are improved, higher light emission efficiency and longer lifetime of a color organic EL display configured of the red organic EL elements 20R, the green organic EL elements 20G and the blue organic EL elements 20B are obtainable.

(Module and Application Examples)

Application examples of the organic EL displays described in the above-described embodiments will be described below. The organic EL displays according to the above-described embodiments are applicable to displays of electronic devices displaying a picture signal supplied from outside or a picture signal produced inside as an image or a picture in any fields, such as televisions, digital cameras, notebook personal computers, portable terminal devices such as cellular phones, and video cameras.

(Modules)

Figure 10:
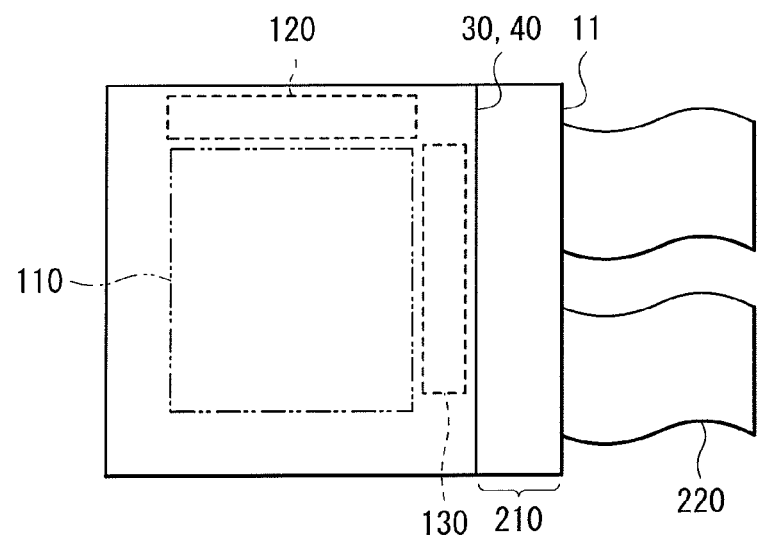
FIG. 10 is a plan view illustrating a schematic configuration of a module including the display according to the above-described respective embodiments.

The organic EL display according to any of the above-described embodiments is incorporated into various electronic devices such as Application Examples 1 to 5 which will be described later as a module as illustrated in FIG. 10. In the module, for example, a region 210 exposed from the protective layer 30 and the sealing substrate 40 is arranged on a side of the substrate 11, and an external connection terminal (not illustrated) is formed in the exposed region 210 by extending the wiring of the signal line drive circuit 120 and the scanning line drive circuit 130. In the external connection terminal, a flexible printed circuit (FPC) 220 for signal input/output may be arranged.

Application Example 1

Figure 11:
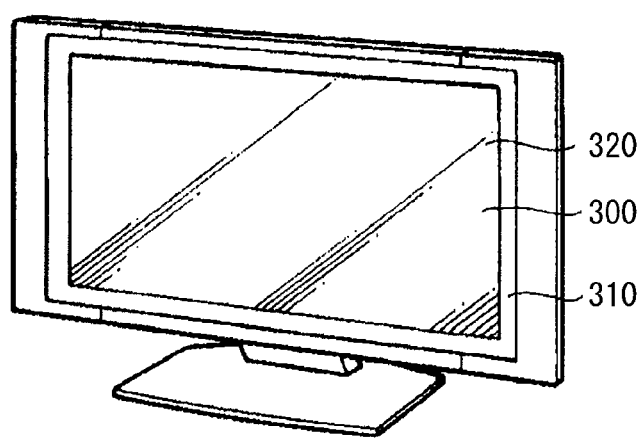
FIG. 11 is an external perspective view of Application Example 1 of the display according to the above-described respective embodiments.

FIG. 11 illustrates an appearance of a television to which the organic EL display according to any of the above-described embodiments is applied. The television has, for example, a picture display screen section 300 including a front panel 310 and a filter glass 320, and the picture display screen section 300 is configured of the organic EL display according to any of the above-described embodiments.

Application Example 2

Figure 12A:
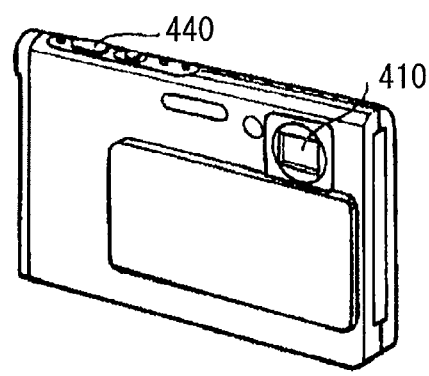
FIGS. 12A and 12B are external perspective views of Application Example 2 from a front side and a back side, respectively.
Figure 12B:
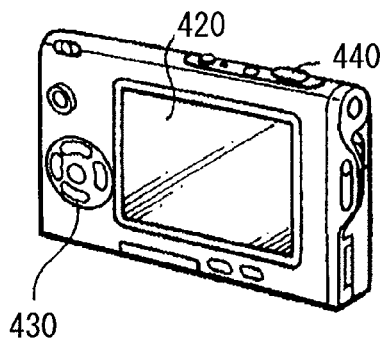

FIGS. 12A and 12B illustrate an appearance of a digital camera to which the organic EL display according to any of the above-described embodiments is applied. The digital camera has, for example, a light-emitting section for a flash 410, a display section 420, a menu switch 430 and a shutter button 440, and the display section 420 is configured of the organic EL display according to any of the above-described embodiments.

Application Example 3

Figure 13:
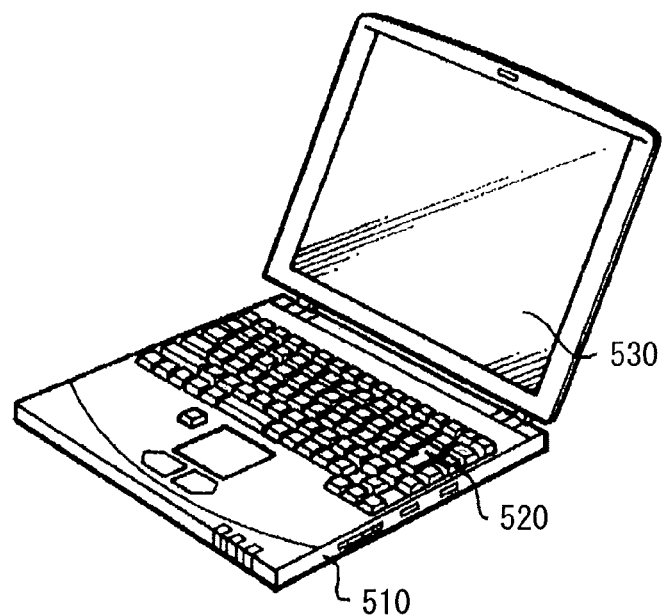
FIG. 13 is an external perspective view of Application Example 3.

FIG. 13 illustrates an appearance of a notebook personal computer to which the organic EL display according to any of the above-described embodiments is applied. The notebook personal computer has, for example, a main body 510, a keyboard 520 for operation of inputting characters and the like and a display section 530 for displaying an image, and the display section 530 is configured of the organic EL display according to any of the above-described embodiments.

Application Example 4

Figure 14:
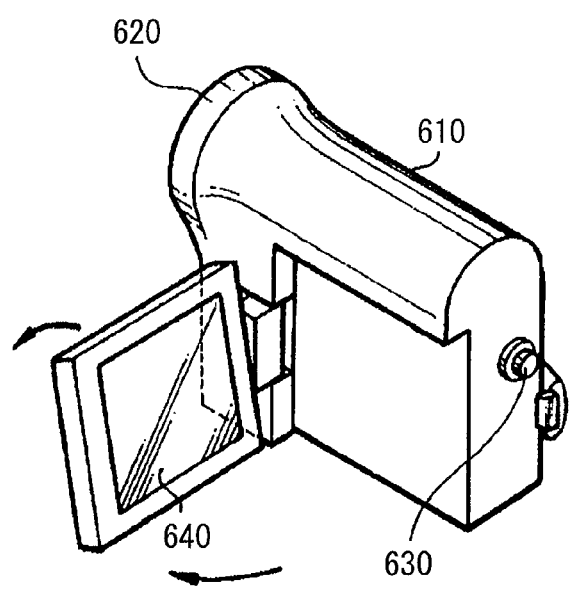
FIG. 14 is an external perspective view of Application Example 4.
Figure 15:
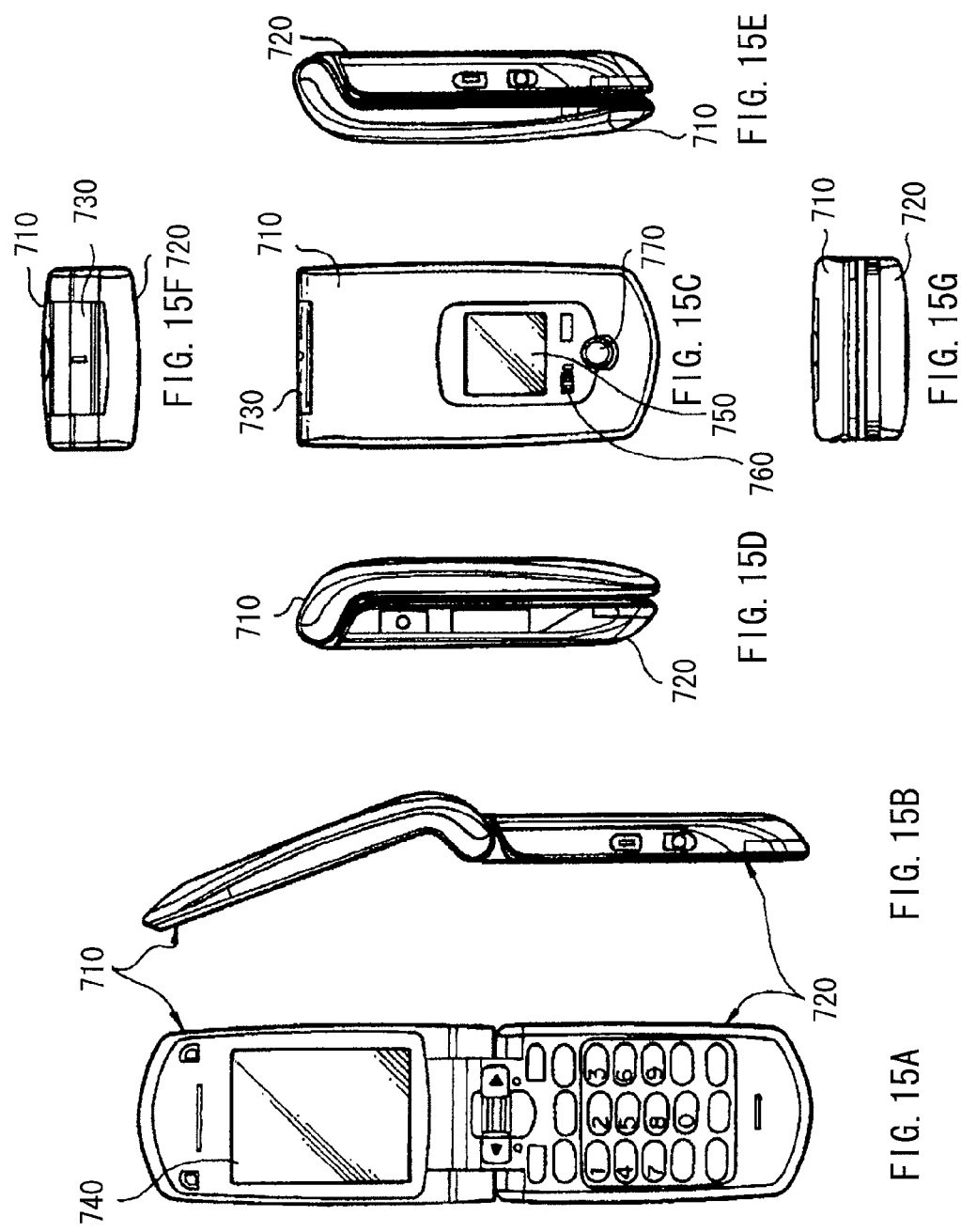
FIGS. 15A to 15G illustrate Application Example 5 where

FIG. 14 illustrates an appearance of a video camera to which the organic EL display according to any of the above-described embodiments is applied. The video camera has, for example, a main body 610, a lens for shooting an object 620 arranged on a front surface of the main body 610, a shooting start/stop switch 630 and a display section 640, and the display section 640 is configured of the organic EL display according to any of the above-described embodiments.

Application Example 5

FIGS. 15A to 15G illustrate an appearance of a cellular phone to which the organic EL display according to any of the above-described embodiments is applied. The cellular phone is formed by connecting, for example, a top-side enclosure 710 and a bottom-side enclosure 720 to each other by a connection section (hinge section) 730, and the cellular phone has a display 740, a sub-display 750, a picture light 760, and a camera 770. The display 740 or the sub-display 750 is configured of the organic EL display according to any of the above-described embodiments.

Example 1

The red organic EL elements 10R, the green organic EL elements 10G and the blue organic EL elements 10B were formed on the substrates 11 with a size of 25 mm×25 mm.

First, glass substrates (with a size of 25 mm×25 mm) were prepared as the substrates 11, and as the lower electrodes 14, two-layer configurations including a silver alloy layer made of an Ag—Pd—Cu alloy with a thickness of 120 nm and a transparent conductive film made of ITO with a thickness of 10 nm were formed on the substrates 11 (step S101).

Next, the lower electrodes 14 were coated with ND1501 (polyaniline manufactured from Nissan Chemical Industries, Ltd.) by a spin coating method in air to form the hole injection layers 16AR, 16AG and 16AB with a thickness of 15 nm, and then the hole injection layers 16AR, 16AG and 16AB were thermally cured on a hot plate at 220° C. for 30 minutes (step S104).

After that, the hole injection layers 16AR and 16AG were coated with a polymer (polyvinyl carbazole) represented by a formula (9) by a spin coating method under a $N_2$ atmosphere (with a dew point of −60° C. and an oxidation concentration of 10 ppm) to form the hole transport layers 16BR and 16BG. The hole transport layer 16BR for each red organic EL element 10R had a thickness of 150 nm and the hole transport layer 16BG for each green organic EL element 10G had a thickness of 20 nm. After that, the hole transport layers 16BR and 16BG were thermally cured on a hot plate at 180° C. for 60 minutes in a $N_2$ atmosphere (with a dew point of −60° C. and an oxygen concentration of 10 ppm) (step S105).

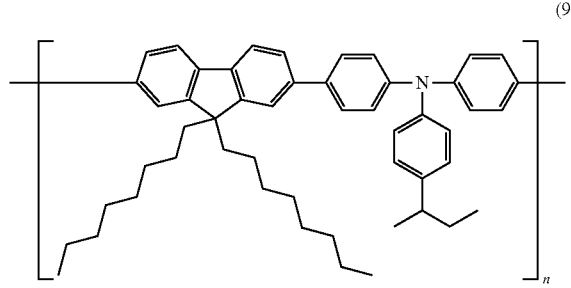

(9)

After the hole transport layers 16BR and 16BG were formed, a mixture material prepared by mixing, for example, the low-molecular material represented by the formula (2-6) into a fluorenone-based polyarylene material including benzothiadiazole in a block at a weight ratio of 2:1 was dissolved in xylene to form a mixture solution, and the hole transport layers 10BR for the red organic EL elements 10R were coated with the mixture solution by a spin coating method to form the red light-emitting layers 16CR with a thickness of 80 nm. Moreover, a mixture material prepared by mixing, for example, the low-molecular material represented by the formula (2-6) into a fluorenone-based polyarylene material including anthracene in a block at a weight ratio of 2:1 was dissolved in xylene to form a mixture solvent, and the hole transport layers 16BG for the green organic EL elements 10G were coated with the mixture solvent to form the green light-emitting layers 16CG with a thickness of 80 nm. Next, the red light-emitting layers 16CR and the green light-emitting layers 16CG were thermally cured on a hot plate at 130° C. for 10 minutes in a $N_2$ atmosphere (with a dew point of −60° C. and an oxygen concentration of 10 ppm) (step S106).

After the red light-emitting layers 16CR and the green light-emitting layers 16CG were formed, the hole injection layers 16AB for the blue organic EL elements 10B were coated with, for example, the low-molecular material represented by the formula (2-38) by a spin coating method to form the hole transport layers 16BB with a thickness of 50 nm. After that, the hole transport layers 16BB were heated on a hot plate at 100° C. for 60 minutes in a $N_2$ atmosphere (with a dew point of −60° C. and an oxygen concentration of 10 ppm) (step S107).

After the hole transport layers 16BB were formed, the substrate 11 for the red organic EL elements 10R in which layers until the red light-emitting layers 16CR were formed and the substrate 11 for the green organic EL elements 10G in which layers until the green light-emitting layers 16CG were formed, and the substrate 11 for the blue organic EL elements 10B in which the layers until the hole transport layers 16BB were formed were brought into a vacuum deposition apparatus to form the common hole transport layer 16D and subsequent layers by evaporation.

First, ADN (9,10-di(2-naphthyl)anthracene) represented by the formula (5-20) and a blue dopant represented by a formula (10) were co-evaporated at a weight ratio of 95:5 to form the blue light-emitting layer 16CB (step S108).

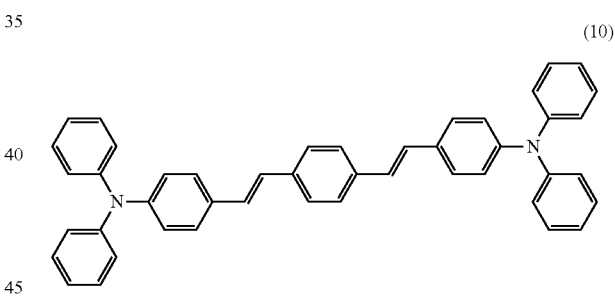

(10)

Next, after the blue light-emitting layer 16CB was formed, for example, an organic material represented by the formula (6-15) was evaporated by a vacuum deposition method to form the electron transport layer 16D with a thickness of 15 nm (step S109). Next, a layer of LiF with a thickness of 0.3 nm was formed as the electron injection layer 16E by the same evaporation method (step S110), and a layer of Mg—Ag with a thickness of 10 nm was formed as the upper electrode 17 (step S111). Finally, the protective layer 30 made of SiN was formed by a CVD method, and solid sealing was performed with use of a transparent resin. The red EL elements 10R, the green organic EL elements 10G and the blue organic EL elements 10B obtained in such a manner were combined to obtain full-color organic EL displays (Examples 1-1 to 1-10). Moreover, organic EL displays using materials represented by formulas (11) and (12) for the electron transport layer 16D were formed as Comparative Examples 1-1 and 1-2.

(11)

(12)

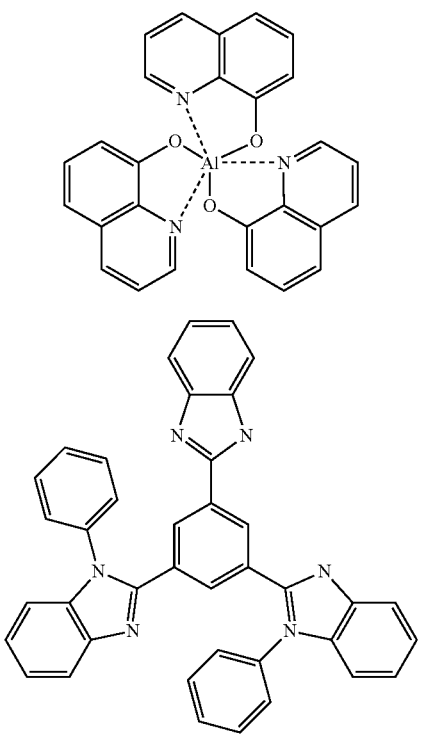

Example 2

As in the case of Example 1, as the lower electrodes 14, two-layer configurations including a silver alloy layer made of an Ag—Pd—Cu alloy with a thickness of 120 nm and a transparent conductive film made of ITO with a thickness of 10 nm were formed on the substrates 11 with a size of 25 mm×25 mm for the red organic EL elements 10R, the green organic EL elements 10G and the blue organic EL elements 10B (step S101).

Next, the lower electrodes 14 were coated with ND1501 (polyaniline manufactured from Nissan Chemical Industries, Ltd.) by a spin coating method in air to form the hole injection layers 16AR, 16AG and 16AB with a thickness of 15 nm, and then the hole injection layers 16AR, 16AG and 16AB were thermally cured on a hot plate at 220° C. for 30 minutes (step S104).

After that, the hole injection layers 16AR and 16AG were coated with the polymer (polyvinyl carbazole) represented by the formula (9) by a spin coating method in a N$_2$ atmosphere (with a dew point of −60° C. and an oxygen concentration of 10 ppm) to form the hole transport layers 16BR and 16BG. The hole transport layer 16BR for each red organic EL element 10R had a thickness of 150 nm, and the hole transport layer 16BG for each green organic EL element 10G had a thickness of 20 nm. After that, the hole transport layers 16BR and 16BG were thermally cured on a hot plate at 180° C. for 60 minutes in a N$_2$ atmosphere (with a dew point of −60° C. and an oxygen concentration of 10 ppm) (step S105).

After the hole transport layers 16BR and 16BG were formed, a mixture material prepared by mixing, for example, the low-molecular material represented by the formula (2-6) into a fluorenone-based polyarylene material including benzothiadiazole in a block at a weight ratio of 2:1 was dissolved in xylene to form a mixture solution, and the hole transport layers 10BR for the red organic EL elements 10R were coated with the mixture solution by a spin coating method to form the red light-emitting layers 16CR with a thickness of 80 nm. Moreover, a mixture material prepared by mixing, for example, a low-molecular material represented by the formula (2-6) into a fluorenone-based polyarylene material including anthracene in a block at a weight ratio of 2:1 was dissolved in xylene to form a mixture solvent, and the hole transport layers 10BG for the green organic EL elements 10G were coated with the mixture solvent to form the green light-emitting layers 16CG with a thickness of 80 nm. Next, the red light-emitting layers 16CR and the green light-emitting layers 16CG were thermally cured on a hot plate at 130° C. for 10 minutes in a N$_2$ atmosphere (with a dew point of −60° C. and an oxygen concentration of 10 ppm) (step S106).

After the red light-emitting layers 16CR and the green light-emitting layers 16CG were formed, for example, the hole injection layers 16AB for the blue organic EL elements 10B was coated with the low-molecular material represented by the formula (2-38) by a spin coating method to form the hole transport layer 16BB with a thickness of 50 nm. After that, the hole transport layer 16BB was heated on a hot plate at 100° C. for 60 minutes in a N$_2$ atmosphere (with a dew point of −60° C. and an oxygen concentration of 10 ppm) (step S107).

After the hole transport layers 16BB were formed, the substrate 11 for the red organic EL elements 10R in which layers until the red light-emitting layers 16CR were formed and the substrate 11 for the green organic EL elements 10G in which layers until the green light-emitting layers 16CG were formed, and the substrate 11 for the blue organic EL elements 10B in which the layers until the hole transport layers 16BB were formed were brought into a vacuum deposition apparatus to form the common hole transport layer 16D and subsequent layers by evaporation.

First, for example, the low-molecular material represented by the formula (2-38) was evaporated to form a layer with a thickness of 7 nm as the common hole transport layer 16D (Step S201). Next, ADN (9,10-di(2-naphthyl)anthracene) represented by the formula (5-20) and the blue dopant represented by the formula (10) were co-evaporated at a weight ratio of 95:5 to form the blue light-emitting layer 16CB (step S108).

Next, after the blue light-emitting layer 16CB was formed, for example, an organic material represented by the formula (6-35) was evaporated by a vacuum deposition method to form the electron transport layer 16D with a thickness of 15 nm as (step S109). Next, a layer of LiF with a thickness of 0.3 nm was formed as the electron injection layer 16E by the same evaporation method (step S110), and a layer of Mg—Ag with a thickness of 10 nm was formed as the upper electrode 17 (step S111). Finally, the protective layer 30 made of SiN was formed by a CVD method, and solid sealing was performed with use of a transparent resin. The red EL elements 10R, the green organic EL elements 10G and the blue organic EL elements 10B obtained in such a manner were combined to obtain full-color organic EL displays (Examples 2-1 to 2-4). Moreover, organic EL displays using the materials represented by the formula (11) and the formula (12) for the electron transport layer 16D were formed as Comparative Examples 2-1 and 2-2.

The luminance half time (lifetime) in the case of constant-current driving at a current density of 100 mA/cm$^2$ of each of the red organic EL elements 10R and 20R, the green organic EL elements 10G and 20G and the blue organic elements 10B and 20B of the organic EL displays 1 and 2 formed as Examples 1 and 2 was measured. Moreover, light emission efficiency (cd/A), the drive voltage (V), and chromaticity coordinates (x, y) in the case of driving at a current density of 10 mA/cm$^2$ were also measured. Further, USC chromaticities (u', v') of each of the red organic EL elements 10R and 20R and the green organic EL elements 10G and 20G at a current density of 1 mA/cm$^2$ and 30 mA/cm$^2$ were measured to determine a difference Δu'v' therebetween as an indicator of a color change in response to a change in current density. USC chromaticity is suitable as an indicator for observing the degree of a change in an emitted light color, because a distance on a chromaticity diagram and human sense are equal, compared to xy chromaticity.

Figure 16:
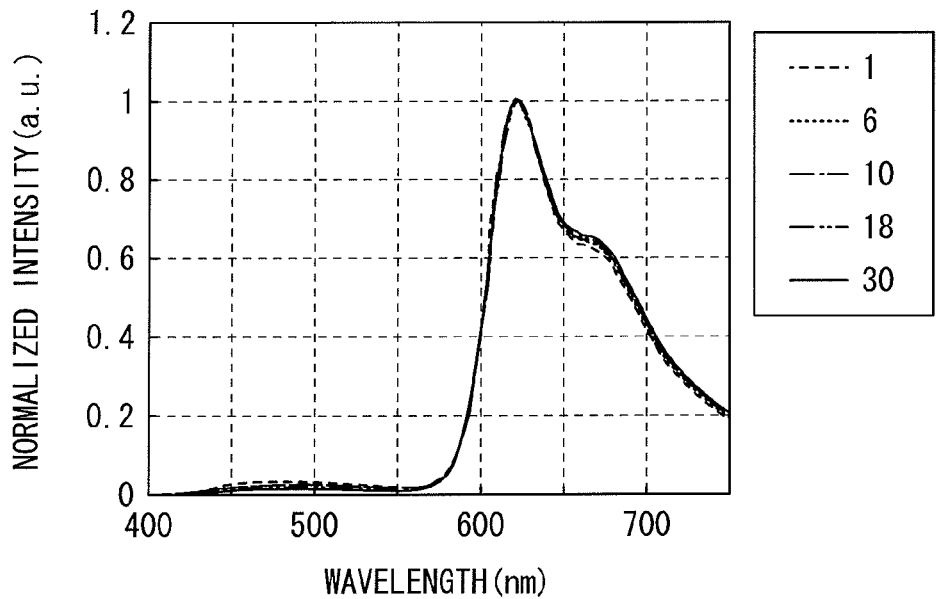
FIG. 16 is a plot illustrating current density dependence in an example.
Figure 17:
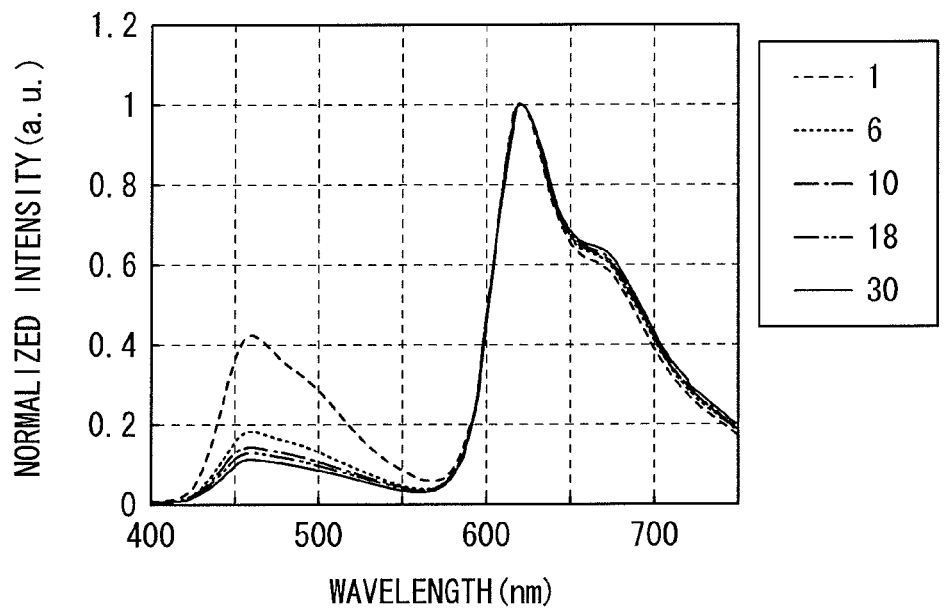
FIG. 17 is a plot illustrating current density dependence in a comparative example.

Table 1 illustrates a list of compositions of respective layers in Examples 1-1 to 2-4 and Comparative Examples 1-1 to 1-2. Table 2 illustrates a list of measurement results of the above-described examples and comparative examples. Moreover, FIGS. 16 and 17 illustrate plots illustrating current density dependence of an emission spectrum when the red organic EL element 10R was driven at a loading current with a current density of 1, 2, 6, 10, 18 and 30 mA/cm$^2$ in Example 1-1 and Comparative Example 1-1.

TABLE 1

|  | Electron Transport Layer Material | Common Hole Transport Layer | | Blue Organic EL Element | | Green Organic EL Element Low-molecular Material of Light-emitting Layer | Red Organic EL Element Low-molecular Material of Light-emitting Layer |
|---|---|---|---|---|---|---|---|
|  |  | Material | Thickness (nm) | Hole Transport Layer | Host Material |  |  |
| Example 1-1 | Formula (6-15) | — | — | Formula (2-38) | Formula (5-20) | Formula (2-6) | Formula (2-6) |
| Example 1-2 | Formula (6-16) | — | — | Formula (2-38) | Formula (5-20) | Formula (2-6) | Formula (2-6) |
| Example 1-3 | Formula (6-17) | — | — | Formula (2-38) | Formula (5-20) | Formula (2-6) | Formula (2-6) |
| Example 1-4 | Formula (6-35) | — | — | Formula (2-38) | Formula (5-20) | Formula (2-6) | Formula (2-6) |
| Example 1-5 | Formula (6-26) | — | — | Formula (2-38) | Formula (5-20) | Formula (2-6) | Formula (2-6) |
| Example 1-6 | Formula (7-1) | — | — | Formula (2-38) | Formula (5-20) | Formula (2-6) | Formula (2-6) |
| Example 1-7 | Formula (7-4) | — | — | Formula (2-38) | Formula (5-20) | Formula (2-6) | Formula (2-6) |
| Example 1-8 | Formula (7-48) | — | — | Formula (2-38) | Formula (5-20) | Formula (2-6) | Formula (2-6) |
| Example 1-9 | Formula (8-1) | — | — | Formula (2-38) | Formula (5-20) | Formula (2-6) | Formula (2-6) |
| Example 1-10 | Formula (8-4) | — | — | Formula (2-38) | Formula (5-20) | Formula (2-6) | Formula (2-6) |
| Comparative Example 1-1 | Formula (11) | — | — | Formula (2-38) | Formula (5-20) | Formula (2-6) | Formula (2-6) |
| Comparative Example 1-2 | Formula (12) | — | — | Formula (2-38) | Formula (5-20) | Formula (2-6) | Formula (2-6) |
| Example 2-1 | Formula (6-35) | Formula (2-38) | 7 | Formula (2-38) | Formula (5-20) | Formula (2-6) | Formula (2-6) |
| Example 2-2 | Formula (7-1) | Formula (2-38) | 7 | Formula (2-38) | Formula (5-20) | Formula (2-6) | Formula (2-6) |
| Example 2-3 | Formula (7-48) | Formula (2-38) | 7 | Formula (2-38) | Formula (5-20) | Formula (2-6) | Formula (2-6) |
| Example 2-4 | Formula (8-4) | Formula (2-38) | 7 | Formula (2-38) | Formula (5-20) | Formula (2-6) | Formula (2-6) |
| Comparative Example 2-1 | Formula (11) | Formula (2-38) | 7 | Formula (2-38) | Formula (5-20) | Formula (2-6) | Formula (2-6) |
| Comparative Example 2-2 | Formula (12) | Formula (2-38) | 7 | Formula (2-38) | Formula (5-20) | Formula (2-6) | Formula (2-6) |

TABLE 2

|  | Blue Organic EL Element | | | Green Organic EL Element | | | | Red Organic EL element | | | |
|---|---|---|---|---|---|---|---|---|---|---|---|
|  | Light Emission Efficiency (Cd/A) | Voltage (V) | Chromaticity (x, y) | Light Emission Efficiency (Cd/A) | Voltage (V) | Chromaticity (x, y) | Chromaticity Change (Δu'v') | Light Emission Efficiency (Cd/A) | Voltage (V) | Chromaticity (x, y) | Chromaticity Change (Δu'v') |
| Example 1-1 | 9 | 5.1 | 0.15, 0.15 | 13.8 | 5.8 | 0.26, 0.65 | 0.002 | 8.5 | 6.5 | 0.67, 0.32 | 0.002 |
| Example 1-2 | 8.9 | 5.2 | 0.15, 0.15 | 13.8 | 5.8 | 0.26, 0.65 | 0.001 | 8.5 | 6.5 | 0.67, 0.32 | 0.003 |
| Example 1-3 | 9.5 | 5.2 | 0.15, 0.15 | 13.8 | 5.8 | 0.26, 0.65 | 0.001 | 8.6 | 6.5 | 0.67, 0.32 | 0.001 |
| Example 1-4 | 9.5 | 5.2 | 0.15, 0.15 | 13.8 | 5.8 | 0.26, 0.65 | 0.001 | 8.9 | 6.5 | 0.67, 0.32 | 0.001 |
| Example 1-5 | 8.7 | 4.9 | 0.15, 0.15 | 13.8 | 5.6 | 0.26, 0.65 | 0.001 | 8.7 | 6.5 | 0.67, 0.32 | 0.001 |
| Example 1-6 | 8.7 | 4.9 | 0.15, 0.15 | 14.1 | 5.6 | 0.26, 0.65 | 0.001 | 8.6 | 6.5 | 0.67, 0.32 | 0.001 |
| Example 1-7 | 8.5 | 5.1 | 0.15, 0.15 | 14 | 5.8 | 0.26, 0.65 | 0.001 | 8.5 | 6.5 | 0.67, 0.32 | 0.001 |
| Example 1-8 | 8.6 | 5.1 | 0.15, 0.15 | 13.9 | 5.8 | 0.26, 0.65 | 0.001 | 8.5 | 6.5 | 0.67, 0.32 | 0.002 |
| Example 1-9 | 8.5 | 5.1 | 0.15, 0.15 | 13.8 | 5.8 | 0.26, 0.65 | 0.001 | 8.5 | 6.5 | 0.67, 0.32 | 0.003 |
| Example 1-10 | 8.5 | 5.1 | 0.15, 0.15 | 13.8 | 5.8 | 0.26, 0.65 | 0.001 | 8.5 | 6.5 | 0.67, 0.32 | 0.001 |
| Comparative Example 1-1 | 8.4 | 5.4 | 0.15, 0.15 | 13.8 | 6.1 | 0.26, 0.63 | 0.006 | 8 | 7.8 | 0.64, 0.32 | 0.07 |
| Comparative Example 1-2 | 4.1 | 7.8 | 0.15, 0.16 | 9.5 | 10.5 | 0.21, 0.54 | 0.013 | 6.5 | 11.5 | 0.59, 0.29 | 0.08 |
| Example 2-1 | 8.5 | 5.3 | 0.15, 0.15 | 13.8 | 4.5 | 0.26, 0.63 | 0.002 | 9.2 | 6.8 | 0.67, 0.32 | 0.002 |
| Example 2-2 | 8.5 | 5.3 | 0.15, 0.15 | 13.8 | 4.5 | 0.26, 0.64 | 0.001 | 9.1 | 6.6 | 0.67, 0.32 | 0.001 |
| Example 2-3 | 8.5 | 5.3 | 0.15, 0.15 | 13.9 | 4.5 | 0.26, 0.65 | 0.001 | 9.3 | 6.7 | 0.67, 0.32 | 0.001 |
| Example 2-4 | 8.5 | 5.3 | 0.15, 0.15 | 13.9 | 4.5 | 0.26, 0.65 | 0.002 | 8.9 | 6.8 | 0.67, 0.32 | 0.001 |
| Comparative Example 2-1 | 8.5 | 5.3 | 0.15, 0.15 | 12.9 | 6.5 | 0.26, 0.64 | 0.08 | 8.1 | 7.9 | 0.60, 0.31 | 0.12 |
| Comparative Example 2-2 | 5.5 | 8.1 | 0.15, 0.17 | 6.5 | 4.5 | 0.19, 0.52 | 0.01 | 6.7 | 7.5 | 0.58, 0.28 | 0.051 |

It was obvious from Table 2 that when the above-described organic material was used for the electron transport layer 16D, a change in chromaticity due to a difference in current density in the red organic EL element 10R and the green organic EL element 10G was 0.005 or less, which was one or more digits smaller than that in Comparative Examples 1-1 to 2-2 in which an electron transport material in related art was used. In other words, it was confirmed that irrespective of high current density, the color purity of the red organic EL element 10R and the green organic El element 10G was stable. It was obvious from a change in emission spectrum at each current density illustrated in FIGS. 16 and 17.

It is to be noted that the above-described effects were obtained when other organic materials represented by the formulas (6) to (8) were used in addition to the organic material used in Examples 1-1 to 2-4. Moreover, in Examples 1-1 to 2-4, the hole injection layers 16AR, 16AG and 16AB and the hole transport layers 16BR, 16BG and 16BB were formed by a spin coating method, but the coating method was not limited to the spin coating method. In organic EL displays formed by various printing methods such as ink jetprinting method, a nozzle coating method, an offset printing method, a flexo printing method and a relief printing method obtained the same effects as those in the examples.

Although the present disclosure is described referring to the embodiment and examples, the disclosure is not limited thereto, and may be variously modified.

For example, the material and thickness of each layer, the method and conditions of forming each layer are not limited to those described in the above-described embodiments and the above-described examples, and each layer may be made of any other material with any other thickness by any other method under any other conditions.

Moreover, in Examples 1 and 2, the low-molecular material (a monomer) is used for the hole transport layer 16BB, but the disclosure is not limited thereto, and a polymerized oligomer material or a high-molecular material may be used. It is to be noted that in the case where the low-molecular material is used in a coating method such as a spin coating method or an ink jetprinting method, typically, the viscosity of a coating solution is reduced; therefore, a film thickness adjustment range may be limited. This issue is solved by using an oligomer material or a polymer material with an increased molecular weight.

Further, in the second embodiment and the above-described examples, the common hole transport layer 26F is formed of one kind of low-molecular material by an evaporation method; however, even in the case where the common hole transport layer 26F is formed of a mixture of a plurality of low-molecular materials with different molecular weights, for example, low-molecular materials represented by the formulas (2-9) and (2-10) by a co-evaporation method, characteristics of the blue organic EL element 10B are allowed to be improved. Moreover, even in the case where the above-described hole transport layer 26F is configured of a laminate configuration including a layer of the low-molecular material represented by the formula (2-9) and a layer of the low-molecular material represented by the formula (2-10) with a total thickness of 1 nm or over, an effect of improving blue characteristics is obtained.

Moreover, in the above-described embodiments and examples, the low-molecular material is added to the red light-emitting layer 16CR and the green light-emitting layer 16CG to improve hole transport properties; however, the same effect may be obtained by using a high-molecular material including a structural unit or a substituent group working for hole transport as the high-molecular material forming the red light-emitting layer 16CR and the green light-emitting layer 16CG.

Moreover, in the above-described embodiments and the above-described examples, the configurations of the organic EL elements 10R, 10B and 10G are specifically described; however, all layers are not necessarily included, or any other layer may be further included. For example, the common hole transport layer 26D may be arranged directly on the hole injection layers 16AB and 26AB without the hole transport layers 16BB and 26BB of the blue organic EL elements 16B and 26B. Therefore, the number of manufacturing steps is allowed to be reduced, and cost is allowed to be reduced. Moreover, in the above-described embodiments and examples, the display including red and green organic EL elements in addition to the blue organic EL elements is described; however, the disclosure is applicable to a display including blue organic EL elements and yellow organic EL elements.

Further, in the above-described embodiments, the case of the active matrix display is described. However, the disclosure is applicable to a passive matrix display. Moreover, the configuration of a pixel drive circuit for active matrix drive is not limited to that described in the above-described embodiments, and if necessary, a capacitive element or a transistor may be added. In this case, a necessary drive circuit may be included in addition to the above-described signal line drive circuit 120 and the scanning line drive circuit 130 according to a change in the pixel drive circuit.

The present application contains subject matter related to that disclosed in Japanese Priority Patent Application JP 2010-143525 filed in the Japan Patent Office on Jun. 24, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing an organic electroluminescent (EL) display, the method comprising:
    forming lower electrodes on a substrate for respective EL elements, the EL elements including first organic EL elements and respective second organic EL elements, the first organic EL elements each emitting blue light when energized, the second organic EL elements each emitting light other than the blue light when energized;
    forming barriers isolating light emission regions of the lower electrodes from each other, the barriers defining recesses between them;
    forming within the recesses, by a first coating method, respective hole injection/transport layers on the lower electrodes for the EL elements, the hole injection/transport layers each having hole injection properties, hole transport properties, or both, each EL element having one or more individual hole injection/transport layer separated from all other hole injection/transport layers by the barriers isolating the light emission region of its lower electrode;
    forming within some of the recesses, by a second coating method, respective second organic light-emitting layers on the hole injection/transport layers that are formed for the second organic EL elements, the second organic light-emitting layers each emitting the light other than the blue light when energized, each second organic EL element having an individual second organic light-emitting layer separated from all other second organic light-emitting layers by the barriers isolating the light emission region of its lower electrode, the second organic light-emitting layers having a host material that includes a high-molecular weight material having a weight-average molecular weight greater than 50,000 and a low-molecular weight material having a weight-average molecular weight of at most 50,000, and a mixture ratio of the high-molecular weight material and the low-molecular weight material is within a range of 10:1 to 1:2 both inclusive in weight ratio, the low molecular weight material having a lowest unoccupied molecular orbital level less than that of the main material but greater than that of the first organic light emitting layer, the low molecular weight material having a highest unoccupied molecular orbital level greater than that of the main materials but less than that of the first organic light emitting layer; forming within all of the recess a common hole transport layer, followed by, forming within all of the recesses, by an evaporation method, a first organic light-emitting layer on (a) whole surfaces of the second organic light-emitting layers of the second organic EL elements, (b) the hole injection/transport layers of the first organic EL elements, and (c) on an entirety of remaining exposed surfaces of the barriers, the first organic light-emitting layer emitting the blue light when energized and made of a low-molecular weight material;

forming an electron injection/transport layer made of a nitrogen-containing heterocyclic compound with an electron mobility of $1.0 \times 10^{-6}$ cm$^2$/Vs to $1.0 \times 10^{-1}$ cm$^2$/Vs both inclusive across a whole surface of the first organic light-emitting layer, the electron injection/transport layer having electron injection properties, electron transport properties, or both; and forming an upper electrode across a whole surface of the electron injection/transport layer.

2. The according to claim 1, wherein:
the first coating method comprises an ink jet printing method, a nozzle coating method, a spin coating method, an offset printing method, a flexo printing method, or a relief printing method and
the second coating method comprises the ink jet printing method, the nozzle coating method, the spin coating method, the offset printing method, the flexo printing method, or the relief printing method.

3. The method according to claim 1, wherein the coating method in the forming of the second organic light-emitting layers uses a mixture material including the low-molecular weight material and a high-molecular weight material.

4. The method according to claim 1, wherein the nitrogen-containing heterocyclic compound used for the electron injecting/transport layer is a compound represented by a formula (1):

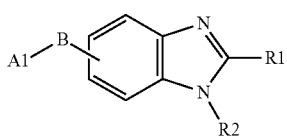

(6)

where A1 is a hydrogen atom or a halogen atom, an alkyl group with 1 to 20 carbon atoms, a hydrocarbon group with 6 to 60 carbon atoms including a polycyclic aromatic hydrocarbon group in which 3 to 40 aromatic rings are condensed, or a nitrogen-containing heterocyclic group or a derivative thereof, B is a single bond, a divalent aromatic ring group or a derivative thereof, R1 and R2 each are independently a hydrogen atom or a halogen atom, an alkyl group with 1 to 20 carbon atoms, an aromatic hydrocarbon group with 6 to 60 carbon atoms, a nitrogen-containing heterocyclic group or an alkoxy group with 1 to 20 carbon atoms, or a derivative thereof.

5. The method according to claim 1, wherein the nitrogen-containing heterocyclic compound used for the electron injection/transport layer is a compound represented by a formula (2):

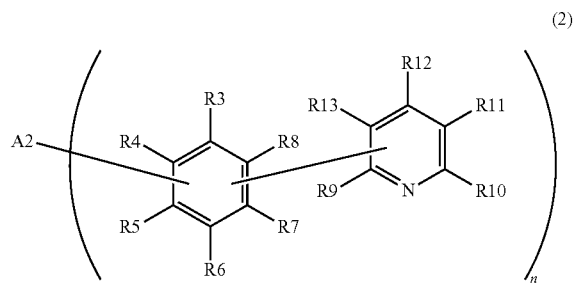

(2)

where A2 is an n-valent group in which 2 to 5 aromatic rings are condensed, more specifically, an n-valent acene-based aromatic ring group in which 3 aromatic rings are condensed or a derivative thereof, R3 to R8 each are independently a hydrogen atom or a halogen atom, or an isolated atomic valence bonded to any one of A2 and R9 to R13, R9 to R13 each are independently a hydrogen atom, a halogen atom or an isolated atomic valence bonded to any one of R3 to R8, n is an integer of 2 or more, and a number n of pyridylphenyl groups may be the same as or different from one another.

6. The method according to claim 1, wherein the nitrogen-containing heterocyclic compound used for the electron injection/transport layer is a compound represented by a formula (3):

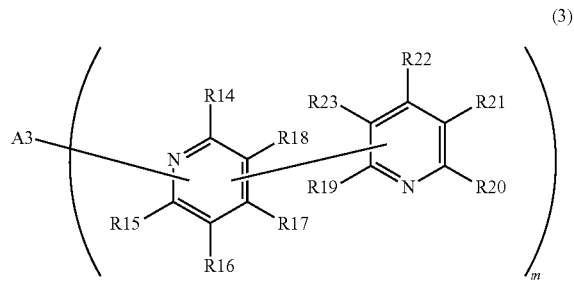

(3)

where A3 is an m-valent group in which 2 to 5 aromatic rings are condensed, more specifically, an m-valent acene-based aromatic ring group in which 3 aromatic rings are condensed, or a derivative thereof, R14 to R18 each are independently an hydrogen atom or a halogen atom, or an isolated atomic valence bonded to any one of A3 and R19 to R23, R19 to R23 each are independently a hydrogen atom, a halogen atom or an isolated atomic valence bonded to any one of R14 to R18, m is an integer of 2 or more and a number m of bipyridyl groups may be the same as or different from one another.

7. The method according to claim 1, wherein the step of forming the hole injection/transport layers includes first forming hole injection layers and then forming hole transport layers.

8. The method according to claim 7, wherein the hole transport layers formed for the first organic EL elements are formed after the second organic light-emitting layers are formed.

9. The method of claim 1, wherein the step of forming the barriers comprises forming lower barrier ribs made of an insulator material and upper barrier ribs made of a photosensitive resin.

10. The method of claim 9, wherein the insulator material is $SiO_2$ and the photosensitive resin is a positive type polybenzoxazole or a positive type photosensitive polyimide.

11. The method of claim 1, wherein the low-molecular weight material is at least one selected from the group consisting of benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, a derivative of stilbene, a heterocyclic conjugated monomer, a polysilane-based compound, a vinylcarbazole-based compound, a thiophene-based compound, and an aniline-based compound.

12. The method of claim 1, wherein the low-molecular weight host material is at least one selected from the group consisting of α-naphthyl phenyl phenylenediamine, porphyrin, metal tetraphenyl porphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenylphenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylene vinylene), poly(thiophene vinylene), and poly(2,2'-thienylpyrrole).

13. The method of claim 1, wherein the high-molecular weight host material is at least one selected from the group consisting of a polyfluorene-based high polymer derivative, a (poly)paraphenylene vinylene derivative, a polyphenylene derivative, a polyvinylcarbazole derivative, a polythiophene derivative, a perylene-based pigment, a coumarin-based pigment, and a rhodamine-based pigment.

* * * * *